(12) United States Patent
Ohno et al.

(10) Patent No.: US 7,105,217 B2
(45) Date of Patent: Sep. 12, 2006

(54) PHASE-CHANGE RECORDING MATERIAL AND INFORMATION RECORDING MEDIUM

(75) Inventors: Takashi Ohno, Minato-ku (JP); Michikazu Horie, Minato-ku (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 11/104,542

(22) Filed: Apr. 13, 2005

(65) Prior Publication Data

US 2005/0175822 A1 Aug. 11, 2005

Related U.S. Application Data

(63) Continuation of application No. PCT/JP04/06112, filed on Apr. 28, 2004.

(30) Foreign Application Priority Data

Apr. 30, 2003 (JP) .............................. 2003-125803

(51) Int. Cl.
*B32B 3/02* (2006.01)
(52) U.S. Cl. .................. 428/64.1; 428/64.4; 428/64.5; 428/64.6; 430/270.13
(58) Field of Classification Search ............... 428/64.5; 430/270.13
See application file for complete search history.

(56) References Cited

U.S. PATENT DOCUMENTS

| | | |
|---|---|---|
| 3,530,441 A | 9/1970 | Ovshinsky |
| 4,629,649 A | 12/1986 | Osaka et al. |
| 4,710,452 A | 12/1987 | Raychaudhuri |
| 4,774,170 A | 9/1988 | Pan et al. |
| 4,795,695 A | 1/1989 | Pan et al. |
| 4,798,785 A | 1/1989 | Pan et al. |
| 4,812,385 A | 3/1989 | Pan et al. |
| 4,812,386 A | 3/1989 | Pan et al. |
| 4,865,955 A | 9/1989 | Pan et al. |
| 4,904,577 A | 2/1990 | Tyan et al. |
| 4,960,680 A | 10/1990 | Pan et al. |
| 4,981,772 A | 1/1991 | Pan et al. |

(Continued)

FOREIGN PATENT DOCUMENTS

EP 0 184 452 A2 6/1986

(Continued)

OTHER PUBLICATIONS

J. Feinleib, et al., "Rapid Reversible Light-Induced Crystallization of Amorphous Semiconductors", Applied Physics Letters, vol. 18, No. 6, Mar. 15, 1971, pp. 254-257.

(Continued)

*Primary Examiner*—Elizabeth Mulvaney
(74) *Attorney, Agent, or Firm*—Oblon, Spivak, McClelland, Maier & Neustadt, P.C.

(57) ABSTRACT

A phase-change recording material on which high velocity recording/erasing is possible, which provides excellent recording signal characteristics, which provides a high storage stability of the recording signals, with which the change in the reflectivity of the recorded signals is small even after a long term storage, and which provides excellent recording signal characteristics even if overwriting is carried out again, and an information recording medium employing the above material, are provided.

It is characterized by containing as the main component a composition represented by $Ge_x(In_wSn_{1-w})_yTe_zSb_{1-x-y-z}$ (wherein the Sb content is higher than any one of the Ge content, the In content, the Sn content and the Te content, and x, y, z and w representing atomicity ratios satisfy (i) $0 \leq x \leq 0.3$, (ii) $0.07 \leq y-z$, (iii) $wxy-z \leq 0.1$, (iv) $0<z$, (v) $(1-w)xy \leq 0.35$ and (vi) $0.35 \leq 1-x-y-z$).

20 Claims, 10 Drawing Sheets

U.S. PATENT DOCUMENTS

| | | | |
|---|---|---|---|
| 5,055,331 A | 10/1991 | Raychaudhuri | |
| 5,077,181 A | 12/1991 | Pan et al. | |
| 5,234,803 A | 8/1993 | Raychaudhuri | |
| 5,271,978 A | 12/1993 | Vazan et al. | |
| 5,312,664 A | 5/1994 | Raychaudhuri | |
| 5,557,596 A | 9/1996 | Gibson et al. | |
| 5,849,458 A | 12/1998 | Pan et al. | |
| 5,879,773 A | 3/1999 | Hatwar et al. | |
| 6,004,646 A | 12/1999 | Ohno et al. | |
| 6,108,295 A | 8/2000 | Ohno et al. | |
| 6,115,352 A | 9/2000 | Ohno et al. | |
| 6,143,468 A | 11/2000 | Ohno et al. | |
| 6,294,310 B1 | 9/2001 | Ohno et al. | |
| 6,314,014 B1 | 11/2001 | Lowrey et al. | |
| 6,567,367 B1 | 5/2003 | Ohno et al. | |
| 6,587,425 B1 | 7/2003 | Ohno et al. | |
| 6,632,583 B1 | 10/2003 | Kunitomo et al. | |
| 6,707,783 B1 | 3/2004 | Ohno | |
| 6,751,184 B1 * | 6/2004 | Kojima et al. | 369/275.2 |
| 6,811,949 B1 | 11/2004 | Ohno et al. | |
| 6,884,488 B1 * | 4/2005 | Ito et al. | 428/64.1 |
| 6,943,395 B1 * | 9/2005 | Oh et al. | 257/295 |
| 2002/0001284 A1 | 1/2002 | Inoue et al. | |
| 2002/0012305 A1 | 1/2002 | Shingai et al. | |
| 2002/0015816 A1 | 2/2002 | Shingai et al. | |
| 2002/0146643 A1 * | 10/2002 | Shingai et al. | 430/270.13 |
| 2002/0160305 A1 | 10/2002 | Horie et al. | |
| 2003/0214857 A1 * | 11/2003 | Horie et al. | 365/200 |
| 2004/0166440 A1 * | 8/2004 | Tabata et al. | 430/270.13 |

FOREIGN PATENT DOCUMENTS

| | | |
|---|---|---|
| JP | 60-177446 | 9/1985 |
| JP | 61-156545 | 7/1986 |
| JP | 62-246788 | 10/1987 |
| JP | 63-76121 | 4/1988 |
| JP | 63-201927 | 8/1988 |
| JP | 63-244422 | 10/1988 |
| JP | 63-298726 | 12/1988 |
| JP | 64-59651 | 3/1989 |
| JP | 64-60832 | 3/1989 |
| JP | 2-88288 | 3/1990 |
| JP | 4-501742 A | 3/1992 |
| JP | 4-232780 | 8/1992 |
| JP | 9-286174 | 11/1997 |
| JP | 9-286175 | 11/1997 |
| JP | 9-293269 A | 11/1997 |
| JP | 11-232696 | 8/1999 |
| JP | 11-240250 | 9/1999 |
| JP | 2000-79761 | 3/2000 |
| JP | 2000-233576 | 8/2000 |
| JP | 2000-313170 | 11/2000 |
| JP | 2001-39031 | 2/2001 |
| JP | 2001-67719 | 3/2001 |
| JP | 2001-331973 A | 11/2001 |
| JP | 2002-8236 | 1/2002 |
| JP | 2002-11958 | 1/2002 |
| JP | 2002-74741 A | 3/2002 |
| JP | 2002-79757 | 3/2002 |
| JP | 2002-157737 | 5/2002 |
| JP | 2002-172860 | 6/2002 |
| JP | 2002-347341 | 12/2002 |
| JP | 2003-91872 A | 3/2003 |
| JP | 2003-191638 | 7/2003 |
| JP | 2003-231354 | 8/2003 |
| JP | 2003-291534 | 10/2003 |
| JP | 2003-335065 | 11/2003 |

OTHER PUBLICATIONS

Michikazu Horie, et al., "High speed rewritable DVD up to 20m/s with nucleation-free eutectic phase-change material of Ge($Sb_{70}Te_{30}$)+Sb", Proceedings of SPIE, Optical Data Storage 2000, vol. 4090, May 14-17, 2000, pp. 135-143.

Michikazu Horie, et al., "Material Characterization of Growth-Dominant Ge(Sb70Te30)+Sb for Phase-Change Optical Recording Media", Proceedings of the 13$^{th}$ Symposium on Phase Change Optical Information Storage, PCOS2001, 2001, pp. 20-25.

I. Friedrich, et al., "Structural transformations of $Ge_2Sb_2Te_5$ films studied by electrical resistance measurements", Journal of Applied Physics, vol. 87, No. 9, May 1, 2000, pp. 4130-4134.

C. N. Afonso, et al., "Ultrafast reversible phase change in GeSb films for erasable optical storage", Appl. Phys. Lett., vol. 60, No. 25, Jun. 22, 1992, pp. 3123-3125.

Kazuya Nakayama, et al., "Phase-change switching memory", Proceedings of the 13$^{th}$ Symposium on Phase Change Optical Information Storage, PCOS2001, 2001, pp. 61-66 and 111.

U.S. Appl. No. 11/104,542, filed Apr. 13, 2005, Ohno et al.
U.S. Appl. No. 11/113,119, filed Apr. 25, 2005, Ohno et al.
U.S. Appl. No. 09/530,599, filed May 9, 2000, Mizuno et al.
U.S. Appl. No. 10/059,193, filed Jan. 31, 2002, Horie et al.
U.S. Appl. No. 10/378,990, filed Mar. 5, 2003, Horie et al.
U.S. Appl. No. 09/573,319, filed May 18, 2000, Nobukuni et al.

* cited by examiner

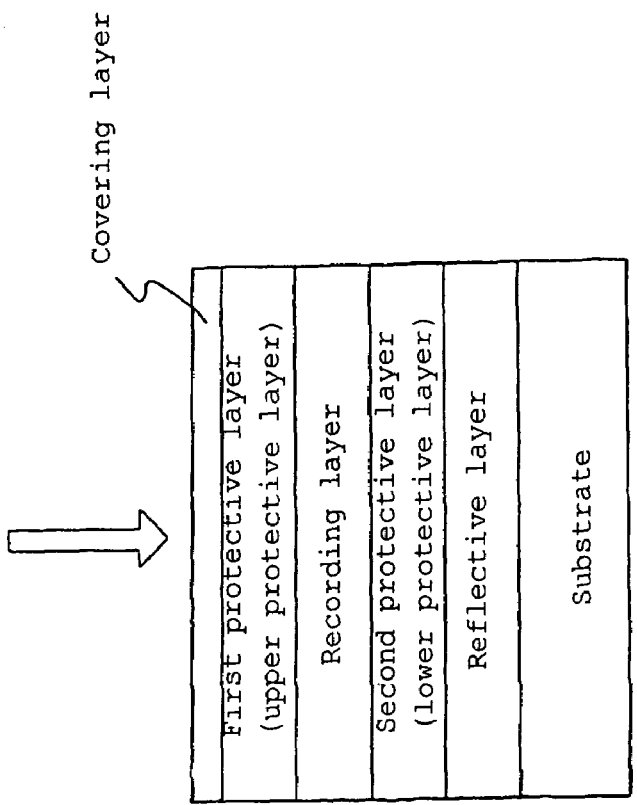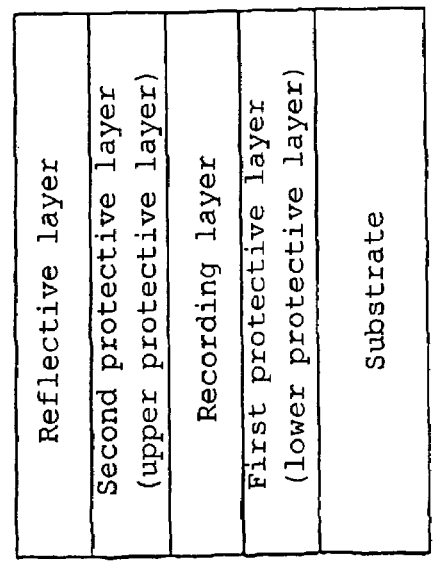

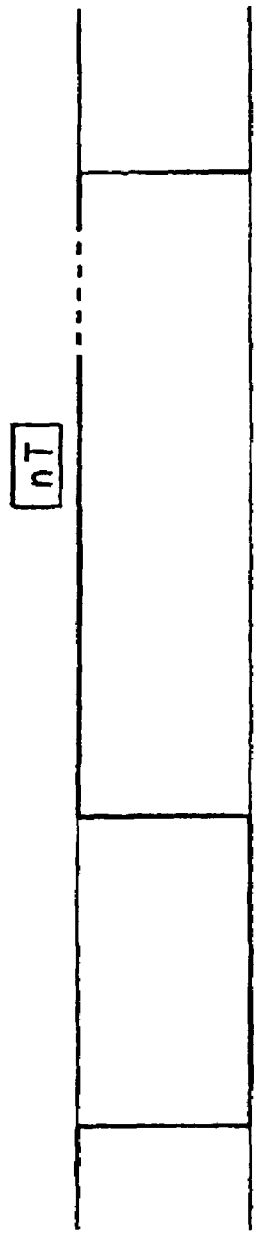
Fig. 2 (a) Mark length modulation signal
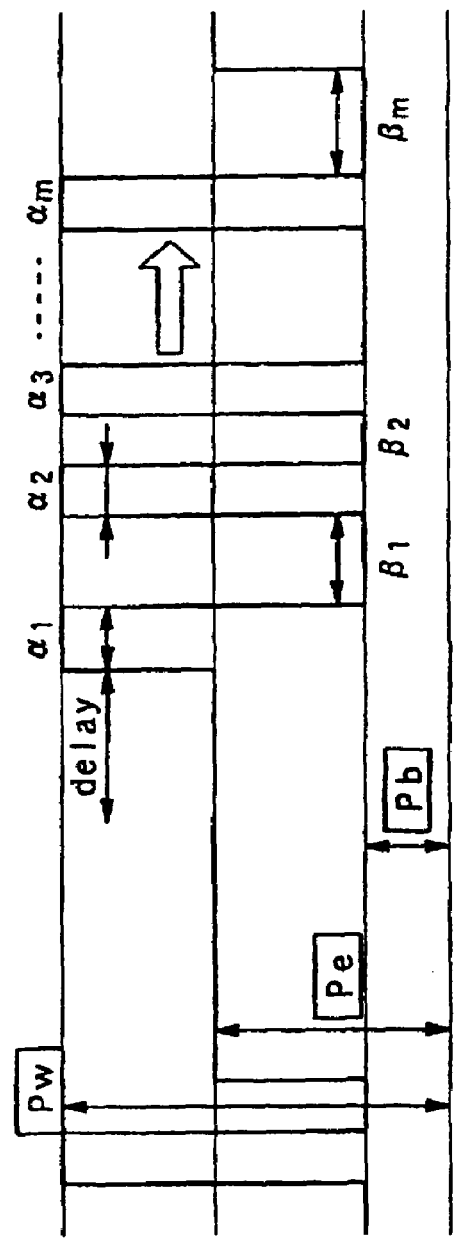
Fig. 2 (b) Divided recording pulse

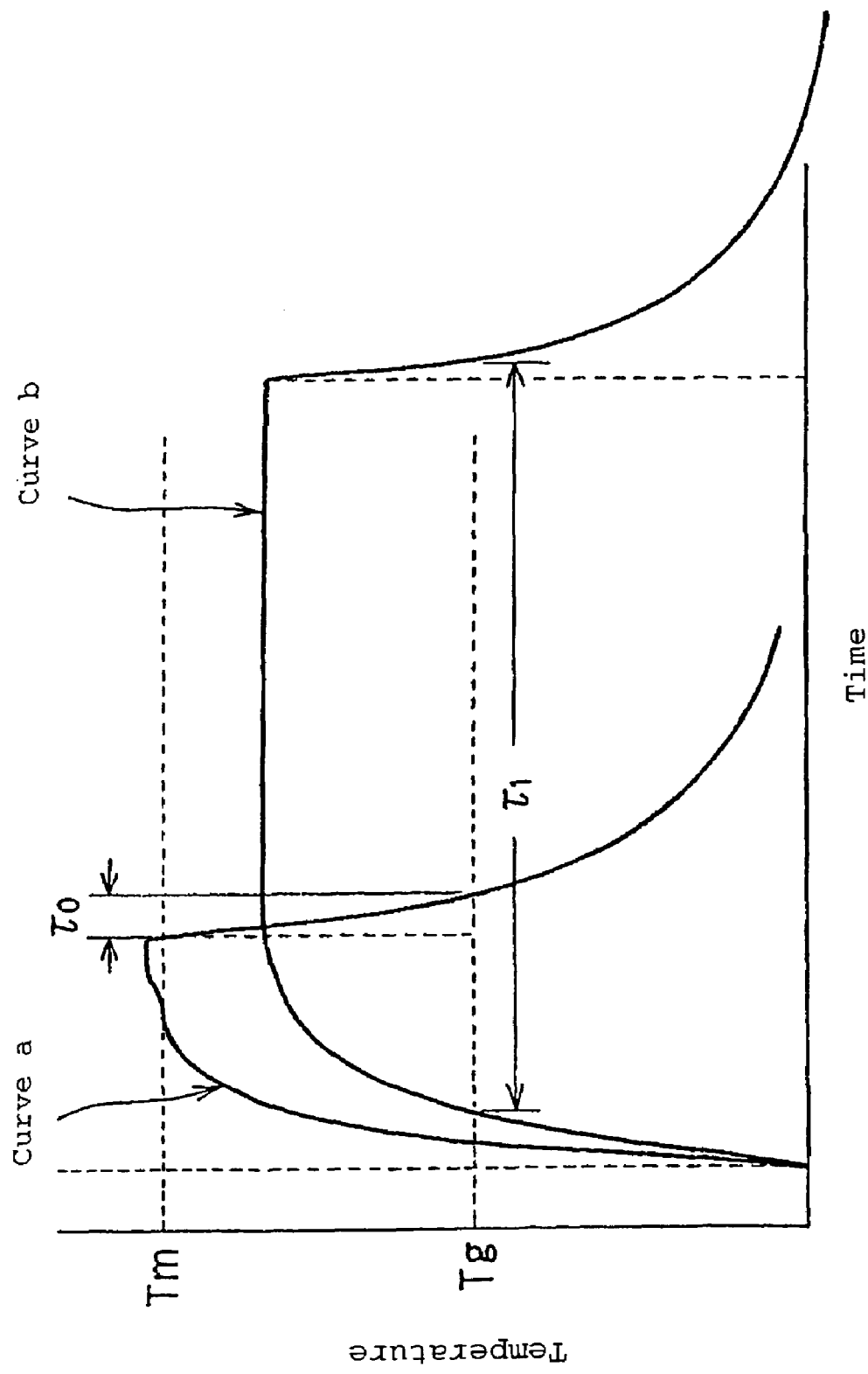

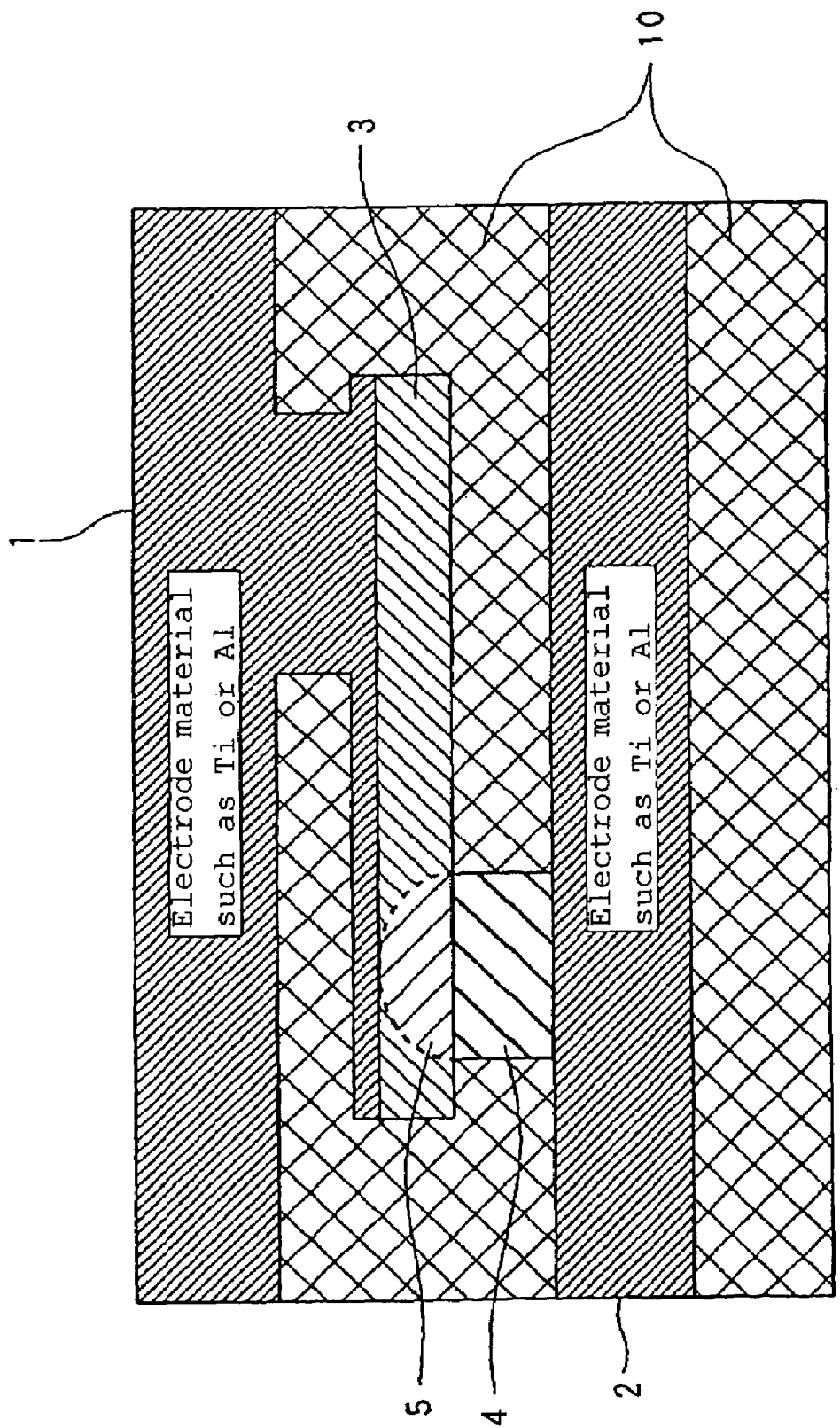

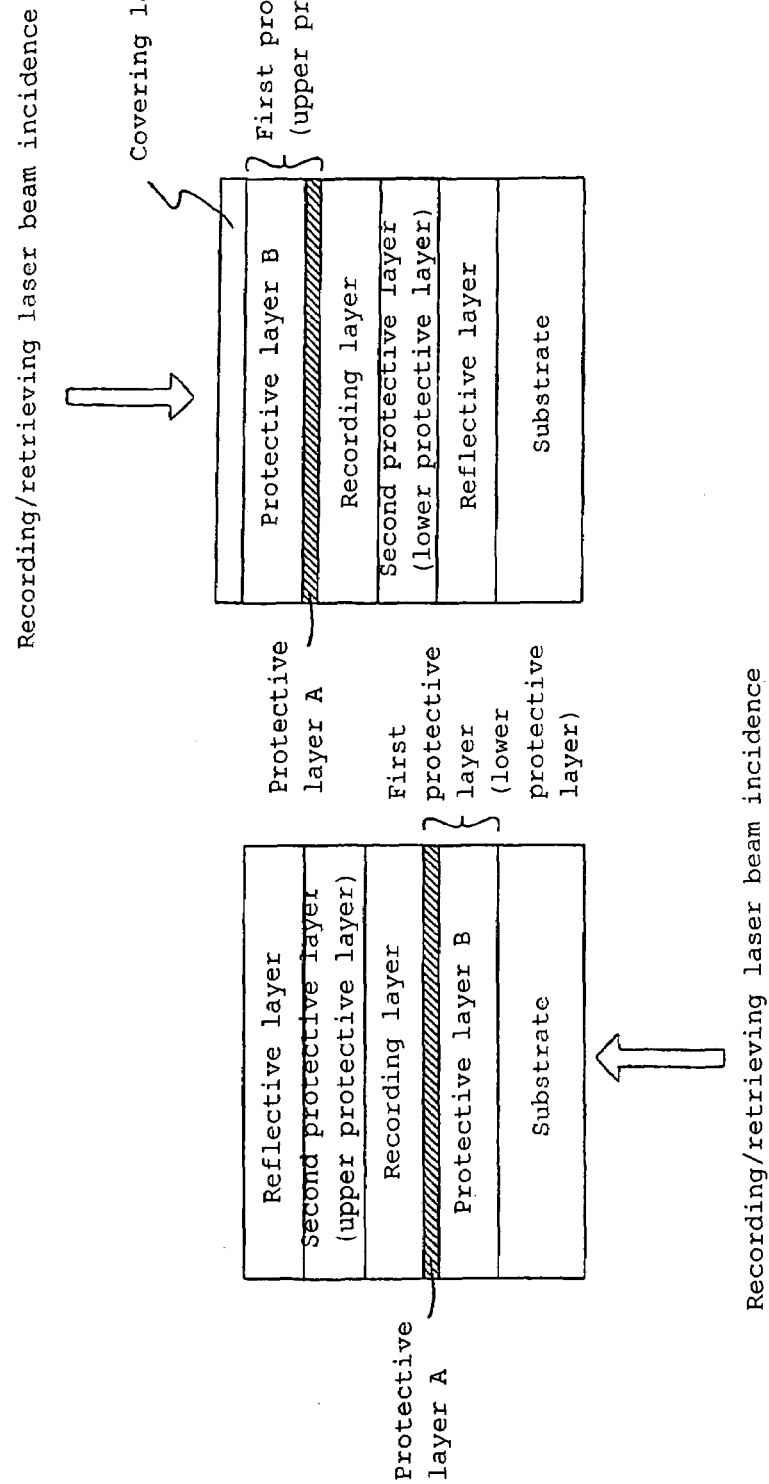

PHASE-CHANGE RECORDING MATERIAL AND INFORMATION RECORDING MEDIUM

TECHNICAL FIELD

The present invention relates to a phase-change recording material and an information recording medium employing it.

BACKGROUND ART

As a recording method utilizing the phase change, a method has been known wherein the crystal structure of a metal or a semiconductor is reversibly changed by affecting energy beams or an energy flow such as light or electric current (Joule heat) (Appl. Phys. Lett., Vol. 18 (1971), pp. 254–257, U.S. Pat. No. 3,530,441).

Used practically at present as a means for recording on an information recording medium employing a phase-change recording material, is a means to utilize a reversible change between the crystalline phase and the amorphous phase. Specifically, it is a means to let the crystalline state in a non-recorded/erased state and to form amorphous marks at the time of recording. Usually, a recording layer is locally heated to a temperature higher than the melting point and then rapidly cooled to form amorphous marks. On the other hand, the recording layer is heated at a temperature of approximately at most the melting point and at least the crystallization temperature, and slowly cooled so that the recording layer is kept at a temperature of at least the crystallization temperature for a certain retention time to carry out recrystallization. Namely, in general, a reversible change between the stable crystalline phase and the amorphous phase is utilized, and the information is recorded or retrieved by detecting the difference in physical parameters such as refractive index, electric resistance, volume and change in density, between the crystalline state and the amorphous state.

On the optical information recording medium among information recording mediums, recording/retrieving is carried out by utilizing a change in the reflectivity accompanying the reversible change between the crystalline state and the amorphous state caused locally by irradiation with a focused light beam. Such an optical information recording medium having a phase-change recording layer is being developed and used practically as a low cost large capacity recording medium excellent in portability, weather resistance, impact resistance, etc. For example, a rewritable phase-change type optical information recording medium (hereinafter "a rewritable phase-change type optical information recording medium" may sometimes be referred to as phase-change type optical disk, optical disk or disk) such as CD-RW, DVD-RW, DVD+RW and DVD-RAM is widely used. Further, it has been developed to achieve a high density by the use of blue laser or by an increase in NA of an objective lens, or to make high speed recording possible by improvement of the recording pulse waveform.

As a material for such a phase-change recording layer, a chalcogenide alloy is used in many cases. As such a chalcogenide alloy, a Ge—Sb—Te type, In—Sb—Te type, Ge—Sn—Te type or Ag—In—Sb—Te type alloy may, for example, be mentioned. Such an alloy is usually an overwritable material also.

Overwriting is a means wherein when recording is carried out again on a once-recorded optical information recording medium, writing is carried out without erasing before the recording, that is, a means of recording while erasing. On an optical information recording medium having a phase-change recording layer, recording is carried out usually by overwriting, and accordingly recording while erasing (i.e. overwriting) may sometimes be referred to simply as recording.

It is possible to obtain an optical information recording medium on which high velocity recording at 10-times velocity is possible by increasing the crystallization speed, by employing for the recording layer a composition which comprises as a matrix a $Sb_{70}Te_{30}$ alloy comprising a $Sb_{70}Te_{30}$ eutectic composition as the base and containing Sb in large excess, among the above chalcogenide alloys. Particularly, preferred for the recording layer is a composition which comprises a $Sb_{70}Te_{30}$ eutectic composition containing Sb in large excess and contains Ge (JP-A-2001-229537 (paragraph 0031)).

DISCLOSURE OF THE INVENTION

In recent years, along with increase in the amount of information, it has been desired to develop an optical information recording medium on which recording, erasing and retrieving at a higher velocity are possible. Namely, it is necessary to employ for the recording layer a phase-change recording material capable of being crystallized at a higher speed. However, if the above phase-change recording material has a composition with which an adequately high crystallization speed is obtained, it tends to be difficult to satisfy both characteristics of excellent jitter characteristics (recording signal quality) and the storage stability of amorphous marks, from such a reason that noises of the signal of the optical information recording medium become significant. This problem is particularly remarkable with an optical information recording medium on which high velocity recording/erasing of information signals is carried out at a reference clock period of at most 15 ns.

For example, when the above composition which comprises a $Sb_{70}Te_{30}$ eutectic composition containing Sb in large excess and contains Ge is represented by $(Sb_cTe_{1-c})_{1-d}Ge_d$, it is possible to increase the crystallization speed by decreasing the ratio of the Te content relative to Sb by increasing the value c and bringing it to be close to 0.9. However, the noises of the optical information recording medium tend to be significant, and no favorable jitter characteristics will be obtained. Further, when the Ge content is reduced, although the noise increase tends to be suppressed the storage stability of the amorphous marks will decrease.

The present invention has been made to overcome the above problems, and its object is to provide a phase-change recording material on which high velocity recording/erasing is possible, which provides excellent recording signal characteristics such as the reflectivity and the signal amplitude or the jitter characteristics, and which provides a high storage stability of the recording signals, and an information recording medium employing the above material. Further, it is to provide a phase-change recording material with which the change of e.g. the reflectivity of the recorded signals is small even when the information recording medium is stored for a long time, and which provides excellent recording signal characteristics when the information recording medium on which signals are recorded is stored for a long time and then overwriting is carried out again, and an information recording medium employing the above material. Particularly, it is to provide an optical information recording medium which is one mode of the applications of the information recording medium.

Under the above circumstances, the present inventors have conducted extensive studies and as a result, have found that when the Sb, In, Sn, Te and Ge compositions satisfy predetermined relational formulae, both recording signal quality such as the jitter characteristics and the stability of amorphous marks can be satisfied even if recording/erasing is carried out at a high velocity, and excellent recording signal characteristics can be maintained even when overwriting is carried out again after long term storage, and they have achieved the present invention.

Namely, the present invention provides, as disclosed in claim 1, a phase-change recording material characterized by containing a composition represented by the following formula (1) as the main component:

$$Ge_x(In_wSn_{1-w})_yTe_zSb_{1-x-y-z} \quad (1)$$

(wherein the Sb content is higher than any one of the Ge content, the In content, the Sn content and the Te content, and x, y, z and w representing atomic ratios, satisfy the following (i) to (vi):

(i) $0 \leqq x \leqq 0.3$
(ii) $0.07 \leqq y\text{-}z$
(iii) $wxy\text{-}z \leqq 0.1$
(iv) $0 < z$
(v) $(1\text{-}w)xy \leqq 0.35$
(vi) $0.35 \leqq 1\text{-}x\text{-}y\text{-}z$)

The phase-change recording material of the present invention, by containing the composition represented by the formula (1) as the main component, is excellent in the recording signal characteristics even when recording/erasing is carried out at a high velocity, provides a high storage stability of the recording signals, provides a small decrease in the reflectivity of the recorded signals even after long term storage, and provides excellent recording signal characteristics even when overwriting is carried out again.

The present invention further provides, as disclosed in claim 2, the phase-change recording material according to claim 1, wherein in the formula (1), x further satisfies $0 < x$.

The present invention further provides, as disclosed in Claim 3, the phase-change recording material according to Claim 1 or 2, wherein in the formula (1), x further satisfies $x \leqq 0.1$.

The present invention further provides, as disclosed in Claim 4, the phase-change recording material according to any one of Claims 1 to 3, wherein in the formula (1), w further satisfies $0 < w < 1$.

The present invention further provides, as disclosed in Claim 5, the phase-change recording material according to any one of Claims 1 to 4, wherein in the formula (1), z further satisfies $0.1 < z$.

The present invention further provides, as disclosed in Claim 6, the phase-change recording material according to any one of Claims 1 to 5, wherein of the above information recording material, the crystalline state corresponds to a non-recorded state, and the amorphous state corresponds to a recorded state.

The present invention further provides, as disclosed in Claim 7, an information recording medium having a recording layer, characterized in that the above recording layer contains a composition represented by the following formula (1) as the main component:

$$Ge_x(In_wSn_{1-w})_yTe_zSb_{1-x-y-z} \quad (1)$$

(wherein the Sb content is higher than any one of the Ge content, the In content, the Sn content and the Te content, and x, y, z and w representing atomic ratios, satisfy the following (i) to (vi):

(i) $0 \leqq x \leqq 0.3$
(ii) $0.07 \leqq y\text{-}z$
(iii) $wxy\text{-}z \leqq 0.1$
(iv) $0 < z$
(v) $(1\text{-}w)xy \leqq 0.35$
(vi) $0.35 \leqq 1\text{-}x\text{-}y\text{-}z$)

The present invention further provides, as disclosed in claim 8, the information recording medium according to claim 7, wherein in the formula (1), x further satisfies $0 < x$.

The present invention further provides, as disclosed in claim 9, the information recording medium according to claim 7 or 8, wherein in the formula (1), x further satisfies $x \leqq 0.1$.

The present invention further provides, as disclosed in claim 10, the information recording medium according to any one of claims 7 to 9, wherein in the formula (1), w further satisfies $0 < w < 1$.

The present invention further provides, as disclosed in claim 11, the information recording medium according to any one of claims 7 to 10, wherein in the formula (1), z further satisfies $0.1 < z$.

The present invention further provides, as disclosed in claim 12, the information recording medium according to any one of claims 7 to 11, wherein of the above information recording medium, the crystalline state corresponds to a non-recorded state, and the amorphous state corresponds to a recorded state.

The present invention further provides, as disclosed in claim 13, the information recording medium according to any one of claims 7 to 12, wherein the information recording medium is an optical information recording medium, on which recording is carried out by a laser beam.

The present invention further provides, as disclosed in claim 14, the information recording medium according to claim 13, wherein the optical information recording medium has a protective layer A in contact with the recording layer, and the protective layer A contains a metal oxysulfide and/or a metal nitride.

The present invention further provides, as disclosed in claim 15, the information recording medium according to claim 14, wherein the metal oxysulfide is an oxysulfide of yttrium, and the metal nitride is a nitride of an alloy containing germanium as the main component.

The present invention further provides, as disclosed in claim 16, the information recording medium according to claim 14 or 15, wherein the protective layer A is formed in contact with each side of the recording layer.

The present invention further provides, as disclosed in claim 17, the information recording medium according to any one of claims 14 to 16, wherein the above protective layer A is formed in contact with the side of the recording layer from which a laser beam enters, and the above protective layer A has a thickness of at most 50 nm.

The present invention further provides, as disclosed in claim 18, the information recording medium according to any one of claims 14 to 16, wherein the protective layer A is formed in contact with the side of the recording layer from which a laser beam enters, and further, a protective layer B is formed on the side opposite to the above recording layer in contact with the protective layer A, and the total thickness of the thickness of the protective layer A and the thickness of the protective layer B is at most 50 nm.

The present invention further provides, as disclosed in claim 19, the information recording medium according to any one of claims 14 to 18, wherein the recording layer has a thickness of at least 5 nm and at most 15 nm.

The present invention further provides, as disclosed in claim 20, the information recording medium according to any one of claims 13 to 19, wherein the optical information recording medium further has a reflective layer, and the reflective layer contains Ag as the main component.

EFFECTS OF THE INVENTION

According to the present invention, a phase-change recording material on which high velocity recording/erasing is possible, which has excellent recording signal characteristics and which provides a high storage stability of the recording signals, and an information recording medium employing the above material can be provided.

BRIEF DESCRIPTION OF THE DRAWINGS

FIG. 1 is schematic views illustrating the layer structure of an optical information recording medium.

FIG. 2 is schematic views illustrating the power pattern of a recording laser beam in the recording method of an optical information recording medium.

FIG. 3 is a schematic view illustrating the temperature history at the time of recording or at the time of erasing the rewritable information recording.

FIG. 4 is a schematic view illustrating the structure of one cell of a non-volatile memory.

FIG. 5 is schematic views illustrating the layer structure of an optical information recording medium.

EXPLANATION OF NUMERICAL REFERENCES

Figure 6A:
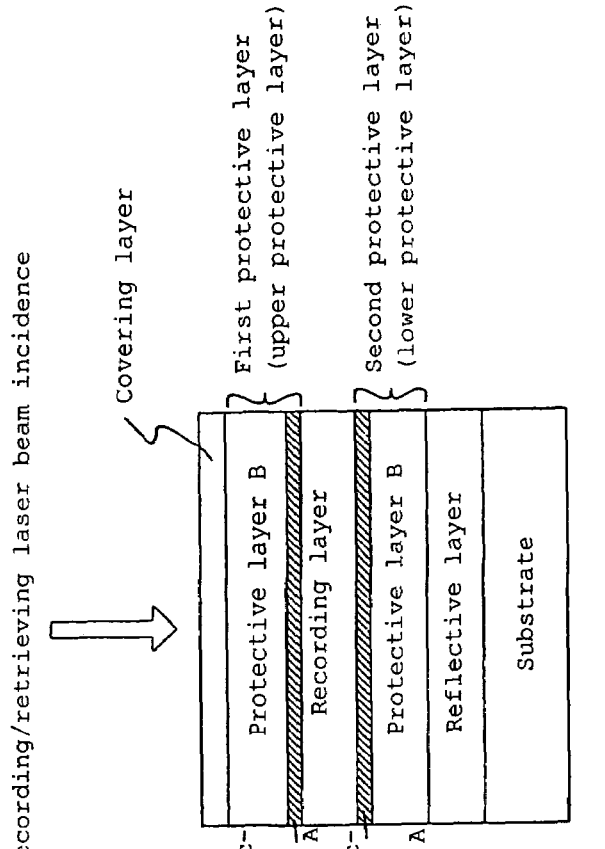
FIG. 6 is schematic views illustrating the layer structure of an optical information recording medium.

1. Upper electrode
2. Lower electrode
3. Phase-change recording layer
4. Heater portion
5. Reversibly changeable portion
10. Insulant

BEST MODE FOR CARRYING OUT THE INVENTION

Now, the embodiments of the present invention will be explained in detail below. However, the present invention is by no means restricted to the following embodiments, and various modifications are possible within the a range of the gists.

[1] Phase-Change Recording Material
[1-1] General Explanation

The phase-change recording material of the present invention is characterized by containing a composition represented by the following formula (1) as the main component:

$$Ge_x(In_wSn_{1-w})_yTe_zSb_{1-x-y-z} \qquad (1)$$

(wherein the Sb content is higher than any one of the Ge content, the In content, the Sn content and the Te content, and x, y, z and w representing atomic ratios, satisfy the following (i) to (vi):
(i) $0 \leq x \leq 0.3$
(ii) $0.07 \leq y-z$
(iii) $wxy-z \leq 0.1$
(iv) $0 < z$
(v) $(1-w)xy \leq 0.35$
(vi) $0.35 \leq 1-x-y-z$)

In the present invention, "containing a predetermined composition as the main component" means that the content of the predetermined composition is at least 50 atomic % based on the entire materials or the entire layer in which the predetermined composition is contained. In order to effectively obtain the effect of the present invention, the composition represented by the above formula (1) is contained in an amount of preferably at least 80 atomic %, more preferably at least 90 atomic %, particularly preferably at least 95 atomic %, based on the entire phase-change recording material.

In the present invention, in order to increase the crystallization speed so that high velocity recording/erasing is possible, a composition containing mainly Sb is employed for the above phase-change recording material. Accordingly, the Sb content is higher than any of the contents of the other atoms. The reason why Sb is mainly contained is that the amorphous phase of Sb can be crystallized at a very high speed, whereby it becomes possible to crystallize the amorphous marks in a short time. Namely, the amorphous state recording marks will be easily erased when Sb is mainly contained.

Further, in the present invention, an additional element to facilitate formation of an amorphous phase and to increase the archival stability of the amorphous state is used together with Sb, rather than using Sb alone. Accordingly, Ge is employed together with Sb. Namely, when the Ge content is high, the amorphous phase formation tends to be easy, and the archival stability of the amorphous state tends to increase. Further, according to the studies by the present inventors, it was found that the recording signal characteristics when overwriting is carried out after the recorded medium is stored for a long time is also related to the Ge content.

Further, in the present invention, of the phase-change recording material containing mainly Sb, the total amount of In and/or Sn and the total amount of Te are in a predetermined relation.

Here, as the phase-change recording material containing Sb as the main body, the above-described composition comprising a $Sb_{70}Te_{30}$ eutectic composition and containing Sb in large excess, and further containing Ge in an amount of about 10 atomic %, has been known. It can be considered that the material of the present invention is a material having a large amount of In and/or Sn added to the above conventional composition (hereinafter sometimes referred to as a conventional SbTe eutectic type composition) so as to satisfy the predetermined relation. With the conventional SbTe eutectic type composition having In or Sn added thereto, deterioration of e.g. the jitter due to the crystal grain boundary noise tends to be somewhat suppressed, however, the reflectivity at the crystalline state tends to be low, whereby the difference in the reflectivity (signal amplitude) between the crystalline and amorphous states tends to be small. Particularly when the In content is high, such a phenomenon that the reflectivity at the crystalline state decreases with time is observed. This is considered to indicate a possibility that when the In content is high, the crystalline state which is originally supposed to be stable is formed into an unstable quasi-stable phase.

Further, with respect to the conventional SbTe eutectic type composition containing In and Sn, along with increase in the number of repeated overwriting, the performance of formation of an amorphous state (easiness of formation of an amorphous state, storage stability of the formed amorphous state, etc.) and the crystallization speed tend to change (hereinafter sometimes referred to as the change in the phase-change performance). The reason is supposed that In or Sn and Te are in a repeated melted/cooled state in the process of the repeated overwriting, whereby an intermetallic compound (telluride) is formed to cause segregation, and the properties as an alloy change. This change in the phase-change performance is a more serious problem when recording by overwriting at a higher density and at a higher recording linear velocity is to be realized. Accordingly, it has been considered that In or Sb can be added in only a slight amount (at most about 10 atomic %) to the conventional SbTe eutectic type composition. Particularly, it has been considered that In or Sn can be added in an amount of at most about half the amount of Te. Practically, as disclosed in Examples of JP-A-10-326436 and JP-A-2002-79757, the addition amount of In or Sn in the conventional SbTe eutectic type composition is smaller than 10 atomic %. Further, the content of In or Sn is considerably lower than Te.

As mentioned above, the purpose of addition of In, Sn or the like to the conventional SbTe eutectic type composition is to provide an additional improving effect to the SbTe eutectic type composition as the main component, and according to these circumstances, their addition has been studied with a small addition amount. Accordingly, the contents of In and Sn have been studied below a level where various adverse effects have been confirmed when their contents are close to the same as the Te content, and it has been considered that it is not necessary to positively incorporate In or Sn exceeding the Te content.

However, according to the studies by the present inventors, it has been found that when the content of In and/or Sn is considerably increased relative to Te, the reflectivity at the crystalline state increases on the contrary, and the difference in the reflectivity between the crystalline and amorphous states (signal amplitude) increases again. Further, it has been found that when the content of In and/or Sn is considerably increased relative to Te, the archival change of the reflectivity is small. Still further, it has been found that in such a case, it is possible to satisfy both recording signal characteristics at a high velocity and stability of the amorphous state.

Namely, when the Sb/Te ratio is increased (particularly the Sb/Te ratio exceeds 4) for the purpose of increasing the crystallization speed so as to realize high velocity overwriting, such a tendency that the crystal grain boundary noise becomes significant and the signal quality such as the jitter deteriorates, and a decrease in the archival stability of the amorphous state (the amorphous state is crystallized during a long term storage at room temperature), are observed. However, there is a prospect of resolution of all the above problems when the content of In and/or Sn is considerably increased relative to Te. For example, with respect to the stability of the amorphous state, it was found that the stability of the amorphous state is extremely high under usual storage conditions in the vicinity of room temperature.

Further, the change in the phase-change performance occurred when the repeated overwriting is carried out is supposed to be due to the segregation of the Te compound occurred when the repeated overwriting is carried out. Accordingly, it is usually considered that addition of In or Sn in a large amount further deteriorates the above problem of the segregation of the Te compound. However, according to the studies by the present inventors, contrary to such a concept, it was found that when the content of In and/or Sn is considerably increased relative to Te, the change in the phase-change performance due to the repeated overwriting is suppressed.

The phase-change recording material of the present invention wherein In, Sn, Sb, Te and further Ge satisfy the respective predetermined relations cannot be considered as one having a SbTe eutectic composition and having additional elements merely added thereto. This is because the phase state of the above phase-change recording material is expected to be very complicated, and the presence or absence of the above segregation due to the repeated overwriting is not clear also. However, stabilization of the crystallization speed (suppression of the change in the crystallization speed) when the repeated overwriting is carried out on the phase-change recording material of the present invention is thought to be achieved by either of the following two mechanisms. That is, the first mechanism is that in the phase-change recording material of the present invention, a relatively stable solid-solution state, even if it is quasi-stable, is formed within a specific composition range, and thus the segregation itself of the phase-change recording material is less likely to occur, and accordingly the change in the phase-change performance is suppressed. Further, the second mechanism is that even if the segregation occurs, the phase which undergoes the segregation is limited to a phase having a specific compositional ratio, and this phase having a specific compositional ratio does not have bad influences over the crystallization speed etc., and accordingly the change in the phase-change performance is suppressed.

Accordingly, in the present invention, it is important to control the Te content and the In and/or Sn content in predetermined ranges.

In the present invention, there is one more reason why it is important to control the Te content and the In and/or Sn content. That is, the elemental composition of the present invention may be considered as a material which comprises a GeSbSn type material or GeInSb type material containing mainly Sb and has Te added. In and Te are elements which facilitate the amorphous mark formation and reduce the fluctuation at the edge of the formed amorphous mark shape. Accordingly, by employing such elements, the jitter in the mark length recording when the present invention is applied to an optical information recording medium can be decreased. Further, Te increases the repeated recording durability. However, by addition of Te also, the reflectivity of the crystalline state tends to be low and the difference in the reflectivity between the crystalline and amorphous states (signal amplitude) tends to be small, and accordingly it is important to control the Te addition amount. According to the studies by the present inventors, it was found that by setting the relation between the Te content and the total amount of the In content and the Sn content to be within a predetermined range, decrease in the reflectivity of the crystalline state and the signal amplitude due to Te addition can be suppressed. Further, by setting the relation between the Te content and the total amount of the In content and the Sn content to be within a predetermined range, it becomes possible to satisfy both erasure of the amorphous marks (recording signals) by recrystallization in a short time in a case of high velocity recording and stability of the amorphous marks (recording signals) during storage. Further, by setting the relation between the Te content and the total amount of the In content and the Sn content to be within a predetermined range, it becomes possible to form amorphous marks with small noises (the jitter in the mark length recording when the present invention is applied to an optical information recording medium) due to the fluctuation in the mark shape.

Further, when the In content is high, the reflectivity of the crystalline state of a phase-change type disk tends to decrease by a long term storage. This is considered to be because the quasi-stable crystalline state is formed, and the crystal structure subtlely changes. The amount of decrease in the reflectivity may exceed 10% of the reflectivity of the initial crystalline state in some cases. Such an archival change of the crystalline state is considered to cause changes in not only optical characteristics but also other physical characteristics such as electrical characteristics. Accordingly, the above archival change of the crystalline state is a cause of a decrease in the storage stability of the recorded information.

However, according to the studies by the present inventors, it was found that even when the In content is high to a certain extent, by defining the relation of the In and Te contents, the decrease in the reflectivity due to a long term storage can be reduced.

Namely, by adjusting the recording layer composition, an information recording medium excellent in recording signal characteristics at a high velocity and excellent in stability of the crystalline state and the amorphous state can be obtained. Accordingly, an information recording medium excellent in stability of the optical characteristics, the electrical characteristics etc. derived from the difference in the physical characteristics between both states and also excellent in recording signal characteristics when the recorded medium is stored for a long time and then overwriting is carried out, can be obtained.

Further, in the present invention, it is preferred that of the phase-change recording material, the crystalline state corresponds to a non-recorded state, and the amorphous state corresponds to a recorded state. This is because it is supposed that not many crystal nuclei are present in the amorphous state of the phase-change recording material of the present invention. That is, in a case where the amorphous state corresponds to a non-recorded state and crystalline state marks are formed in this amorphous state, it is preferred to use a phase-change recording material in which many crystal nuclei are present. This is because when many crystal nuclei are present in the phase-change recording material, the shape of the crystalline state marks is less likely to be influenced by the position of the crystal nuclei. On the other hand, as described above, not many crystal nuclei are present in the phase-change recording material of the present invention, and accordingly favorable recording is likely to be carried out when the crystal state corresponds to a non-recorded state and amorphous state recording marks are formed in the crystalline state, rather than when the amorphous state corresponds to a non-recorded state and crystalline state recording marks are formed in the amorphous state.

Now, the relation between the contents of the respective elements and the characteristics are explained in detail below.

In the following explanation, the effect of addition of the respective elements (particularly In and Sn) is described mainly in view of the optical characteristics. However, the difference in the reflectivity between the crystalline state and the amorphous state observed as the optical characteristics, and the archival stability of the difference in the reflectivity, are considered to have influences over the difference in the characteristics between the crystalline state and the amorphous state and the stability (accordingly, the amplitude of the recording signals, the degree of the SN ratio and its stability) observed in view of e.g. the electrical characteristics also. Further, the noises due to the scattering at crystal grain boundaries which are understood as the optical characteristics, are considered to be observed electrically also as noises due to the scattering of electron at crystal grain boundaries. Accordingly, the following explanation in view of the optical characteristics can be considered to be similarly applicable to the electrical characteristics also.

(Sb, Formula (vi))

The Sb content is higher than any of the Ge content, the In content, the Sn content and the Te content. Namely, the recording material of the present invention contains mainly Sb. Sb itself is effective to crystallize the amorphous state in a short time, but its amorphous state formation ability is low, and the resulting amorphous state tends to be unstable, and accordingly it is necessary to use it together with an additional element as described hereinafter. The crystallization speed is high when the Sb content is high. Particularly in the high velocity recording for which crystallization in a short time is required, the Sb content is relatively increased. Specifically, the Sb content is at least 35 atomic % and is higher than the content of any other element contained. In order to adequately obtain the effect of the present invention, the Sb content is preferably at least 40 atomic %, more preferably at least 45 atomic %.

Further, in the present invention, it is also important to control the Sb/Te ratio. With a view to carrying out the high velocity recording, the Sb/Te ratio is usually at least 2.3, preferably at least 3, more preferably at least 4. On the other hand, in view of the balance between the high velocity recording characteristics and the characteristics other than the high velocity recording characteristics, the Sb/Te ratio is usually at most 9.5, preferably at most 9.

(Sn, Formulae (ii) and (v))

The influence of the Sn content over the reflectivity of the crystalline state and the difference in the reflectivity between the crystalline and amorphous states (signal amplitude) and the influence of the In content over the reflectivity of the crystalline state and the difference in the reflectivity between the crystalline and amorphous states (signal amplitude) are substantially the same. Accordingly, to the phase-change recording material, one of Sn and In is contained. Further, the reflectivity of the crystalline state and the signal amplitude can be increased by making the total amount of the Sn content and the In content be larger than the Te amount within a certain range. On the other hand, when the Te content is high, the reflectivity of the crystalline state and the signal amplitude decrease. Accordingly, in order to obtain the desired reflectivity of the crystalline state and signal amplitude, it is important to control the relation between the Sn and/or In content and the Te content.

Accordingly, the value (y-z) in the above formula (1) is at least 0.07, and preferably at least 0.1, more preferably at least 0.13, particularly preferably at least 0.15. When the value y is high, the optimum power will be low, such being favorable.

Further, if the Sn amount is too large, the boundary shape of the amorphous mark tends to fluctuate particularly when the present invention is applied to an optical information recording medium, or the jitter characteristics which are considered to be due to the crystal grain boundaries tend to deteriorate. Accordingly, the value (1-w)xy in the above formula (1) is at most 0.35, and preferably at most 0.3. Accordingly, when Te is contained in a large amount, it is necessary to make the total amount of the In content and the Sn content large with a view to controlling the signal amplitude. However, the Sn amount cannot be so large taking the jitter characteristics into consideration. Accordingly, when the Te content is high, it is preferred to incorporate In in addition to Sn. Specifically, in a case where the Te content is so high that the decrease in the reflectivity of the crystalline state and the signal amplitude due to Te cannot be suppressed unless Sn is contained in an amount exceeding 35 atomic %, In may be contained.

(In, Formula (iii))

By using In, the reflectivity of the crystalline state and the difference in the reflectivity between the crystalline and amorphous states (signal amplitude) can be increased, and accordingly in the present invention, it is preferred to use In as an element to be contained in the recording layer.

By using In, the reflectivity of the crystalline state and the difference in the reflectivity between the crystalline and amorphous states (signal amplitude) can be increased, and in addition, there is such an advantage that the influence over the jitter characteristics can be reduced as compared with Sn. In is supposed to have a function to decrease the crystal grain boundary noise as compared with Sn and Te. On the other hand, In causes decrease in the reflectivity due to the long term storage which is supposed to be attributable to the quasi-stable crystalline state. On the contrary, Te tends to suppress the decrease in the reflectivity due to the long term storage. Accordingly, with a view to suppressing the decrease in the reflectivity of the optical information recording medium due to the long term storage, it is important that the In content and the Te content are in a predetermined relation. The present inventors have prepared and studied optical information recording mediums having various recording layer compositions and as a result, found that a decrease in the reflectivity due to the long term storage occurs when the In content is too high relative to the Te content. Namely, the decrease in the reflectivity due to the long term storage can be suppressed by making the value {(In content)−(Te content)} within a predetermined range in the above formula (1). Specifically, when the value wxy-z in the above formula (1) is low, the rate of decrease in the reflectivity due to the long term storage tends to be low. Accordingly, the value wxy-z is preferably at most 0.1, more preferably at most 0.05, furthermore preferably at most 0. Here, wxy-z=0 means that the In content and the Te content are the same. Accordingly, it is further preferred in the present invention that the In content is the same as the Te content or the In content is lower than the Te content.

Accordingly, when the decrease in the reflectivity due to the long term storage is to be made as small as possible, In cannot be contained in an excessively large amount relative to Te, and accordingly in order to satisfy the above-described relational formula $0.07 \leq y-z$, it is preferred that the phase-change recording material of the present invention contains Sn in addition to In. Specifically, in a case where wxy-z$\leq$0.07, $0.07 \leq y-z$ cannot be satisfied unless Sn is contained in addition to In. Further, it is preferred that both In and Sn are contained from such a viewpoint also that the crystallization speed suitable for the high velocity recording is less likely to be obtained when the In and Te contents are high while Sn is not contained. Namely, it is preferred that 0<w<1.

If the In amount is excessively large, the signal quality during the long term storage of the information recording medium tends to deteriorate (for example, the reflectivity tends to decrease during the long term storage when the information recording medium is used as an optical information recording medium). Further, if the In amount is large while Sn is not contained, a stable crystal layer with a low reflectivity as observed in the In—Sb system may appear in some cases. Accordingly, the In content i.e. the value wxy is preferably at most 0.35.

(Te, Formula (iv))

The phase-change recording material of the present invention contains Te.

The phase-change material of the present invention comprises a SbTe eutectic type containing Sb in large excess over $Sb_{70}Te_{30}$ as the base and provides its phase change performance, and thus Te is an essential element.

Te bonded to Sb stabilizes the phase-change performance in the repeated recording and improves the repeated recording durability. Further, Te has an effect to maintain the erasing performance (to maintain the crystallization speed) and resultingly to improve the repeated recording durability, after an information recording medium employing the phase-change recording material of the present invention is stored for a long time.

In a case where Te is contained, if In, Sn or the like is added for the purpose of improving other characteristics, there is a possibility that In or Sn forms a compound with Te to cause segregation. However, in order to maintain basic phase-change performance, Te together with Sb is an essential element. Namely, even in a case where In or Sn is employed for the phase-change recording material of the present invention, Te cannot be excluded, and in order to further improve the characteristics with the SbTe binary composition, In or Sn has to be contained. Accordingly, one of the important significances of the present invention is that the In or Sn is contained in a predetermined range relative to Te so as to suppress the bad influence of the segregation to a negligible level.

Accordingly, although the Te amount is preferably high to a certain extent, it is necessary to control the relation between In and/or Sn and Te and the relation between In and Te in predetermined ranges. Specifically, z indicating the Te content in the above formula (1) is 0<z, and it is preferably $0.01 \leq z$, more preferably $0.05 \leq z$, furthermore preferably $0.08 \leq z$, particularly preferably $0.1 \leq z$, most preferably $0.1 \leq z$.

z indicating the Te content is usually less than 0.29, which is a value necessarily determined by other relational formulae defined for the above formula (1). As described above, it is preferred that the In and Te contents are high to a certain extent, however, particularly Te has a function to lower the crystallization speed, and accordingly in order to obtain the crystallization speed suitable for the high velocity recording, z indicating the Te content is preferably at most 0.25, more preferably at most 0.20.

(Ge, Formula (i))

In the present invention, Ge may be used so as to adjust the crystallization speed. Namely, Ge is not so largely related to the characteristics such as the reflectivity, the signal amplitude (the difference in the reflectivity between the crystalline and amorphous states) and the decrease in the reflectivity due to the long term storage of the medium. Accordingly, Ge may be used so as to obtain the crystallization speed suitable for the recording conditions which are to be employed. When the Ge amount is large, the crystallization speed tends to be low, and accordingly for an information recording medium for higher velocity recording for example, the Ge content may be reduced to adjust the crystallization speed. However, the crystallization speed relates to the other element contents also, and when the Sb or Sn amount is large, the crystallization speed tends to be high, and the In or Te amount is large, the crystallization speed tends to be low. Accordingly, it is preferred to adjust the Ge content after the ratio of the contents of the elements other than Ge is determined taking the above described various characteristics into consideration, thereby to adjust the crystallization speed in accordance with the recording conditions. If the Ge content is too high, the crystallization speed tends to be too low, and accordingly x in the above formula (1) is at most 0.3, and preferably at most 0.25, more preferably at most 0.2. Here, the Ge and Te contents have particularly significant influence over the crystallization speed.

Further, if the Ge content is high, when the recorded amorphous marks are stored for a long term, they tend to be hardly crystallized as compared with immediately after the recording before the storage. If this phenomenon is remarkable, the signal quality of the overwritten recording signals tends to be insufficient when the overwriting is carried out after the recorded information recording medium is stored for a long term. Namely, the signal quality of the new recording marks is deteriorated since the old marks after the long term storage are not adequately erased. This phenomenon that the crystallization is less likely to take place is problematic only at the first recording after the long term storage, and the amorphous marks which are newly recorded after the long term storage have normal crystallization speed. At any rate, this phenomenon is reduced by decreasing the Ge content. In this view, the Ge content is preferably small, and the value x in the above formula (1) is particularly preferably at most 0.1, most preferably at most 0.07. In the present invention, the above various characteristics are satisfied, and in addition, reduction of the phenomenon was successful.

As described above, Te and In have an effect to lower the crystallization speed, and the Ge content can be reduced when the Te or In content is high, in order to obtain the same crystallization speed when the crystallization speed is made low. In this view, the Te content i.e. the value z is preferably at least 0.05, more preferably at least 0.08, most preferably at least 0.1. Still further, the In content i.e. the value wxy is preferably at least 0.05, more preferably at least 0.08. Further, if the Te content is high, it is preferred that both In and Sn are contained as mentioned above. Namely, in the most preferred composition, all of Ge, In, Sb, Sn and Te are contained.

On the other hand, if the Ge content is too low, the storage stability of the amorphous marks tends to deteriorate, and the amorphous marks tend to be crystallized by the long term storage. The storage stability of the amorphous marks tends to be improved also by increasing the In amount, but the influence of Ge tends to be more significant. On the other hand, the storage stability of the amorphous marks may be relatively favorable in some cases even if the Ge content is zero, by influences of other elements. Accordingly, the value x in the above formula (1) is at least 0, preferably higher than 0, more preferably at least 0.01, furthermore preferably at least 0.02.

[1-2] The Contents of Ge, In, Sn, Te and Sb in the Phase-Change Recording Material of the Present Invention In the present invention, the possible maximum and minimum contents of the respective elements Ge, In, Sn, Te and Sb constituting the phase change recoding material of the present invention are necessarily determined from the conditions in the above formula (1) i.e. seven conditions (a) the Sb content is higher than any one of the Ge content, the In content, the Sn content and the Te content, (b) $0 \leq x \leq 0.3$, (c) $0.07 \leq y-z$, (d) $wxy-z \leq 0.1$, (e) $0<z$, (f) $(1-w)xy \leq 0.35$ and (g) $0.35 \leq 1-x-y-z$.

Specifically, a computer program to judge whether or not the above seven conditions are satisfied when the values x, y, z and w are independently changed from 0 to 1 by 0.001 each time is prepared and executed to obtain the possible maximum and minimum contents of Ge, In, Sn, Te and Sb. Needless to say, the total of the atomicity ratios of Ge, In, Sn, Te and Sb is 1. Further, by reducing the degree of the changes of the value to e.g. by 0.0001 or by 0.00001, more detailed ranges of the respective atoms Ge, In, Sn, Te and Sb can be obtained. In Table 1, an example of the above computer program prepared by means of Visual Basic is shown.

TABLE 1

Example of a program to obtain the minimum value and the maximum value regarding each element content by numerical calculation (prepared by Visual Basic)

```
minGe=1  'minimum value of x
maxGe=0  'maximum value of x
minIn=1  'minimum value of w*y
maxIn=0  'maximum value of w*y
minSn=1  'minimum value of (1-w) *y
maxSn=0  'maximum value of (1-w) *y
minTe=1  'minimum value of z
maxTe=0  'maximum value of z
minSb=1  'minimum value of 1-x-y-z
maxSb=0  'maximum value of 1-x-y-z
miny=1   'minimum value of y
maxy=0   'maximum value of y
minyz=1  'minimum value of y-z
maxyz=0  'maximum value of y-z
minwyz=1 'minimum value of w*y-z
maxwyz=-1 'maximum value of w*y-z
For x = 0 To 1 Step 0.001     'The degree of the
                               changes is reduced to
                               increase the calculation
                               accuracy.
For y = 0 To 1 Step 0.001     'The degree of the
                               changes is reduced to
                               increase the calculation
                               accuracy.
For z = 0 To 1 Step 0.001     'The degree of the
                               changes is reduced to
                               increase the calculation
                               accuracy.
For w = 0 To 1 Step 0.001     'The degree of the
                               changes is reduced to
                               increase the calculation
                               accuracy.
If w*y<1-x-y-z Then
If (1-w) *y<1-x-y-z Then
If z<1-x-y-z Then
If x<1-x-y-z Then
```

TABLE 1-continued

Example of a program to obtain the minimum value and the maximum value regarding each element content by numerical calculation (prepared by Visual Basic)

```
If x<=0.3 Then                'The value is changed
                               depending on the preferred
                               range.
If y-z>=0.07 Then             'The value is changed
                               depending on the preferred
                               range.
If w*y-z<=0.1 Then            'The value is changed
                               depending on the preferred
                               range.
If (1-w) *y<=0.35 Then        'The value is changed
                               depending on the preferred
                               range.
If 1-x-y-z>=0.35 Then         'The value is changed
                               depending on the preferred
                               range.
If z>0 Then                   'The value is changed
                               depending on the preferred
                               range.
    If x < minGe Then
    minGe = x
    End If
    If x > maxGe Then
    maxGe = x
    End If
    If w * y < minIn Then
    minIn = w * y
    End If
    If w * y > maxIn Then
    maxIn = w * y
    End If
    If (1 - w) * y < minSn Then
    minSn = (1 - w) * y
    End If
    If (1 - w) * y > maxSn Then
    maxSn = (1 - w) * y
    End If
    If z < minTe Then
    minTe = z
    End If
    If z > maxTe Then
    maxTe = z
    End If
    If 1 - x - y - z < minSb Then
    minSb = 1 - x - y - z
    End If
    If 1 - x - y - z > maxSb Then
    maxSb = 1 - x - y - z
    End If
    If y < miny Then
    miny = y
    End If
    If y > maxy Then
    maxy = y
    End If
    If y - z < minyz Then
    minyz = y - z
    End If
    If y - z > maxyz Then
    maxyz = y - z
    End If
    If w * y - z < minwyz Then
    minwyz = w * y - z
    End If
    If w * y - z > maxwyz Then
    maxwyz = w * y - z
    End If
End If
End If
End If
End If
End If
End If
End If
```

TABLE 1-continued

Example of a program to obtain the minimum value and the maximum value regarding each element content by numerical calculation (prepared by Visual Basic)

```
End If
Next w
Next z
Next y
Next x
MsgBox (minGe)
MsgBox (maxGe)
MsgBox (minIn)
MsgBox (maxIn)
MsgBox (minSn)
MsgBox (maxSn)
MsgBox (minTe)
MsgBox (maxTe)
MsgBox (minSb)
MsgBox (maxSb)
MsgBox (miny)
MsgBox (maxy)
MsgBox (minyz)
MsgBox (maxyz)
MsgBox (minwyz)
MsgBox (maxwyz)
End
```

The computer program as shown in Table 1 is executed, whereupon the ranges which the Ge, In, Sn, Te and Sb contents may have are:

Ge: 0.000 to 0.300
In: 0.000 to 0.366
Sn: 0.000 to 0.350
Te: 0.001 to 0.290
Sb: 0.350 to 0.929

Further, according to the above program, the possible range of y-z which is the difference between the total of the In content and/or the Sn content and the Te content is from 0.070 to 0.449, and the possible range of wxy-z which is the difference between the In content and the Te content is from −0.279 to 0.100.

The numbers indicating the ranges of the contents of the respective elements according to the above program somewhat change depending upon the significant digit at the time of the program execution.

Further, the above conditions (a) to (g) may change in accordance with the changes of the conditions of the preferred range, the more preferred range etc., as explained in the above [1-1], and when the conditions are changed, the above computer program is executed again employing the new conditions to obtain the upper limit and the lower limit of the respective elements Ge, In, Sn, Te and Sb.

Here, the composition cannot freely be changed independently within the range of the composition of each element alone, and needless to say, priority is given to the conditions of the formulae (a) to (g).

[1-3] Other Elements

To the phase-change recording material of the present invention, Au, Ag, Al, Ga, Zn, Si, Cu, Pd, Pt, Rh, Pb, Cr, Mo, W, Mn, Co, O, N, Se, V, Nb, Ta, Ti, Bi or B, or a rare earth element such as Tb, Dy or Gd may, for example, be added as the case requires to improve various characteristics. In order to obtain the effect of improving the characteristics, the addition amount is preferably at least 0.1 at. % (atomic %) of the entire composition of the alloy. However, it is preferably at most 10 at. % in order not to impair the preferred characteristics of the phase-change recording material of the present invention. Particularly preferred is addition of N (nitrogen), and an addition of at least 0.1 atomic % and at most 5 atomic % of the entire composition is effective to improve the repeated overwriting durability.

Ag, Cu, Si, Pb, Cr, Mo, W, Mn, Nb, Ta, V, B and a rare earth element may be used to further finely adjust the crystallization temperature or the crystallization speed.

Al, Ga, Zn, Bi, Pd, Pt and Rh may function as crystal nuclei for the phase-change recording material of the present invention which undergoes the crystal growth-based crystallization process, and can finely adjust the crystallization process. The above other additional elements may function as crystal nuclei in some cases.

O and Se may be used to finely adjust the optical characteristics.

Here, a rare earth element (rare earth metal element) is a Group 3B element of the Periodic Table, and specifically it includes Sc, Y, lanthanoids and actinoids.

[2] Information Recording Medium

Now, the information recording medium of the present invention will be explained below.

The information recording medium of the present invention is an information recording medium having a recording layer, characterized in that the above recording layer contains a composition represented by the following formula (1) as the main component:

$$Ge_x(In_wSn_{1-w})_y Te_z Sb_{1-x-y-z} \quad (1)$$

(wherein the Sb content is higher than any one of the Ge content, the In content, the Sn content and the Te content, and x, y, z and w representing atomic ratios, satisfy the following (i) to (vi):

(i) $0 \leq x \leq 0.3$ (ii) $0.07 \leq y-z$ (iii) $wxy-z \leq 0.1$ (iv) $0<z$ (v) $(1-w)xy \leq 0.35$ (vi) $0.35 \leq 1-x-y-z$)

In the present invention, it is preferred that of the information recording medium, the crystalline state corresponds to a non-recorded state, and the amorphous state corresponds to a recorded state. This is because it is estimated that not many crystal nuclei are present in the recording layer composition of the present invention. That is, in a case where the amorphous state corresponds to a non-recorded state and crystalline state marks are formed in the amorphous state, it is preferred to use a recording layer composition in which many crystal nuclei are present. This is because when a large number of crystal nuclei are present in the recording layer, the shape of the crystalline state marks is less likely to be influenced by the position of the crystal nuclei. On the other hand, as described above, not many crystal nuclei are present in the recording layer composition of the present invention, and accordingly favorable recording is likely to be carried out when the crystalline state corresponds to a non-recorded state and amorphous state recording marks are formed in the crystalline state, rather than when the amorphous state corresponds to a non-recorded state and crystalline state recording marks are formed in the amorphous state.

By using the composition represented by the above formula (1) for the recording layer, excellent recording signal characteristics such as the reflectivity, the signal amplitude and the jitter characteristics can be obtained even when recording/erasing is carried out at a high velocity, and it is possible to obtain favorable storage stability of the amorphous marks (recording signals). Further, when the information recording medium of the present invention is stored for a long term also, the change in the reflectivity of the recorded signals is small, and excellent recording signal characteristics can be maintained even when overwriting is carried out again. Further, the information recording medium of the present invention, by employing the above composition, can provide excellent repeated recording durability. The explanation regarding the formula (1) is the same as in the above [1], and explanation is omitted here.

Such an information recording medium is not particularly limited so long as recording and retrieving of the information are carried out by detecting the difference in physical parameters between the crystalline state and the amorphous state, and an information recording medium detecting the difference in the refractivity, the electrical resistance, the volume, the change in density, etc. may, for example, be mentioned. Particularly, the information recording medium employing the phase-change recording material of the present invention is suitable for an application to an optical information recording medium on which recording is carried out by means of a laser beam. Particularly, it is suitable for an application to a phase-change type optical information recording medium utilizing the change in the reflectivity accompanying a reversible change of the crystalline state caused by irradiation with a laser beam.

Now, the specific structure of the optical information recording medium of the present invention, the recording and retrieving method, etc. will be explained below.

[2-1] Optical Information Recording Medium (Layer Structure)

As the optical information recording medium, usually one having a multilayer structure as shown in FIG. 1(a) or FIG. 1(b) is employed. Namely, it is preferred that on a substrate, a recording layer containing a composition represented by the above formula (1) as the main component is formed, and a protective layer is further formed, as evident from FIG. 1(a) and FIG. 1(b).

The more preferred layer structure of the optical information recording medium is such a structure that a first protective layer, a recording layer, a second protective layer and a reflective layer are formed in this order along the incident direction of the retrieving laser beam. Namely, in a case where the retrieving laser beam enters from the substrate side, preferred is a layer structure of a substrate, a first protective layer (lower protective layer), a recording layer, a second protective layer (upper protective layer) and a reflective layer (FIG. 1(a)), and in a case where the retrieving laser beam enters from the recording layer side, preferred is a layer structure of a substrate, a reflective layer, a second protective layer (lower protective layer), a recording layer, a first protective layer (upper protective layer) and a covering layer (FIG. 1(b)).

Needless to say, each layer may consist of more than two layers, and an interlayer may be formed between the respective layers. For example, between the substrate and the protective layer when the retrieving laser beam enters from the substrate side, or on the protective layer when the retrieving laser beam enters from the side opposite to the substrate, a transparent and extremely thin metal, semiconductor or dielectric layer having absorption, etc. may be formed so as to control the amount of the laser energy which enters the recording layer.

Further, a reflective layer is formed on the side opposite to the incident side of the recording/retrieving laser beam in many cases as mentioned above, but this reflective layer is not essential. Further, the protective layer which is preferably formed on at least one side of the recording layer may be made to have a multilayer structure with materials having different characteristics.

Now, the respective layers will be explained in detail.

(A) Recording Layer (A-1) Materials Contained in Recording Layer and their Amount The materials contained in the recording layer comprise a composition represented by the above formula (1) as the main component. This composition was already explained in detail, and the explanation is omitted here. In order to effectively obtain the effect of the present invention, the composition represented by the above formula (1) is contained usually in an amount of at least 50 atomic %, preferably at least 80 atomic %, more preferably at least 90 atomic %, particularly preferably at least 95 atomic %, based on the entire recording layer. The higher the content is, the more remarkably the effect of the present invention can be obtained. However, even if another component such as O or N is contained at the time of film formation of the recording layer, the effects of the present invention such as high speed recording/erasing can be securely obtained when the content is within a range of from several atomic % to 20 atomic %.

(A-2) Film Thickness of Recording Layer

The thickness of the recording layer is usually at least 1 nm, preferably at least 5 nm. With such a thickness, the difference in the reflectivity (contrast) between the crystalline state and the amorphous state will be adequate, and the crystallization speed will be adequate, whereby it will be possible to erase the record in a short time. Further, the reflectivity itself will be adequate. On the other hand, the thickness of the recording layer is usually at most 30 nm, preferably at most 25 nm, more preferably at most 20 nm, particularly preferably at most 15 nm. With such a thickness, an adequate optical contrast will be obtained, and cracks are less likely to form on the recording layer. Further, deterioration of the recording sensitivity due to increase in the thermal capacity is less likely to occur. Further, within the above film thickness range, the volume change due to the phase change can be moderately suppressed, and microscopic and irreversible deformation of the recording layer itself or the protective layer to be formed on or below the recording layer, which may cause noises when recording is repeatedly carried out, is less likely to be accumulated. Such accumulation of the deformation tends to decrease the repeated recording durability, and by bringing the film thickness of the recording layer to be within the above range, this tendency can be suppressed.

In a case of an optical information recording medium for high density recording on which recording/retrieving is carried out by means of a focused laser beam of an object lens having a numerical aperture of from about 0.6 to about 0.65 from a LD (laser diode) having a wavelength of about 650 nm, such as rewritable DVD, or an optical information recording medium for high density recording on which recording/retrieving is carried out by means of a focused laser beam of an object lens having a numerical aperture of from about 0.7 to about 0.85 from a blue LD having a wavelength of about 400 nm, the requirement against noises is more strict. Accordingly, in such a case, the more preferred thickness of the recording layer is at most 25 nm.

(A-3) More Preferred Embodiment Regarding Recording Layer Film Thickness

In the present invention, it is considered that with respect to an optical information recording medium having a recording layer containing the predetermined Ge—In—Sb—Sn—Te type composition as the main component, on which high velocity recording/erasing is possible, by making the film thickness of the recording layer extremely thin, the recording characteristics at the second recording after the optical information recording medium is stored for a long time can be made good, and decrease in the reflectivity after the long term storage can be reduced. Specifically, it seems that by making the film thickness of the recording layer preferably at most 11 nm, of the optical information recording medium employing the recording layer of the above predetermined Ge—In—Sb—Sn—Te type composition, the recording characteristics at the second recording after the long term storage tend to be improved, and the decrease in the reflectivity after the long term storage tend to be reduced.

Regarding the optical information recording medium employing the recording layer of the above predetermined Ge—In—Sb—Sn—Te type composition, the jitter at the second recording after the long term storage (preservation) is somewhat poor in some cases.

The recording characteristics at the second recording after the long term storage (preservation) mean the characteristics in the following two cases (shelf second recording, archival second recording).

First, to carry out recording on a medium which is stored for a long time after the initial crystallization in a non-recorded state, for the first time after the preservation, is referred to as shelf first recording, and to successively carry out overwriting thereon is referred to as shelf second recording. In a case where the preservation period is relatively short, substantially no increase in the jitters is observed when the shelf second recording is carried out. However, in a case where the preservation period is long, the increase in the jitters may be remarkable at the shelf second recording in some cases. The increased jitters decrease when the overwriting is carried out repeatedly several times, and the overwriting recording characteristics before the preservation recovers. The reason is not necessarily clear, but is supposed to be related to such a tendency that the signal intensity at the shelf first recording after the long term storage is low. Namely, when recording is carried out after an optical information recording medium is stored for a long term, the signal amplitude at the shelf first recording tends to be low. The signal amplitude recovers by further recording several times, and accordingly, the decrease in the signal amplitude at the shelf first recording is supposed to be caused by that the recording mark is less likely to be large when the crystalline portion after the long term storage is formed into an amorphous phase for the first time. Further, the reason why the jitter is likely to deteriorate at the shelf second recording after the long term storage is supposed to be because a portion which is formed into an amorphous phase for the first time (a portion which is not irradiated with the recording laser beam at the shelf first recording) and a portion which is formed into an amorphous phase again (for a second time) are both present. Namely, it is considered that there is a dispersion of the size of the amorphous marks due to the above presence of two portions in the shelf second recording.

Further, the cause of such a tendency that the amorphous marks are less likely to be large at the shelf first recording after the long term storage is not clear, but it is supposed that a certain change occurs at the crystalline portion of the recording layer by the long term storage, since the characteristics recover after recording several times. By making the recording layer extremely thin (preferably at most 11 nm), the characteristics at the shelf second recording after the long term storage are improved, and this is considered to be because the above change at the recording layer crystalline portion tends to be suppressed.

On the other hand, the other second recording after the long term storage (preservation) on an overwritable information recording medium on which amorphous marks are formed, is a recording in a case where a once recorded information (a state where amorphous marks are formed) is preserved for a long term, and overwriting is carried out again to rewrite the information.

Recording which is carried out on an information recording medium on which recording is carried out before the preservation, for the first time after the long term preservation, will be referred to as the archival second recording. In this case, in a case where the preservation period is relatively short, substantially no increase in the jitters is observed when the archival second recording is carried out. However, at the archival second recording in a case where the preservation period is long, such a phenomenon that the increase in the jitters is remarkable may be observed in some cases. The increased jitters decrease when the overwriting is repeatedly carried out several times. Further, the overwriting recording characteristics before the preservation recovers.

It is supposed that the above phenomenon occurs because the amorphous marks recorded before the storage are changed into a more stable amorphous state by the long term storage, and erasure by the recrystallization will be insufficient even if recording (overwriting) is further carried out. Since the amorphous state is in a quasi-stable state, it is possible that the amorphous state is changed into a more stable amorphous state by the long term storage. Stable amorphous marks tend to be less likely to be erased in general, and noises due to unerased amorphous marks occur.

From the above point of view, the fact that the jitter decreases when overwriting is successively carried out after the archival second recording is carried out is explainable. Namely, when the archival second recording is carried out, the formed amorphous marks are in "newly formed" amorphous state, and recover to the initial amorphous state which is relatively easily erased.

When the recording layer is made to be extremely thin, it is likely to be influenced by the interface of another layer which is in contact with the recording layer. Accordingly, the improvement in the stability of the amorphous state may be considered to be brought about by the amorphous state being maintained in a certain quasi-stable state due to the above effect of the interface.

Here, regarding the above two second recordings (shelf second recording, archival second recording), it is not clear whether either one mainly has influences, and there is a possibility that both have influences at the same time.

At any rate, the long term storage stability of recorded amorphous marks itself is considered to depend on the above-described subtle change of the crystalline state and/or the amorphous state of the recording layer. Further, the first recording on the non-recorded state which is stored for a long term is also considered to depend on the above-described subtle change of the crystalline state and/or the amorphous state of the recoding layer. Further, the storage stability of the recording medium including the shelf and archival second recordings on a medium which is preserved for a long term after the recording is also considered to depend on the above-described subtle change of the crystalline state and/or the amorphous state of the recording layer.

The above phenomenon is particularly remarkable when the phase-change recording material of the present invention is employed particularly for high velocity recording (approximately, a linear velocity of at least 20 m/s at recording). Heretofore, the above phenomenon is hardly problematic with respect to an information recording medium employed for low linear velocity recording. This is because the recording linear velocity has conventionally been low. It is considered that the above phenomenon is a newly found problem since the phase-change recording material of the present invention is applicable for high velocity recording.

With respect to the phase-change recording material of the present invention, the increase in the jitter at the shelf second recording and the archival second recording in high linear velocity recording can be suppressed low as compared with a conventional eutectic type material in the vicinity of $Sb_{70}Te_{30}$ or eutectic type material in the vicinity of $Sb_{85}Ge_{15}$. Further, by making the recording layer thin, the above increase in the jitter can be suppressed more effectively.

Further, by making the recording layer extremely thin (preferably at most 11 nm), the decrease in the reflectivity due to the long term storage tends to be suppressed. The reason is not clear also, but is considered that the change of the recording layer at the long term storage is suppressed in the same manner as in the case of improvement in the recording characteristics at the second recording after the long term storage.

With respect to the recording layer having the above predetermined Ge—In—Sb—Sn—Te type composition, if the In content is high and the Te content is low, the reflectivity may decrease after the optical information recording medium is subjected to an environment resistance test (in a state similar to the state after the optical information recording medium is stored for a long term) in some cases. Accordingly, it is preferred that the In content and the Te content are in a specific relation (wxy-z≦0.1 in the above formula (1)). However, the decrease in the reflectivity after the above environment resistance test (after the long term storage) tends to be suppressed by making the recording layer extremely thin, and thus there is a possibility that In and Te may not be in the above predetermined relation. This means that the possible recording layer composition range widens by making the recording layer extremely thin. From this viewpoint also, it is preferred to make the recording layer thin.

However, the recording characteristics such as the signal amplitude may be impaired in some cases if the recording layer is extremely thin. Regarding this point, the recording characteristics such as the signal amplitude can be at an adequately satisfactory level by adjusting the layer structure and the film thicknesses of the optical information recording medium.

Namely, in a case of an optical information recording medium in which on a substrate, a protective layer, a Ge—In—Sb—Sn—Te type recording layer having a predetermined composition, a protective layer and a reflective layer are formed in this order or in the opposite order, the signal intensity tends to be low when the recording layer is made extremely thin (thinner than about 12 nm for example). Accordingly, a device is required to obtain a high signal intensity, in a case where the recording layer is made extremely thin (at most 11 nm for example).

For example, one method is to change the film thickness of the protective layer located on the side from which the laser beam enters the recording layer. Namely, the film thickness of the protective layer is made thinner than the film thickness of the protective layer with which the reflectivity of the optical information recording medium reaches the minimum value. The film thickness with which the reflectivity reaches the minimum value various depending upon the laser wavelength to be employed, however, it is in the vicinity of 50 nm at the film thickness in the vicinity of 650 nm in DVD. By employing such a film thickness, the signal intensity becomes optically high.

However, it is known that when the film thickness of the protective layer on the laser beam incident side becomes thin, the thermal influence over e.g. the substrate tends to be significant, and the repeated recording durability tends to deteriorate in general. Accordingly, the above method of making the film thickness of the protective layer thin (in the vicinity of 50 nm for example) can be hardly employed. It is considered that a favorable repeated recording durability of an optical information recording medium can be obtained by employing a protective layer A (a protective layer containing a metal oxysulfide and/or a metal nitride) as described hereinafter for the entire protective layer or by employing the protective layer A as described hereinafter for the protective layer region of the protective layer which is in contact with the recording layer, even if the film thickness of the protective layer on the side from which the laser beam enters relative to the recording layer is made thin (at most 50 nm for example), against the above tendency. The details about the protective layer A will be explained below.

Under the above situation, the film thickness of the recording layer of the present embodiment is preferably at most 15 nm, more preferably at most 14 nm, furthermore preferably at most 13 nm, particularly preferably at most 12 nm, most preferably at most 11 nm.

On the other hand, as mentioned above, also in a case where the film thickness of the recording layer is made extremely thin in order to improve the recording characteristics after the long term storage, no adequate signal intensity can be obtained even by adjusting the layers other than the recording layer if the film thickness of the recording layer is excessively thin. The lower limit of the signal intensity depends on the performance of the retrieving apparatus, and in a case of rewritable DVD, the signal intensity tends to be low and the use tends to be difficult if the recording layer film thickness is less than 3 nm. Accordingly, the recording layer film thickness is at least 3 nm in rewritable DVD for example. Usually preferred is a recording layer film thickness of at least 5 nm.

(A-4) Method for Producing Recording Layer

The above recording layer can be obtained by DC or RF sputtering of a predetermined alloy target in an inert gas, particularly in an Ar gas.

Further, the density of the recording layer is usually at least 80%, preferably at least 90% of the bulk density. As the bulk density $\rho$, an approximate value from the following mathematical formula (2) is usually employed, but it may be actually measured by preparing a mass having an alloy composition constituting the recording layer:

$$\rho = \Sigma m_i \rho_i \quad (2)$$

wherein $m_i$ is the molar concentration of each element i, and $\rho_i$ is the atomic weight of the element i.

In the sputtering deposition method, the high energy Ar amount to be irradiated on the recording layer is increased by lowering the pressure of the sputtering gas (usually rare gas such as Ar, hereinafter explanation will be made with reference to the case of Ar) at the time of deposition, or by disposing the substrate in the vicinity of the front of the target, thereby to increase the density of the recording layer. The high energy Ar is usually either part of Ar ions to be irradiated on the target for sputtering which are bounced off and reach the substrate side, or the Ar ions in the plasma which are accelerated by the sheath voltage of the entire substrate face and reach the substrate.

Such an irradiation effect of the high energy rare gas is referred to as an atomic peening effect, and in the sputtering by an Ar gas which is commonly employed, Ar is incorporated into the sputtering film by the atomic peening effect. Accordingly, the atomic peening effect can be appraised by the Ar amount in the film. Namely, the small Ar amount indicates a small high energy Ar irradiation effect, and a film with a low density is likely to form.

On the other hand, if the Ar amount is large, irradiation of the high energy Ar tends to be intense, and the density of the film tends to be high. However, Ar incorporated in the film is likely to precipitate as a void at the time of repeated recording, and is likely to deteriorate the repeated recording durability. Accordingly, the discharge is carried out under an appropriate pressure, usually between the order of from $10^{-2}$ to $10^{-1}$ Pa.

Now, other constituting elements in the structure of the optical information recording medium which is the preferred embodiment of the present invention will be explained below.

(B) Substrate

As the substrate to be used in the present invention, a resin such as a polycarbonate, an acrylic resin or a polyolefin, or glass, or a metal such as aluminum may be employed. Usually guide grooves with a depth of a level of from 20 to 80 nm are formed on the substrate, and thus preferred is a substrate made of a resin on which the guide grooves can be formed by molding. Further, in the case of a so-called substrate face incidence (FIG. 1(a)) wherein the focused laser beam for erasing/retrieving the record enters from the substrate side, the substrate is preferably transparent.

The thickness of the substrate is usually at least 0.05 mm and at most 1.5 mm, however, one of about 1.2 mm for CD or one of about 0.6 mm for DVD is employed. Further, in a case where the optical head of the laser has a high NA and a short wavelength is employed to achieve a high density, a thin substrate of about 0.1 mm may also be used.

(C) Protective Layer (C-1) General Explanation Regarding Protective Layer Used in the Present Invention In order to prevent evaporation and deformation due to the phase change of the recording layer, thereby to control the thermal diffusion at that time, usually a protective layer is formed on one or both sides of the recording layer, preferably on both sides. The material of the protective layer is determined taking into consideration the refractive index, the thermal conductivity, the chemical stability, the mechanical strength, the adhesive properties, etc. Usually, a dielectric such as an oxide, sulfide, nitride or carbide of a metal or semiconductor, having high transparency and high melting point, or a fluoride of Ca, Mg, Li or the like may be employed.

In this case, such an oxide, sulfide, nitride, carbide or fluoride may not necessarily take a stoichiometrical composition, and the composition may be controlled to adjust the refractive index, etc., and it is effective to use them as a mixture. When repeated recording characteristics are taken into consideration, a mixture of dielectrics is preferred. More specifically, a mixture of ZnS or a chalcogen compound such as a rare earth sulfide with a heat resistant compound such as an oxide, nitride, carbide or fluoride may be mentioned. For example, a mixture of heat resistant compounds containing ZnS as the main component, or a mixture of heat resistant compounds containing an oxysulfide of the rare earth, particularly $Y_2O_2S$ as the main component is one example of the preferred protective layer composition.

As the material to form the protective layer, usually a dielectric material may be mentioned. The dielectric material may, for example, be an oxide of e.g. Sc, Y, Ce, La, Ti, Zr, Hf, V, Nb, Ta, Zn, Al, Cr, In, Si or Ge, a nitride of e.g. Ti, Zr, Hf, V, Nb, Ta, Cr, Mo, W, Zn, B, Al, Si, Ge or Sn, a carbide of e.g. Ti, Zr, Hf, V, Nb, Ta, Cr, Mo, W or Si, or a mixture thereof. Further, as the dielectric material, a sulfide, selenide or telluride of e.g. Zn, Y, Cd, Ga, In, Si, Ge, Sn, Pb, Sb or Bi, an oxysulfide of e.g. Y or Ce, a fluoride of e.g. Mg or Ca, or a mixture thereof, may be mentioned.

Further, as a specific example of the dielectric material, $ZnS$—$SiO_2$, SiN, $SiO_2$, $TiO_2$, CrN, $TaS_2$ or $Y_2O_2S$ may, for example, be mentioned. Among these materials, $ZnS$—$SiO_2$ is widely used in view of the high film deposition rate, the small film stress, the low rate of change of the volume due to the change in the temperature and the excellent weather resistance. In a case where $ZnS$—$SiO_2$ is used, the compositional ratio of ZnS to $SiO_2$ i.e. $ZnS:SiO_2$ is usually from 0:1 to 1:0, preferably from 0.5:0.5 to 0.95:0.05, more preferably from 0.7:0.3 to 0.9:0.1. Most preferably $ZnS:SiO_2$ is 0.8:0.2.

Taking the repeated recording characteristics into consideration, the film density of the protective layer is preferably at least 80% of the bulk state in view of the mechanical strength. In a case where a mixture of dielectrics is used, the theoretical density of the above-described mathematical formula (2) is employed as the bulk density.

The thickness of the protective layer is usually at least 1 nm and at most 500 nm in general. When it is at least 1 nm, the effect of preventing the deformation of the substrate or the recording layer can be secured, and a role as the protective layer can be fulfilled. Further, when it is at most 500 nm, while the role as the protective layer can be fulfilled, such a phenomenon can be prevented that the internal stress of the protective layer itself, the difference in the elastic characteristics with the substrate or the like will be remarkable, and thus cracks are formed.

Particularly when a first protective layer is formed, the first protective layer is required to suppress e.g. deformation of the substrate (deformation is of the covering layer) due to heat, and thus its thickness is usually at least 1 nm, preferably at least 5 nm, particularly preferably at least 10 nm. With such a thickness, accumulation of the microscopic deformation of the substrate during the repeated recording can be suppressed, and no remarkable noise increase by scattering of the retrieving laser beam will occur.

On the other hand, the thickness of the first protective layer is preferably at most 200 nm, more preferably at most 150 nm, furthermore preferably at most 100 nm, with relation to the time required for film formation. With such a thickness, e.g. the change of the groove shape of the substrate as viewed on the recording layer plane is less likely to occur. For example, such a phenomenon that the depth or width of the grooves is smaller than the intended shape on the substrate surface is less likely to take place.

On the other hand, in a case where a second protective layer is formed, the thickness of the second protective layer is usually at least 1 nm, preferably at least 5 nm, particularly preferably at least 10 nm so as to suppress the deformation of the recording layer. Further, it is preferably at most 200 nm, more preferably at most 150 nm, furthermore preferably at most 100 nm, particularly preferably at most 50 nm, so as to prevent accumulation of the microscopic plastic deformation in the interior of the second protective layer which occurs due to the repeated recording and to suppress the noise increase due to the scattering of the retrieving laser beam.

The thicknesses of the recording layer and the protective layers are selected taking into consideration the interference effects attributable to the multilayer structure in addition to the restrictions from the viewpoint of the mechanical strength and reliability, so that the efficiency for absorption of the laser beam will be good, and the amplitude of recording signals, i.e. the contrast between the recorded state and the non-recorded state, will be large.

The protective layer is produced usually by a known sputtering method.

The protective layer may be constituted by a plurality of layers made of different materials as described above. Particularly, it is preferred to form an interfacial layer containing no sulfur or having a low sulfur content at the interface on the side which is in contact with the recording layer and/or at the interface on the side which is in contact with the reflective layer containing Ag as the main component.

The interfacial layer to be formed on the interface on the side which is in contact with the recording layer containing Ag as the main component is usually used to suppress the reaction of Ag with sulfur (corrosion of Ag) in a case where the protective layer contains sulfur.

The material of the interfacial layer may be Ta, Nb or Mo. Among these materials, preferred is Nb or Mo. The atomic weight of Nb or Mo is relatively close to that of Ag contained in the reflective layer, and the exit angle of each element from the target will be substantially the same as that of Ag at the time of deposition by means of a sputtering method, and thus there is such an advantage that the film thickness distribution on the substrate which faces the target can be secured, and uniformity is easily secured. Further, the cost of Nb or Mo per 1 kg of the raw material is $\frac{1}{10}$ to $\frac{1}{100}$ and is very low, and the target can be produced at a low cost, such being favorable.

The content of the material in the interfacial layer is preferably at least 80 atomic %, more preferably at least 90 atomic %, particularly preferably at least 95 atomic %, and it is most preferably 100 atomic % (that is, the interfacial layer is made of pure Nb in an example of using Nb for the interfacial layer).

The interfacial layer may contain other elements to such an extent that the characteristics of the layer are not impaired, as the case requires. In a case where other elements are contained, the content of the above elements is preferably at most 20 atomic %, more preferably at most 10 atomic %, particularly preferably at most 5 atomic %, most preferably at most 2 atomic %. Further, the above elements may, for example, be Ni, Pd, Pt, Si, O, Se, V, Ti or Ta.

The interfacial layer may be made of a dielectric material containing no sulfur, other than the above. Specifically, an oxide, nitride or carbide of a metal or semiconductor, such as SiC, $Si_3N_4$, SiC, GeN, $Ta_2O_5$, $ZrO_2AlN$ or $Al_2O_3$ may, for example, be employed. They may not necessarily take a stoichiometrical composition, and a mixture may also be used.

The film thickness of the interfacial layer is preferably at least 1 nm, more preferably at least 2 nm. The reaction between the protective layer and the reflective layer may not effectively suppressed in some cases if the interfacial layer is excessively thin. However, within the above range, the reliability of the optical information recording medium will be favorably secured even in a reliability test in a severe environment at a high temperature in high humidity (80° C./85% RH for example).

On the other hand, the film thickness of the interfacial layer is preferably at most 10 nm, more preferably at most 8 nm, furthermore preferably at most 6 nm. Within the above range, the reaction between Ag in the reflective layer and S in the protective layer can be suppressed while the transmittance of the interfacial layer is favorably secured.

The interfacial layer is formed usually by a sputtering method.

(C-2) Preferred Embodiment of Protective Layer

It is preferred that the information recording medium used in the present invention has a protective layer A in contact with the recording layer employing the predetermined Ge—In—Sb—Sn—Te type material, and the protective layer A contains a metal oxysulfide and/or a metal nitride.

In a case where the information recording medium of the present invention is used as a phase-change type optical information recording medium, as the material of the protective layer, usually $(ZnS)_{80}(SiO_2)_{20}$ is used. This is because this material is excellent in transparency, the adhesive properties to a conventional recording layer, the sputtering rate, the cost, etc.

However, when the protective layer of the above $(ZnS)_{80}(SiO_2)_{20}$ is used for the recording layer having the predetermined Ge—In—Sb—Sn—Te type composition on which high speed recording/erasing is possible, an object to further improve the repeated recording durability arises in some cases. It is considered that one cause is that a quick change in temperature is brought about in erasing the record of an optical information recording medium for high speed recording, as compared with an optical information recording medium for low speed recording. For example, in a case where the recording linear velocity doubles, the time to increase the temperature of the recording layer by irradiation with the laser beam will be ½, and further, the cooling rate tends to be high also. This is because the temperature distribution of the melted region of the recording layer is gentle when the recording is carried out at a low linear velocity, whereas it tends to be sharp when the recording is carried out at a high linear velocity. Further, the distance between the melted region and the laser beam tends to be relatively long in the recording at a high linear velocity as compared with the recording at a low linear velocity. Of course, as the cause of the above repeated recording durability not being adequate, a cause resulting from the recording layer material itself, such as a difference in properties regarding the material flow due to the melting and solidification, or such a cause that the atomic diffusion of e.g. sulfur which is reported in the case of the combination with a conventional recording material is more likely to occur, may also be considered.

In the present invention, by forming a protective layer A containing GeN for example as the metal nitride or $Y_2O_2S$ for example as the metal oxysulfide in contact with the recording layer containing a Ge—In—Sb—Sn—Te type recording layer material, further improvement of the repeated recording durability of the information recording medium can be expected. The reason why the improvement of the repeated recording durability can be expected by forming a protective layer A containing a metal nitride such as GeN or a metal oxysulfide such as $Y_2O_2S$ is not necessarily clear, but is supposed to be because effects to suppress the deformation of the recording layer due to the quick change in the temperature by carrying out the high speed recording as compared with a conventional one, the material flow in the recording layer, the atomic diffusion between the layers, can be obtained.

As mentioned above, when the protective layer A in contact with the recording layer contains a metal oxysulfide or a metal nitride, the repeated recording characteristics (repeated overwriting characteristics) tend to improve. Accordingly, it is considered that the above protective layer A has a high affinity with Sb, Ge, In and Sn constituting the phase-change recording material of the present invention.

(1) Protective Layer A

In the present invention, it is preferred to incorporate a metal oxidesulfide and/or a metal nitride into the protective layer A in contact with the recording layer. Of course, a metal oxysulfide and a metal nitride may be used together. Now, explanation will be made in further detail.

(1-1) Protective Layer A Containing Metal Oxysulfide

In the present invention, it is preferred to use the protective layer A containing a metal oxysulfide. Containing a metal oxysulfide means that the constituting element is present while maintaining the form of the metal oxysulfide.

In the present invention, it is expected that the durability when recording is carried out repeatedly on the information recording medium further improves by forming the protective layer A containing a metal oxysulfide in contact with the recording layer having a specific composition. The reason is not clearly understood yet, but is supposed to be related with high thermal conductivity and hardness of the protective layer A containing a metal oxysulfide and high uniformity of the distribution of the constituting element. Namely, the protective layer A in the present invention has high thermal conductivity and hardness as compared with a protective layer employing a composite dielectric containing ZnS as the main component, as represented by a ZnS—$SiO_2$ film which has conventionally been commonly used. On the other hand, the refractive index of the protective layer A is usually from about 1.7 to about 2.4 although it depends on the compositional ratio, and is substantially the same as that of a protective layer employing a composite dielectric containing ZnS as the main component.

Further, it is supposed that deformation of the recording layer due to thermal expansion tends to be small since the thermal conductivity of the protective layer A containing a metal oxysulfide is high. Namely, since the thermal conductivity of the protective layer A is high, the heat of the recording layer which is heated when the recording marks are formed by the laser can be let loose quickly. Accordingly, the difference in temperature between the interfacial region which is in contact with the recording layer of the protective layer A and the region of the protective layer A which is apart from the recording layer, or the difference in temperature between the mark-formed region and the peripheral region can be instantaneously dissolved. As a result, peeling of the film or occurrence of the cracks resulting from the difference in temperature can be suppressed. In other words, it is thought that the overwriting deterioration can be delayed. The thermal conductivity can be indirectly known from the value of the laser power when amorphous marks are formed on the prepared disk. Namely, the higher the thermal conductivity, the higher the laser power required to heat the recording layer tends to be high. For example, in a case where a protective layer A containing a metal oxysulfide is used, the power required for mark formation tends to be high as compared with a case where a protective layer of ZnS:$SiO_2$=80:20 (mol %) is used. This is because the function of the protective layer A as a heat dissipation layer is increased due to a high thermal conductivity.

Further, the JIS Knoop hardness of the protective layer using $ZnS:SiO_2=80:20$ (mol %) is 280, whereas the JIS Knoop hardness of the protective layer A using $Y_2O_2S$ for example as the metal oxysulfide is 520. The protective layer A having a high hardness is important with a view to preventing the deformation of the recording layer. If the hardness is low, it is difficult to appropriately suppress the change in the volume of the recording layer due to recording/erasing, i.e. the deformation resulting from the difference in the volume between the amorphous state and the crystalline state, and the deformation is accumulated along with the increase in the number of the overwriting, thus causing decrease in the signal intensity.

Further, in the protective layer A containing a metal oxysulfide, the metal atom is bonded to both sulfur and oxygen, and accordingly the mixing properties of sulfur with oxygen are incomparably high in comparison with a protective layer employing a mixture of a sulfide and an oxide such as $ZnS$—$SiO_2$ or $ZnS$—$Y_2O_3$. Accordingly, it is supposed that the protective layer A has stably high performance since the dispersibility of sulfur and oxygen with metal atoms such as selenium atoms is higher than conventional $ZnS$—$SiO_2$. Accordingly, it is thought that such a phenomenon that sulfur diffusion from the protective layer to the recording layer during the repeated overwriting to cause a decrease in the reflectivity or a change in the crystallization speed is suppressed.

Further, in a case where the protective layer A containing a metal oxysulfide such as $Y_2O_2S$ is formed in contact with the predetermined Ge—In—Sb—Sn—Te type recording layer to be used in the present invention, the signal amplitude of the information recording medium tends to be high as compared with a case where the protective layer A contains a metal nitride such as GeN. The reason is not clear, but such a reason that the properties of the crystal growth of the recording layer are slightly changed by the protective layer A in contact with the recording layer, and the size of the amorphous marks to be formed varies, may be considered. Such properties are considered to be determined by the combination of the recording layer material and the material of the protective layer A, and with respect to the conventional recording layer material, the change of the signal intensity by the material of the protective layer A has not attracted an attention.

As the metal element used for the metal oxysulfide, a rare earth metal element such as Sc, yttrium or a lanthanoid element such as La or Ce; or a transition metal element such as Ti may, for example, be mentioned. Among them, a rare earth metal element is preferred, a rare earth metal element selected from the group consisting of yttrium and La, Ce, Nd, Sm, Eu, Gd, Tb and Dy is particularly preferred, and most preferred is yttrium or Ce. The oxysulfide of yttrium ($Y_2O_2S$) is thermochemically more stable than $Y_2O_3$ or $Y_2S_3$ up to about 1000° C., and accordingly the most preferred element is yttrium.

The content of the metal oxysulfide in the protective layer A is preferably at least 5 mol %, more preferably at least 10 mol %, most preferably at least 15 mol %. If the content of the metal oxysulfide is too low, the overwriting characteristics may be insufficient in some cases. On the other hand, in view of the repeated overwriting characteristics etc., the content of the metal oxysulfide in the protective layer A is preferably as high as possible, and the content of the metal oxysulfide in the protective layer A may be at most 100 mol %.

Further, the content of the metal element constituting the metal oxysulfide in the protective layer A is usually at least 10 atomic %, preferably at least 20 atomic %, more preferably at least 25 atomic %. The content of the metal element constituting the metal oxysulfide is an index indicating the content of the metal oxysulfide in the protective layer A, and if the metal element is too small, the effect for further improving the overwriting characteristics may not be adequate in some cases. On the other hand, in view of the repeated overwriting characteristics, the content of the metal oxysulfide in the protective layer A is preferably as high as possible, and thus the upper limit of the content of the metal element constituting the metal oxysulfide is the content of the metal element when the protective layer A consists entirely of the metal oxysulfide.

Further, for the protective layer A, a metal oxysulfide and another material may be used together. Said another material is not particularly limited so long as it is a material which is commonly used for the protective layer. For example, a material exemplified in the above "General explanation regarding protective layer used in the present invention" may optionally be used.

More specifically as another material, an oxide, sulfide, nitride, carbide or fluoride of a metal or semiconductor, as represented by zinc sulfide, zinc oxide, silicon oxide, silicon nitride, aluminum nitride, aluminum oxide, a rare earth oxide, a rare earth sulfide, a rare earth fluoride, magnesium fluoride, etc. may, for example, be mentioned. Among them, particularly preferred is a zinc compound such as zinc sulfide or zinc oxide, which is excellent in the adhesive properties to the recording layer. As a result, a more stable and higher durability can be obtained.

In a case where another material is contained in the protective layer A other than the metal oxysulfide, the content of the material is usually at most 99 mol %, preferably at most 90 mol %. On the other hand, it is usually at least 1 mol %, preferably at least 5 mol %.

However, the appropriate content varies depending upon the type of the material to be mixed. For example, in a case where zinc sulfide is used as the above material, its amount may be high, and it is usually at least 20 mol %, preferably at least 30 mol %, furthermore preferably at least 50 mol %, most preferably at least 60 mol %.

On the other hand, in a case where zinc oxide is used as the above material, a too high content tends to be unfavorable, and the content is usually at most 30 mol %, preferably at most 20 mol %, furthermore preferably at most 10 mol %. Further, the molar content of zinc oxide is more preferably at most half the molar content of the metal oxysulfide.

As the particularly preferred composition of the protective layer A, a mixed composition containing $Y_2O_2S$ and $ZnS$ may be mentioned. In this case, particularly excellent overwriting characteristics can be obtained. In this case, the molar ratio of $ZnS$ to $Y_2O_2S$ is usually at least 1%, preferably at least 5%, more preferably at least 10%, and usually at most 1000%, preferably at most 700%, furthermore preferably at most 500%.

Further, it is possible to let zinc in the metal form be present in the protective layer A. However, it is contained preferably in the form of a zinc compound such as zinc oxide or zinc sulfide as described above.

In the present invention, the purity of the protective layer A (the content of the metal oxysulfide or the content of a mixture of the metal oxysulfide with another material in the protective layer A) is preferably at least 90 mol %. The purity is preferably as high as possible, however, the influence of impurities in an amount less than 10 mol % over the characteristics of the protective layer A is negligible. Particularly when the impurities are stable compounds, the bad influence tends to be small, however, if the amount of the impurities exceeds 10 mol %, there is high possibility that the physical property values such as the hardness or the stress of the film change, and the characteristics of the protective layer A may deteriorate.

The protective layer A containing a metal oxysulfide can be formed by deposition by means of a sputtering method using a target containing a metal oxysulfide. Usually, a target having a composition within a range substantially the same as the preferred composition of the protective layer A is used.

Namely, it is preferred to use one containing a metal oxysulfide as the target for sputtering. The type of the metal element of the metal oxysulfide to be used for the target is optionally selected according to the composition of the protective layer A.

Further, in a case where the protective layer A contains a metal oxysulfide and another protective layer material, a target of a mixture of the metal oxysulfide and the another material may be used in accordance with the composition of the another material to be used. Further, a target of the metal oxysulfide and a target of the above another material may be separately prepared, and they are subjected to sputtering at the same time.

The content of the metal oxysulfide in the target is usually at least 10 mol %, preferably at least 30 mol %, more preferably at least 50 mol %. If the content of the metal oxysulfide in the target is excessively low, the metal oxysulfide may be decomposed in the target, whereby the metal oxysulfide cannot be incorporated in the protective layer A in some cases. On the other hand, the content of the metal oxysulfide in the target varies depending upon the content of the above another material used. However, in a case where a target comprising only metal oxysulfide is used, the content of the metal oxysulfide in the target is usually 100 mol %.

Whether or not the metal oxysulfide is contained in the target can be confirmed by measuring the X-ray diffraction of the target.

Further, the target containing a metal oxysulfide is produced usually by using a powder of the metal oxysulfide or a mixed powder of an oxide and a sulfide of the same metal, by using a known method such as hot pressing method. Preferred as the metal element to be used is a rare earth metal element.

As the conditions for sputtering, known conditions may be employed.

For the analysis of the composition of the protective layer A, usually the composition may be identified by combination of e.g. Auger electron spectroscopy (AES), Rutherford back scattering (RBS), inductively-coupled plasma spectrometry (ICP) etc.

(1-2) Protective Layer A Containing Metal Nitride

In the present invention, it is preferred to use a protective layer A containing a metal nitride.

A metal nitride tends to have a high thermal conductivity similar to the metal oxysulfide. Accordingly, it is considered that the high thermal conductivity of the protective layer A suppresses peeling of the film or occurrence of the cracks resulting from the difference in temperature, and can delay deterioration during the overwriting, similar to the above case of one containing a metal oxysulfide as mentioned above.

As the metal to be used for the metal nitride, at least one element selected from the group consisting of Si, Ge, Al, Ti, Ta, Cr, Mo, Sb, Sn, Nb, Y, Zr and Hf may, for example, be mentioned. The nitride of such an element is stable, and thus the storage stability of the optical information recording medium tends to improve. Preferred as the above element is Si, Ge, Al or Cr which provides higher transparency and excellent adhesion properties. A plurality of the above elements may be used. In a case of a nitride of an alloy comprising a plurality of the above elements, it is preferred to use a nitride of an alloy containing Ge as the main component. "Containing Ge as the main component" means that the Ge content in the alloy is usually at least 50 atomic %, preferably at least 70 atomic %, more preferably at least 80 atomic %, particularly preferably at least 90 atomic %, most preferably at least 95 atomic %.

In a case where one type of the above elements is used, as the material formed by the above element and nitrogen, nitride of the above element simple substance may be mentioned. More specifically, a composition in the vicinity of e.g. Si—N, Ge—N, Cr—N or Al—N may be mentioned. Among them, in view of higher effect for preventing diffusion against the recording layer, it is preferred to use Si—N (nitride of silicon), Ge—N (nitride of germanium) or Al—N (nitride of aluminum), and it is more preferred to use Ge—N (nitride of germanium). In this case, an nitride of an alloy containing Ge as the main component, having part of Ge substituted by e.g. Cr may also be used. However, the amount substituted is preferably at most 50%, more preferably at most 30% of Ge by the atomicity ratio.

In a case where at least two of the above elements are used, as the material formed by the above elements and nitrogen, a composite nitride of the above elements may be mentioned. As such a compound, as representative examples using Ge—N, one containing, together with Ge, e.g. Al, B, Ba, Bi, C, Ca, Ce, Cr, Dy, Eu, Ga, In, K, La, Mo, Nb, Ni, Pb, Pd, Si, Sb, Sn, Ta, Te, Ti, V, W, Yb, Zn or Zr, such as Ge—Si—N, Ge—Sb—N, Ge—Cr—N, Ge—Al—N, Ge—Mo—N or Ge—Ti—N may be mentioned.

The content of the metal nitride in the protective layer A is preferably at least 5 mol %, more preferably at least 10 mol %, most preferably at least 15 mol %. If the content of the metal nitride is too low, the overwriting characteristics may decrease in some cases. On the other hand, in view of the repeated overwriting characteristics etc., the content of the metal nitride in the protective layer A is preferably as high as possible, and the content of the metal nitride in the protective layer A may be at most 100 mol %.

Further, the content of the metal element constituting the metal nitride in the protective layer A is usually at least 10 atomic %, preferably at least 20 atomic %, more preferably at least 25 atomic %. If the content of the metal oxysulfide is too low, the effect for further improving the overwriting characteristics may not be adequate in some cases. On the other hand, in view of the repeated overwriting characteristics etc., the content of the metal nitride in the protective layer A is preferably as high as possible, and thus the upper limit of the content of the metal element constituting the metal nitride is the content of the metal element when the protective layer A consists entirely of the metal nitride.

Further, for the protective layer A, a metal nitride and another material may be used together. As the another material and its content, the same ones as explained for the protective layer A containing a metal oxysulfide may be employed.

In the present invention, the purity of the protective layer A (the content of the metal nitride or the content of a mixture of the metal nitride and another material in the protective layer A) is preferably at least 90 mol %. The purity is preferably as high as possible, however, the influence of impurities in an amount less than 10 mol % over the characteristics of the protective layer A is negligible. Particularly when the impurities are stable compounds, the bad influence tends to be small, however, if the amount of the impurities exceeds 10 mol %, there is high possibility that the physical property values such as the hardness or the stress of the film change, and the characteristics of the protective layer A may deteriorate.

The protective layer A containing a metal nitride can be formed by means of a sputtering method using a target containing a metal nitride. Further, the protective layer A may be formed also by a reactive sputtering method in which a slight amount of a mixed gas of Ar and $N_2$ is flown in a vacuum chamber, and under a predetermined vacuum pressure, a voltage is applied to a target comprising a predetermined metal (a single metal element or a metal element composite in the metal nitride contained in the protective layer A) for discharge, and the ejected single metal element or metal element composite is reacted with $N_2$ to convert it into a nitride for deposition. Here, it has to be noted that the transparency of the protective layer A is hardly secured if the nitrogen content in the protective layer A is excessively low, and the improvement of the repeated recording durability of the optical information recording medium tends to be insufficient if the nitrogen content is excessively high. Accordingly, in a case where the above reactive sputtering method is employed, it is important to adjust the nitrogen flow amount. Further, the pressure at the time of sputtering also has an influence over the film properties. Usually, by decreasing the pressure, the protective layer A can be formed densely.

For the analysis of the composition of the protective layer A, the composition can be identified usually by combination of Auger electron spectroscopy (AES), Rutherford back scattering (RBS), inductively-coupled plasma spectroscopy (ICP) etc.

(1-3) Film Thickness of Protective Layer A

The preferred range of the film thickness of the protective layer A varies depending upon the position at which the protective layer A is used.

Namely, in a case where the protective layer A is formed as the first protective layer, the first protective layer is required to suppress e.g. the deformation of the substrate due to heat, and its thickness is usually at least 1 nm, preferably at least 5 nm, particularly preferably at least 10 nm. With such a thickness, accumulation of the microscopic deformation of the substrate during the repeated recording can be suppressed, and no remarkable noise increase by scattering of the retrieving laser beam will occur.

On the other hand, the thickness of the first protective layer is preferably at most 200 nm, more preferably at most 150 nm, furthermore preferably at most 100 nm, with relation to the time required for film formation. With such a thickness, e.g. a change in the groove shape of the substrate as viewed on the recording layer plane is less likely to occur. For example, such a phenomenon that the depth or width of the grooves is smaller than the intended shape on the substrate surface is less likely to take place.

In a case where the protective layer A is formed as the second protective layer, the thickness of the second protective layer is usually at least 1 nm, preferably at least 5 nm, particularly preferably at least 10 nm so as to suppress deformation of the recording layer. Further, in order to prevent accumulation of microscopic plastic deformation in the interior of the second protective layer which occurs along with the repeated recording, thereby to suppress the noise increase by scattering of the retrieving laser beam, it is preferably at most 200 nm, more preferably at most 150 nm, furthermore preferably at most 100 nm, particularly preferably at most 50 nm.

However, in the present invention, usually the protective layer A having a high thermal conductivity and having a high hardness is formed in contact with the recording layer, and accordingly the film thickness of the protective layer A located on the side from which the laser beam enters relative to the recording layer can be made thin, as explained above. Namely, in a case where the protective layer A is formed in contact with the recording layer face on the side from which the laser beam enters, the film thickness of the protective layer A is preferably at most 50 nm.

The sputtering rate of the material containing a metal oxysulfide such as $Y_2O_2S$ as the main component, tends to be lower than the sputtering rate of a material such as $(ZnS)_{80}(SiO_2)_{20}$ which has conventionally been employed. Accordingly, with a view to increasing the productivity of the information recording medium, the protective layer A containing a metal oxysulfide may be formed relatively thinly in contact with the recording layer and a protective layer B may be formed in contact with the protective layer A. Further, a material which has conventionally been employed (e.g. $(ZnS)_{80}(SiO_2)_{20}$) may be used for the protective layer B. The details of the specific embodiment of such an information recording medium will be described hereinafter.

As mentioned above, in a case where the protective layer has a multilayer structure by using the protective layer A and the protective layer B, the film thickness of the protective layer A in the present invention is usually at least 0.1 nm, preferably at least 1 nm, more preferably at least 5 nm. On the other hand, the film thickness of the protective layer A is usually at most 100 nm, preferably at most 50 nm, more preferably at most 25 nm, furthermore preferably at most 10 nm.

(1-4) Position of Protective Layer A and Recording Layer

In the present invention, it is preferred that the protective layer A containing a metal oxysulfide and/or a metal nitride is formed in contact with the recording layer. More preferably, the above predetermined protective layer A is formed on both sides of the recording layer. It is because the repeated overwriting characteristics can be further improved by forming the above predetermined protective layer A on both sides of the recording layer. In general, by forming the above predetermined protective layer A on both sides of the recording layer, the recording layer and the protective layer A tend to peel off, however, it is considered that the above problem of peeling is less likely to occur in the recording layer employing the predetermined Ge—In—Sb—Sn—Te type composition of the present invention.

For example, if the protective layer A containing a metal oxysulfide such as $Y_2O_2S$ is formed in contact with a conventional recording layer of SbTe eutectic composition, film peeling in an environment resistance test tends to occur. This tendency becomes more remarkable if the above protective layer A is formed on both sides of the recording layer. For example, with respect to a conventional recording layer employing a SbTe eutectic type composition, if the protective layer A containing a metal oxysulfide such as $Y_2O_2S$ is formed in contact with both sides of the recording layer, film peeling occurs in an environment resistance test with high humidity, and the adhesive properties and the weather resistance of the film tend to be not necessarily sufficient.

On the other hand, in a case where the protective layer A containing a metal oxysulfide such as $Y_2O_2S$ is formed in contact with a recording layer employing the predetermined Ge—In—Sb—Sn—Te type composition of the present invention, film peeling hardly occurs in an environment resistance test even when the protective layer A is formed on both sides of the recording layer, and repeated recording durability does not substantially change as before and after the environment resistance test.

Further, when the protective layer A containing a metal oxysulfide such as $Y_2O_2S$ is formed in contact with the recording layer employing a conventional SbTe eutectic type composition, the stability of the amorphous marks tends to deteriorate. On the other hand, with the predetermined Ge—In—Sb—Sn—Te type composition used in the present invention, the stability of the amorphous marks can be increased by adjusting the composition. Accordingly, deterioration of the stability of the amorphous marks can be suppressed even when the protective layer A containing a metal oxysulfide such as $Y_2O_2S$ is formed in contact with the recording layer.

(2) Protective Layer B

Figure 6B:
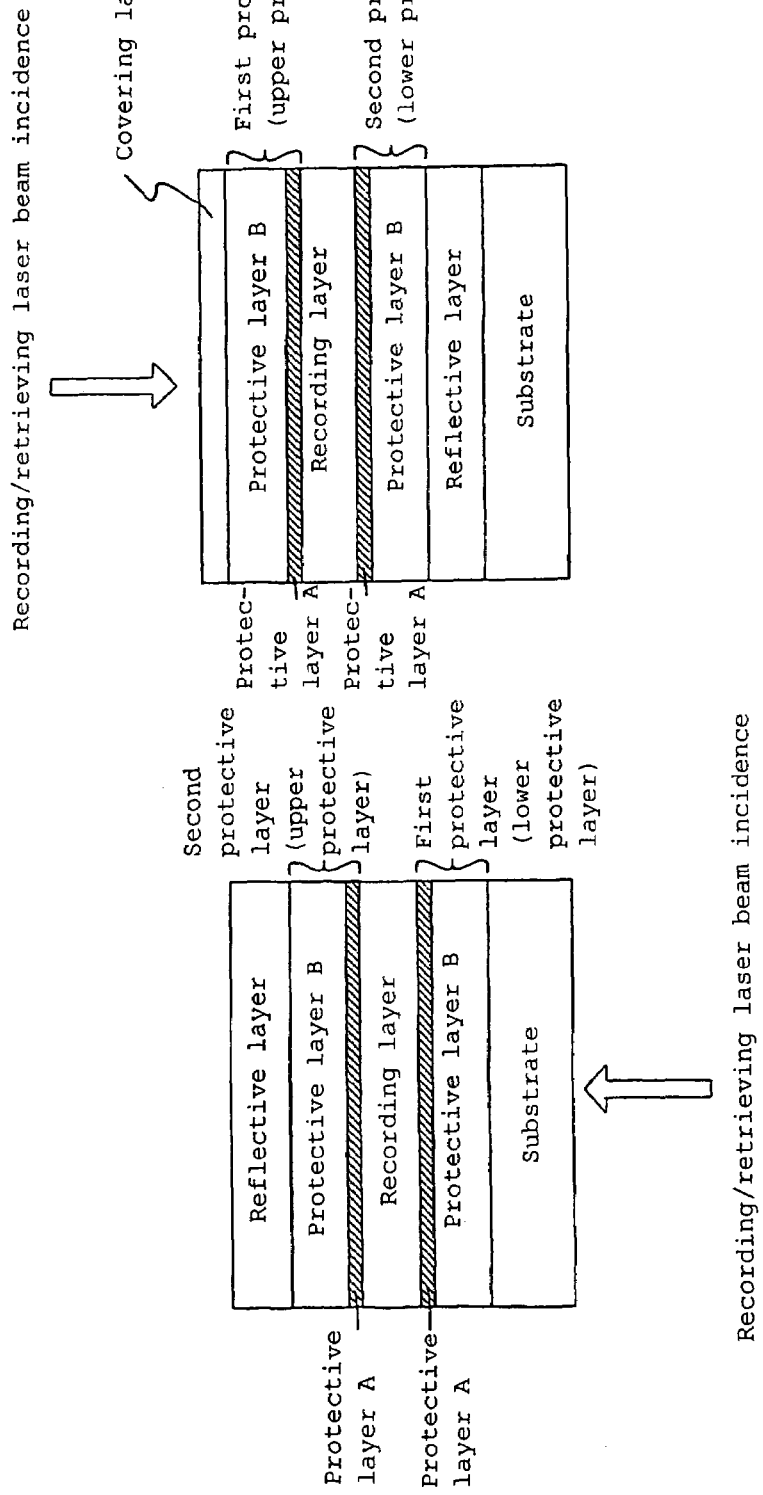

Another example of the preferred layer structure of the optical information recording medium is to make one or both of the first and second protective layers have a two-layer structure comprising the protective layer A and the protective layer B. In view of e.g. the repeated overwriting, it is preferred to make the first protective layer located on the laser beam incident side have a two-layer structure (FIGS. 5(a), 5(b)), and it is more preferred to make both the first and the second protective layers have a two-layer structure comprising the protective layer A and the protective layer B (FIGS. 6(a), 6(b)).

In the above preferred layer structure, the first protective layer or the second protective layer has a two-layer structure comprising the protective layer A and the protective layer B, however, the layer structure is not limited to such an embodiment so long as the protective layer A is formed in contact with the recording layer. For example, it may be optionally carried out to make the first protective layer or the second protective layer have a multilayer structure of at least three layers, by further forming a protective layer formed by another material in contact with the protective layer B.

(2-1) Material, Production Method etc. of Protective Layer B

As the material of the protective layer B, a material commonly used for the protective layer may optionally be used. Such a material has already been explained, and the explanation is omitted here. The protective layers A and B may be two layers comprising different materials, or they may have a gradient composition in which the respective components gradually change.

Further, as the method for producing the protective layer, a production method commonly used for the protective layer may be used.

(2-2) Film Thickness of Protective Layer B

The protective layer B is in contact with the protective layer A, and plays a role as the protective layer in a two-layer structure of the protective layer A and the protective layer B. Accordingly, the film thickness of the protective layer B is a film thickness obtained by subtracting the film thickness of the protective layer A from the film thickness which is usually required for a protective layer.

However, in the present invention, the protective layer A usually having a high thermal conductivity and a high hardness is formed in contact with the recording layer, and accordingly the film thickness of the protective layer located on the side from which the laser beam enters relative to the recording layer (for example, the film thickness of the protective layer A in a case where the protective layer is formed only by the protective layer A, or the total film thickness of the protective layer A and the protective layer B in a case where the protective layer A and the protective layer B are laminated to form the protective layer) can be made thin, as explained above.

Namely, the total of the film thickness of the protective layer A and the film thickness of the protective layer B is preferably at most 50 nm, in a case where the protective layer A is formed in contact with the recording layer face on the side from which the laser beam enters, and the protective layer B is further formed in contact with the protective layer A.

As mentioned above, in a case where the protective layer has a multilayer structure by using the protective layer A and the protective layer B, the film thickness of the protective layer A in the present invention is usually at least 0.1 nm, preferably at least 1 nm, more preferably at least 2 nm, furthermore preferably at least 3 nm, particularly preferably at least 5 nm. On the other hand, the film thickness of the protective layer A is usually at most 100 nm, preferably at most 50 nm, more preferably at most 25 nm, furthermore preferably at most 10 nm. Accordingly, the film thickness of the protective layer B is the rest obtained by subtracting the film thickness of the protective layer A from the total film thickness of the protective layer.

The thicknesses of the recording layer and the protective layers are selected taking into consideration the interference effects attributable to the multilayer structure in addition to restrictions from the viewpoint of the mechanical strength and reliability, so that the efficiency for absorption of the laser beam will be good, and the amplitude of recording signals, i.e. the contrast between the recorded state and the non-recorded state, will be large.

(D) Reflective Layer

In the optical information recording medium, a reflective layer may further be formed. In the present invention, it is preferred that the optical information recording medium further has a reflective layer with a view to increasing the heat dissipation properties of the recoding layer.

The position at which the reflective layer is formed usually depends at the incident direction of the retrieving laser beam, and it is formed on the opposite side of the recording layer from the incident side. Namely, in a case where the retrieving laser beam enters from the substrate side, the reflective layer is formed usually on the opposite side of the recording layer from the substrate, and in a case where the retrieving laser beam enters from the recording layer side, the reflective layer is formed usually between the recording layer and the substrate (FIGS. 1(a), 1(b)).

Here, in addition to the reflective layer which completely reflects laser beam, an extremely thin reflective layer material layer which transmits at least half of the laser beam may be formed on the incident side of the recording layer in some cases, and this is used as a transparent reflective layer and distinguished from the reflective layer. The purpose of forming the transparent reflective layer is usually to adjust the phase of the incident laser beam or the reflective laser beam, or to accelerate heat dissipation from the protective layer on the incident laser beam side.

As the material to be used for the reflective layer, a substance having a high reflectivity is preferred, and particularly preferred is a metal such as Au, Ag or Al which can be expected to have a heat dissipation effect also. The heat dissipation properties are determined by the film thickness and the thermal conductivity, and since the thermal conductivity is substantially in proportion to the volume resistivity in the case of such a metal, the heat dissipation performance may be represented by the sheet resistivity. The sheet resistivity is usually at least 0.05 Ω/□, preferably at least 0.1 Ω/□, and on the other hand, it is usually at most 0.6 Ω/□, preferably at most 0.5 Ω/□, more preferably at most 0.4 Ω/□, furthermore preferably at most 0.2 Ω/□.

This is to guarantee particularly high heat dissipation properties, and is necessary to suppress recrystallization to a certain extent in a case where competition between the formation of an amorphous phase and the recrystallization is remarkable in the formation of amorphous marks, as in the recording layer to be used for the optical information recording medium. In order to control the thermal conductivity of the reflective layer itself or to improve the corrosion resistance, e.g. Ta, Ti, Cr, Mo, Mg, V, Nb, Zr or Si may be added in a small amount to the above metal. The addition amount is usually at least 0.01 atomic % and at most 20 atomic %. An aluminum alloy containing at least one of Ta and Ti in an amount of at most 15 atomic %, particularly an alloy of $Al_\alpha Ta_{1-\alpha}$ ($0 \leq \alpha \leq 0.15$) is excellent in corrosion resistance, and is a particularly preferred reflective layer material with a view to improving the reliability of the optical information recording medium.

Particularly in a case where the film thickness of the second protective layer is at least 40 nm and at most 50 nm, the amount of the added element contained is preferably at most 2 atomic % so as to make the reflective layer have a high thermal conductivity.

Particularly preferred as the material of the reflective layer is one containing Ag as the main component. "Containing Ag as the main component" means that Ag is contained in an amount of at least 50 atomic % based on the entire reflective layer. The content of Ag based on the entire reflective layer is preferably at least 70 atomic %, more preferably at least 80 atomic %, furthermore preferably at least 90 atomic %, particularly preferably at least 95 atomic %. Most preferred with a view to increasing the heat dissipation properties is to employ pure Ag as the material of the reflective layer.

The reason why it is preferred that Ag is contained as the main component is as follows. Namely, recording is carried out again on recording marks which are stored for a long time, such a phenomenon may take place in some cases that the recrystallization speed of the phase-change recording layer is high only at the first recording immediately after the storage. The reason why such a phenomenon takes place is not clear, but is supposed to be because the size of the amorphous marks formed by the first recording immediately after the storage is smaller than the desired size of the marks due to increase in the recrystallization speed of the recording layer immediately after the storage. Accordingly, in a case where such a phenomenon takes place, Ag having extremely high heat dissipation properties may be used for the reflective layer to increase the cooling rate of the recording layer, whereby recrystallization of the recording layer at the first recording immediately after the storage can be suppressed and the size of the amorphous marks can be maintained to the desired size.

A Ag alloy containing one member of Mg, Ti, Au, Cu, Pd, Pt, Zn, Cr, Si, Ge, Bi and a rare earth element in an amount of at least 0.01 atomic % and at most 10 atomic % in Ag also has a high reflectivity and a high thermal conductivity, is excellent in heat resistance and is preferred.

The film thickness of the reflective layer is usually at least 10 nm so that the incident laser beam is completely reflected so that there is no transmitted light, and it is preferably at least 20 nm, more preferably at least 40 nm. Further, when it is too thick, there is no change in the heat dissipation effect, the productivity is unnecessarily deteriorated, and the cracks are likely to occur, and accordingly it is usually at most 500 nm. However, it is preferably at most 400 nm, more preferably at most 300 nm.

The recording layer, the protective layer and the reflective layer are formed usually by e.g. a sputtering method.

It is preferred to carry out deposition in an in-line apparatus having a recording layer target, a protective layer target and, if necessary, a reflective layer material target provided in the same vacuum chamber, with a view to preventing oxidation or contamination among the respective layers. Further, it is excellent in view of the productivity also.

(E) Protective Coating Layer (Covering Layer)

It is preferred to form a protective coating layer comprising a ultraviolet-curing resin or a thermosetting resin on the outermost surface side of the optical information recording medium, so as to prevent direct contact with the air or to prevent scars by the contact with foreign materials. The protective coating layer has a thickness of usually from 1 μm to several hundred μm. Further, a dielectric protective layer having high hardness may further be formed, or a resin layer may further be formed thereon.

(Initial Crystallization Method of Optical Information Recording Medium)

The recording layer is formed usually by a physical vapor deposition method in vacuum such as a sputtering method. However, in a state immediately after the deposition (as-deposited state), the recording layer is usually amorphous, and therefore, it is preferred to crystallize the recording layer to form a non-recorded or erased state. This operation is referred to as initialization (or initial crystallization). As the initial crystallization operation, a method such as oven annealing in a solid phase at a temperature of at least the crystallization temperature (usually from 150 to 300° C.) and at most the melting point, annealing under irradiation with a light energy of e.g. a laser beam or a flash lamp beam or melt initialization may, for example, be mentioned. In the present invention, among the above initial crystallization operations, it is preferred to employ melt initialization, since a phase-change recording material with a small formation of crystal nuclei is employed.

In the melt initialization, if the recrystallization speed is too slow, there will be a time until the thermal equilibrium is reached, whereby other crystalline phases may be formed in some cases. Accordingly, it is preferred to increase the cooling rate to some extent. Further, if the recording layer is held in a melted state for a long time, the recording layer may flow, a thin film such as the protective layer may peel off by the stress, or e.g. the resin substrate may deform, thus leading to destruction of the medium, such being unfavorable.

For example, the time for maintaining the temperature at a level of at least the melting point is preferably usually at most 10 μs, preferably at most 1 μs.

Further, for the melt initialization, it is preferred to employ a laser beam. It is particularly preferred to carry out initial crystallization by using an oval laser beam having its minor axis substantially in parallel with the scanning direction (hereinafter, this initialization method may sometimes be referred to as "bulk erasing"). In such a case, the length of the major axis is usually from 10 to 1000 μm, and the length of the minor axis is usually from 0.1 to 5 μm.

Here, the lengths of the major axis and the minor axis of the beam are defined from the half value width in a case where the light energy intensity distribution within the beam is measured. With respect to the beam shape also, the minor axis length is preferably at most 5 μm, more preferably at most 2 μm so as to easily realize local heating and rapid cooling in the minor axis direction.

As the laser beam source, various types may be used including, for example, a semiconductor laser and a gas laser. The power of the laser beam is usually from about 100 mW to about 10 W. Further, another light source may be used so long as a power density and a beam shape at the same level can be obtained. Specifically, a Xe lamp laser beam may, for example, be mentioned.

In the initialization by bulk erasing, when a disk-form optical information recording medium is used for example, the minor axis direction of an oval beam is brought substantially into line with the circumferential direction, and by rotating the disk, scanning is carried out in the minor axis direction, while moving the beam in the major axis (radial) direction every full circle (one rotation), whereby initialization can be carried out over the entire surface. By doing this, a polycrystalline structure aligned in a specific direction relative to the focused laser beam for recording/retrieving scanned along the track in the circumferential direction can be realized.

The moving distance in the radial direction per one revolution is preferably set to be shorter than the major axis of the beam, so that the irradiated regions overlap, and the same radial position will be irradiated a plurality of times with the laser beam. As a result, initialization can certainly be carried out, and at the same time, it is possible to avoid non-uniformity of the initial crystallization state attributable to the energy distribution (usually from 10 to 20%) in the radial direction of the beam. On the other hand, if the moving distance is too short, undesirable crystalline phases tend to be formed. Accordingly, the moving distance in the radial direction is usually set to be at least ½ of the major axis of the beam. Further, the scanning speed of the initialization energy beam is usually within a range of from 3 to 20 m/s.

Whether or not at least the optical information recording medium of the present invention can be obtained by melt initialization can be judged by determining whether or not the reflectivity R1 in the non-recorded state after initialization is substantially equal to the reflectivity R2 in the erased state by recrystallization after recording of amorphous marks is carried out by a practical focused laser beam for recording (for example, a focused laser beam having a diameter of the beam of about 1 μm). Here, R2 is the reflectivity at the erased portion after recording 10 times.

Accordingly, the optical information recording medium of the present invention preferably satisfies the following relational expression (3) where the reflectivity at the non-recorded portion after initial crystallization is R1 and the reflectivity at the erased portion after recording 10 times is R2:

$$\Delta R = 2|R1-R2|/(R1+R2) \times 100(\%) \leq 10 \quad (3)$$

The reason why the reflectivity R2 at the erased portion after recording 10 times is taken as the judgment index is that when recording is carried out 10 times, the influence of the reflectivity in a crystalline state which may remain in a non-recorded state if recording is carried out only once, can be removed, and the entire surface of the optical information recording medium can be made to be in a state where it is recrystallized by recording and erasing at least once. On the other hand, if the number of recording is excessively higher than 10 times, factors other than the change in the crystalline structure of the recording layer, such as microscopic deformation of the recording layer due to the repeated recording or diffusion of a foreign element from the protective layer to the recording layer may cause a change in the reflectivity, and accordingly it tends to be difficult to judge whether or not the desired crystalline state can be obtained.

In the above relational expression (3), $\Delta R$ is at most 10%, and it is preferably at most 5%. When it is at most 5%, an optical information recording medium having lower signal noises can be obtained.

For example, of an optical information recording medium with R1 of about 17%, R2 may be substantially within a range of from 16 to 18%.

The above erased state may also be obtained by irradiation with the writing power in a direct current fashion to melt the recording layer, followed by resolidification, without necessarily modulating the focused recording laser beam in accordance with a practical recording pulse-generating method.

In order to obtain the desired initial crystalline state of the phase-change recording material to be used for the recording layer in the present invention, it is particularly important to set the scanning speed of the initialization energy beam relative to the recording layer plane. Basically, it is important that the crystalline state after initial crystallization is similar to the crystalline state at the erased portion after recording, and accordingly, the scanning speed is preferably in the vicinity of the relative scanning linear velocity of the focused laser beam to the recording layer face when practical recording is carried out by using a focused laser beam. Specifically, the initialization energy beam is scanned at a linear velocity of from about 20 to about 80% of the maximum linear velocity when recording is carried out on the optical information recording medium.

The maximum linear velocity for recording is, for example, a linear velocity when the erase ratio becomes at least 20 dB at the time of irradiation with an erasing power Pe in a direct current fashion at that linear velocity.

The erase ratio is defined as the difference between the carrier level of signals of the amorphous marks recorded substantially at a single frequency and the carrier level after erasing by direct current irradiation of Pe. Measurement of the erase ratio is carried out as follows for example. Firstly, under recording conditions under which adequate signal characteristics (i.e. such characteristics that e.g. the reflectivity and the signal amplitude or the jitter satisfy specified values) are obtained, a condition with a high frequency is selected among modified signals to be recorded, recording is carried out 10 times at a single frequency to form amorphous marks, and the carrier level (C.L. at recording) is measured. Then, the direct current irradiation is carried out once on the amorphous marks while changing the erasing power Pe, and the carrier level at this time (C.L. after erasing) is measured, to calculate the difference between C.L. at recording and C.L. after erasing, i.e. the erase ratio. When the power Pe of the direct current irradiation is changed, the erase ratio tends to increase once, decrease and then increase again in general. Here, the first peak value of the erase ratio observed when the power Pe starts being increased is taken as the erase ratio of the sample in this case.

With respect to the scanning speed of the initialization energy beam, if the initialization energy beam is scanned at a speed lower than about 20% of the above defined maximum linear velocity, phase separation may occur and a single phase is less likely to be obtained, or even if a single phase is obtained, crystallites may grow particularly in the initialization beam scanning direction and become giant, or aligned in an unfavorable direction. Preferably, the initialization energy beam is scanned at a speed of at least 30% of the recordable maximum linear velocity.

On the other hand, if the initialization energy beam is scanned in a speed equal to the recordable maximum linear velocity i.e. at a rate higher than about 80% of that, a region once melted by the initial scanning tends to be formed into an amorphous state again, such being unfavorable. This is because when the scanning linear velocity is high, the cooling rate of the melted portion tends to be high, and the time for resolidification tends to be short. With a focused recording laser beam having a diameter of about 1 micron, recrystallization by crystal growth from the crystalline region at the periphery of the melted region can be completed in a short time. However, in a case where scanning is carried out with an initialization oval laser beam, the melted region area in the major axis direction tends to be large, and accordingly it is necessary that recrystallization during resolidification is carried out over the entire melted region by lowering the scanning linear velocity than that at the time of practical recording. From such a viewpoint, the scanning linear velocity of the initial energy beam is preferably at most 70% of the recording maximum linear velocity, more preferably at most 60%, most preferably lower than 50%.

The optical information recording medium of the present invention has such characteristics that when initial crystallization is carried out by irradiation with a laser beam, it is possible to increase the moving speed of the medium relative to the laser beam. This makes it possible to carry out initial crystallization in a short time, and is preferred in view of improvement of the productivity and the cost reduction.

(Recording and Retrieving Method of Optical Information Recording Medium)

The recording/retrieving laser beam to be used for the optical information recording medium of the present invention is usually a laser beam such as a semiconductor laser or a gas laser, and its wavelength is usually from 300 to 800 nm, preferably from about 350 to about 800 nm. Particularly, in order to achieve a high areal density of at least 1 Gbit/inch$^2$, the focused laser beam diameter is required to be small, and it is desirable to obtain a focused laser beam by using a blue to red laser beam having a wavelength of from 350 to 680 nm and an object lens having a numerical aperture NA of at least 0.5.

In the present invention, as mentioned above, it is preferred that the amorphous state corresponds to recording marks. Further, in the present invention, it is effective to record information by the mark length modulation system. This is particularly remarkable at the time of the mark length recording with a shortest mark length of at most 4 μm, particularly at most 1 μm.

When the recording mark is formed, recording may be carried out by a conventional system of modulating the writing power into two levels of a high level (writing power) and a low level (erasing power), however, in the present invention, it is particularly preferred to employ a recording method by a system of modulating the writing power into at least three levels, e.g. by providing an off-pulse, the power in which is adequately lower than the erasing power when the recording mark is formed as follows.

FIG. 2 is schematic views illustrating the power pattern of the recording laser beam in the recording method of an optical information recording medium. When an amorphous mark which is mark length-modulated into a length nT (wherein T is the reference clock period, and n is the mark length possible in the mark length modulation recording and is an integer), the amorphous mark is divided into m=n−k (provided that k is an integer of at least 0) recording pulses, each recording pulse width is $\alpha_i T$ ($1 \leq i \leq m$), and an off-pulse (cooling pulse) section with a time of $\beta_i T$ ($1 \leq i \leq m$) accompanies each recording pulse. With respect to the divided recording pulse in FIG. 2, description of the reference clock period T is omitted in view of understandability of the figure. Namely, in FIG. 2, a part which should be described as $\alpha_i T$ is described simply as $\alpha_i$ for example. Here, it is preferred that $\alpha_i \beta_i$, or $\alpha_i \leq \beta_{i-1}$ ($2 \leq i \leq m$ or m−1). $\in \alpha_i + \in \beta_i$ is usually n, but it may be $\in \alpha_i + \in \beta_i = n + j$ (j is a constant which satisfies $-2 \leq j \leq 2$) so as to obtain an accurate nT mark.

At the time of recording, irradiation with a recording laser beam with an erasing power Pe which may crystallize the amorphous state is carried out between marks. Further, at $\alpha_i T$ (i=1 to m), irradiation with a recording laser beam with a writing power Pw sufficient to melt the recording layer is carried out, and at a time $\beta_i T$ ($1 \leq i \leq m-1$), irradiation with the recording laser beam with a bias power (cooling power, off-pulse power) Pb which satisfies Pb<Pe, preferably Pb≦(½)Pe is carried out.

The power Pb of the recording laser beam irradiated in a time with a period $\beta_m T$ is usually Pb<Pe, preferably Pb≦½Pe, similar to the period $\beta_i T$ ($1 \leq i \leq m-1$), but it may be Pb≦Pe.

By employing the above recording method, the power margin or the recording linear velocity margin can be widened. This effect is particularly remarkable when the bias power Pb is set to be adequately low so that Pb≦½Pe.

In FIG. 2, the switching period $(\alpha_i + \beta_i)T$ or $(\beta_{i-1} + \alpha_i)T$ of the recording pulse (section $\alpha_i T$) and the off-pulse (section $\beta_i T$) is set to be substantially the same as T, that is, $(\alpha_i + \beta_i)$ or $(\beta_{i-1} + \alpha_i)$ is set to be substantially 1. However, it is possible to set the switching period to be is larger than 1T, and particularly, it is possible to set it to be 2T or 3T.

The above recording system is a system particularly suitable for an optical information recording medium wherein the phase-change recording material of the present invention is used for the recording layer. In the phase-change recording material of the present invention, as described above, the number of crystal nuclei in the amorphous marks is small, and recrystallization (erasure of the amorphous marks) is carried out mainly by the crystal growth from the crystalline region at the periphery of the amorphous marks. Accordingly, in high linear velocity recording, the crystallization speed is increased by increasing the crystal growth rate. This is one of the characteristics of the phase-change recording material of the present invention containing Sb as the main component, and particularly, the crystal growth rate can be selectively increased by increasing the Sb amount and decreasing Ge and Te. Such a composition adjustment promotes recrystallization of the amorphous marks from the peripheral crystalline portion and at the same time, increases the crystal growth rate at the time of melting and resolidification. If the recrystallization speed from the periphery of the amorphous mark is increased above a certain level, recrystallization from the peripheral portion of the melted region proceeds at the time of resolidification of the melted region formed for amorphous mark recording. Accordingly, the region which is originally to be formed into an amorphous phase tends to be recrystallized without being formed into an amorphous phase. Accordingly, it is important to set the bias power Pb to be adequately low, or to adequately secure the cooling section by making $\alpha_i \leq \beta_i$ or $\alpha_i \leq \beta_{i-1}$ ($2 \leq i \leq m$ or $m-1$).

Further, if the linear velocity at the time of recording increases, the clock period is shortened, whereby the off-pulse section is shortened, and the cooling effect tends to be impaired. In such a case, it is effective to divide the recording pulse at the time of nT mark recording, to set the cooling section by the off-pulse to be at least 1 nsec, more preferably at least 5 nsec by the real time.

[2-2] Application of Information Recording Medium of the Present Invention Other than Optical Information Recording Medium The information recording medium of the present invention can be used as an optical information recording medium, since reversible phase-change recording at least by irradiation with laser beam is possible, as described above. However, the rewritable information recording medium used in the present invention can be applied, for example, to phase-change recording by applying an electric current to a microscopic region. Explanation will be made below with respect to this point.

FIG. 3 is a schematic view illustrating the temperature history (curve a) at the time of amorphous mark recording, and the temperature history (curve b) at the time of erasing by recrystallization. At the time of recording, the temperature of the recording layer is increased to at least the melting point Tm in a short time by heating with an electric current at a high voltage and with a short pulse or a high power level laser beam, and after the electric current pulse or laser beam irradiation is turned off, the recording layer is rapidly cooled by heat dissipation to the periphery, and formed into an amorphous phase. When the cooling rate of the temperature at the time $\tau_0$ from the melting point Tm to the crystallization temperature Tg is higher than the critical cooling rate for formation of an amorphous phase, the recording layer is formed into an amorphous phase. On the other hand, at the time of erasing, the recording layer is heated to at least the crystallization temperature Tg and at most about the melting point Tm, by application of a relatively low voltage or irradiation with a laser energy at a low power level, and maintained for at least a certain time, whereby recrystallization of the amorphous marks proceeds in a substantially solid phase state. Namely, if the holding time $\tau_1$ is adequate, the crystallization will be completed.

Here, regardless of the state of the recording layer before application of the energy for recording or erasing, the recording layer is formed into an amorphous phase when the temperature history of the curve a is imparted to the recording layer, and the recording layer is crystallized when the temperature history of the curve b is imparted to the recording layer.

The reason why the rewritable information recording medium of the present invention may be used for phase-change recording by applying an electric current to the microscopic region, not only as an optical information recording medium, is as follows. Namely, it is the temperature history as shown in FIG. 3 that causes a reversible phase change, and the energy source which causes such a temperature history may be either a focused laser beam or an electric current heating (Joule heat by conducting).

The change in the resistivity accompanying the phase change between the crystalline phase and the amorphous phase of the phase-change recording material used in the present invention, is adequately equal to the change in the resistivity by at least two orders of magnitude, as obtained by a GeTe—$Sb_2Te_3$ pseudo binary alloy which is being developed as a non-volatile memory at present, particularly a $Ge_2Sb_2Te_5$ stoichiometrical composition alloy (J. Appl. Phys., vol. 87, pages 4130 to 4133, 2000). In fact, when the resistivity in an amorphous state in an as-deposited state, and the resistivity after crystallization by annealing, of a rewritable information recording medium using a phase-change recording material containing a composition represented by the above formula (1) as the main component, were respectively measured, whereupon changes by at least three orders of magnitude were confirmed. It is considered that the amorphous and crystalline states obtained by formation into an amorphous phase and the crystallization by current pulses are slightly different from the above amorphous state in an as-deposited state and the above crystalline state by annealing, respectively. However, it is expected that also in a case where the phase-change recording material used in the present invention is subjected to phase change by current pulses, a large change in the resistivity by a level of two orders of magnitude can adequately occur, since the above change in the resistivity by at least three orders of magnitude can be obtained.

FIG. 4 is a cross-sectional view illustrating the structure of one cell of such a non-volatile memory. In FIG. 4, a voltage is applied between an upper electrode 1 and a lower electrode 2, and an electric current is applied to a phase-change recording layer 3 containing a phase-change recording material (hereinafter sometimes referred to simply as a phase-change recording layer 3) and a heater portion 4. The phase-change recording layer 3 is covered with an insulant 10 such as $SiO_2$. Further, the phase-change recording layer 3 is crystallized in the initial state. In this case, initial crystallization is carried out by heating the entire system of FIG. 4 to the crystallization temperature (usually from about 100 to about 300° C.) of the recording layer. In formation of an integrated circuit, the temperature increase to such an extent is commonly carried out.

In FIG. 4, a particularly narrow portion 4 (heater portion) functions as a local heater, since heat is likely to generate by the Joule heat by application of an electric current between the upper electrode 1 and the lower electrode 2. A reversibly changeable portion 5 adjacent thereto is locally heated and formed into an amorphous phase via the temperature history as shown by the curve a in FIG. 3, and recrystallized via the temperature history as shown by the curve b in FIG. 3.

As the reading, a low electric current is applied to such an extent that the heat generation at the heater portion 4 can be ignored, and the voltage difference between the upper and lower electrodes is read. Here, there is also a difference in the electric capacity between the crystalline and amorphous states, and accordingly the difference in the electric capacity may be detected.

Practically, a further integrated memory has been proposed by employing a semiconductor integrated circuit formation technology (U.S. Pat. No. 6,314,014), however, its basic structure is as shown in FIG. 4, and when the phase-change recording material used in the present invention is incorporated in the phase-change recording layer 3, the same function can be realized.

Here, as the energy source which causes the temperature change as shown in FIG. 3, an electron beam may also be mentioned. As an example of a recording device employing an electron beam, a method wherein a phase-change recording material is locally irradiated with an electron beam radiated by a field emitter to cause a phase change, as disclosed in U.S. Pat. No. 5,557,596 may be mentioned.

The present invention is not limited to the above embodiments. The above embodiments are examples, and any one having substantially the same structure as the technical idea as disclosed in the scope of the present invention and having the same effects is included in the present invention.

EXAMPLES

Now, the present invention will be explained with reference to Examples wherein the phase-change recording material to be used in the present invention is applied to an optical information recording medium. However, the present invention is by no means restricted to the application to an optical information recording medium within a range not to exceed the gist of the present invention.

In the following Examples, an optical information recording medium may be referred to simply as "a disk", "an optical disk", "a phase-change type optical disk" etc. in some cases.

Examples 1 to 6 and Comparative Examples 1 to 4

For measurement of the composition of the phase-change recording material used for the recording layer of an optical information recording medium, an acid dissolution ICP-AES (Inductively Coupled Plasma-Atomic Emission Spectrometry) and a fluorescent X-ray analyzer were used. With respect to the acid dissolution ICP-AES, JY 38 S manufactured by JOBIN YVON was used as an analyzer, and the recording layer was dissolved in dil-$HNO_3$ and quantitative determination was carried out by a matrix matching calibration method. As the fluorescent X-ray analyzer, RIX3001 manufactured by Rigaku Denki Kogyo K.K. was used.

Measurement of the disk characteristics was carried out by means of DDU1000 manufactured by Pulstec. Industrial Co., Ltd., by applying focusing servo and tracking servo to the groove at a retrieving power of 0.8 mW. This apparatus is an optical disk tester having a pickup with NA of 0.5 and a laser wavelength of 780 nm.

On a disk-shape polycarbonate substrate having a diameter of 120 mm and a thickness of 1.2 mm, having guide grooves with a groove width of 0.5 µm, a groove depth of 40 nm and a groove pitch of 1.6 µm, first to fifth layers were formed in order by a sputtering method as follows. The first layer is a $(ZnS)_{80}(SiO_2)_{20}$ protective layer, the second layer is a Ge—In—Sb—Sn—Te recording layer, the third layer is a $(ZnS)_{80}(SiO_2)_{20}$ protective layer, the fourth layer is a Ta or GeN interfacial layer, and the fifth layer is a Ag reflective layer (200 nm). The fourth layer is a thin interfacial layer to prevent diffusion of S into the Ag reflective layer, and there is substantially no difference in the disk characteristics whether Ta or GeN is employed. A protective layer comprising an ultraviolet-curing resin was further formed on these layers to prepare a phase-change type optical disk. The film thicknesses of the respective layers and the values x, y, z and w when the recording layer composition is represented by $Ge_x(In_wSn_{1-w})_yTe_zSb_{1-x-y-z}$ are shown in Table 2. For the fourth layer, GeN was employed only for the disks of Comparative Examples 2 and 3, and Ta was employed for the other disks. The respective disks have slightly different film thicknesses of the respective layers since the reflectivity, the signal amplitude, the recording sensitivity, the repeated recording durability etc. were adjusted, however, it is considered that the differences do not have significant influences over the experimental results. Further, other than the disks of Comparative Examples 1 and 4 on which the initial crystallization or erasure of the recording could not favorably be carried out, the recording layer composition was adjusted to obtain a crystallization speed suitable for the recording conditions as mentioned hereinafter.

Initial crystallization was tried on each of these disks as follows.

As a laser beam for initial crystallization, a laser beam having a wavelength of 810 nm and a power of 800 mW and having a shape with a width of about 1 µm and a length of about 75 µm was employed. While rotating the disk at 12 m/s, the disk was irradiated with the above laser beam so that the major axis of the laser beam was perpendicular to the guide grooves formed on the above substrate. Further, the laser beam was continuously moved in a radius direction of the disk with a feed amount of 50 µm per rotation of the disk to try initial crystallization.

Uniform initial crystallization could be achieved on the disks other than the disk of Comparative Example 4. However, crystallization could not be achieved on the disk of Comparative Example 4 under the above conditions. Initial crystallization was tried similarly at a linear velocity of 2 m/s at a laser power of from 400 mW to 1000 mW, however, no uniform crystalline state could be obtained. It is considered to be because the crystallization speed was too slow. Accordingly, it is considered that use of the disk of Comparative Example 4 as a phase-change optical disk is substantially difficult.

Although initial crystallization could be achieved on the disk of Comparative Example 1, the reflectivity was so low as about 11%. There was no change in the reflectivity even after recording and erasing were carried out about 10 times. When the value of y-z is small, the reflectivity and the signal amplitude are small, and the use as the phase-change optical disk is difficult. Also in a case where a part of or the entire Sn is replaced by In, the relation between the value y-z and the reflectivity shows the similar tendency.

Each disk was subjected to an environment resistance test (accelerated test) of holding it in an environment of 105° C. for 3 hours, and the crystalline state reflectivity was measured before and after the test. The accelerated test is considered to correspond to a long term storage of the medium. The results are shown in Table 2. The reflectivity tends to decrease by the accelerated test with respect to every disk, however, the degree of the decrease varies depend on the disks. It is found that the degree of the decrease in the reflectivity by the accelerated test is correlated with ((In content)−(Te content)) i.e. the value wxy-z. The rate of decrease in the reflectivity by the accelerated test (shown in the section "rate of decrease in reflectivity after accelerated test" in Table 2) is defined by ((reflectivity before the accelerated test)−(reflectivity after the accelerated test))/(reflectivity before the accelerated test), and wxy-z is required to be at most about 0.1 if the rate of decrease is to be suppressed lower than about 0.15. Needless to say, the rate of decrease is preferably as low as possible.

On each of the disks of Examples 1 to 6, before the above accelerated test was carried out, EFM random signals were recorded at a linear velocity of 28.8 m/s as mentioned hereinafter by means of the above optical disk tester, and then the above accelerated test was carried out, to measure the disk characteristics as mentioned hereinafter before and after the accelerated test. The pulse strategy, and the writing power Pw and the erasing power Pe were selected so that the jitter characteristics would be as good as possible on each disk.

On each of the disks of Examples 1 to 5, recording was carried out as follows. Marks with lengths of from 3T to 11T (T is a reference clock period and is 9.6 nsec) contained in the EFM signal were formed by irradiation with pulse rows of the following laser pulses in series.

3T: A pulse with a power Pw and a length 1.4T, a pulse with a power Pb and a length 0.85T. 4T: A pulse with a power Pw and a length 1T, a pulse with a power Pb and a length 1.1T, a pulse with a power Pw and a length 0.9T, a pulse with a power Pb and a length 0.4T.

5T: A pulse with a power Pw and a length 1T, a pulse with a power Pb and a length 1.45T, a pulse with a power Pw and a length 1.4T, a pulse with a power Pb and a length 0.4T.

6T: A pulse with a power Pw and a length 1T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 0.4T.

7T: A pulse with a power Pw and a length 1T, a pulse with a power Pb and a length 1.1T, a pulse with a power Pw and a length 0.9T, a pulse with a power Pb and a length 1.45T, a pulse with a power Pw and a length 1.4T, a pulse with a power Pb and a length 0.4T.

8T: A pulse with a power Pw and a length 1T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 0.4T.

9T: A pulse with a power Pw and a length 1T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 1.45T, a pulse with a power Pw and a length 1.4T, a pulse with a power Pb and a length 0.4T.

10T: A pulse with a power Pw and a length 1T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 0.4T.

11T: A pulse with a power Pw and a length 1T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 1.45T, a pulse with a power Pw and a length 1.4T, a pulse with a power Pb and a length 0.4T.

Between the pulse rows for mark formation, irradiation with an erasing power Pe was carried out, and Pb=0.8 mW. The writing power Pw and the erasing power Pe are shown in Table 2. Overwriting was carried out ten times.

On the disk of Example 6, recording was carried out as follows. Marks with lengths of from 3T to 11T (T is a reference clock period and is 9.6 nsec) contained in the EFM signal were formed by irradiation with pulse rows of the following laser pulses in series.

3T: A pulse with a power Pw and a length 1.8T, a pulse with a power Pb and a length 1.1T.

4T: A pulse with a power Pw and a length 1T, a pulse with a power Pb and a length 1.1T, a pulse with a power Pw and a length 0.9T, a pulse with a power Pb and a length 0.4T.

5T: A pulse with a power Pw and a length 1T, a pulse with a power Pb and a length 1.45T, a pulse with a power Pw and a length 1.4T, a pulse with a power Pb and a length 0.4T.

6T: A pulse with a power Pw and a length 1T, a pulse with a power Pb and a length 1.1T, a pulse with a power Pw and a length 0.9T, a pulse with a power Pb and a length 1T, a pulse with a power Pw and a length 0.9T, a pulse with a power Pb and a length 0.4T.

7T: A pulse with a power Pw and a length 1T, a pulse with a power Pb and a length 1.1T, a pulse with a power Pw and a length 0.9T, a pulse with a power Pb and a length 1.45T, a pulse with a power Pw and a length 1.4T, a pulse with a power Pb and a length 0.4T.

8T: A pulse with a power Pw and a length 1T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 1T, a pulse with a power Pw and a length 0.9T, a pulse with a power Pb and a length 0.4T.

9T: A pulse with a power Pw and a length 1T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 1.45T, a pulse with a power Pw and a length 1.4T, a pulse with a power Pb and a length 0.4T.

10T: A pulse with a power Pw and a length 1T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 1T, a pulse with a power Pw and a length 0.9T, a pulse with a power Pb and a length 0.4T.

11T: A pulse with a power Pw and a length 1T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 1.1T, a pulse with a power Pw and a length 0.9T, a pulse with a power Pb and a length 1.45T, a pulse with a power Pw and a length 1.4T, a pulse with a power Pb and a length 0.4T.

Between the pulse rows for mark formation, irradiation with an erasing power Pe was carried out, and Pb=0.8 mW. The writing power Pw and the erasing power Pe are shown in Table 2. Further, the position of the irradiation with 3T mark formation pulses was shifted forward (the irradiation time was adversed from the original) by 0.2T from the original starting position of the 3T mark length signal in the EFM random signal, and the position of irradiation with 4T mark formation pulses was shifted forward by 0.05T from the original starting position of the 4T mark length signal in the EFM random signal. By doing this, the marks to be formed are close to the original random signals. Overwriting was carried out ten times.

The recorded portion of each disk was retrieved at a linear velocity of 1.2 m/s to evaluate the characteristics of the recording signals. The evaluated items were the jitter of 3T spaces and the crystalline state reflectivity. The results are shown in Table 2. As the jitter of 3T spaces, a value of at most 40 ns could be obtained, and this characteristic is good enough for practical application. Particularly, with the disks of Examples 1 to 5, a value of at most 30 ns could be obtained, such being favorable. The disk of Example 6 is slightly poor in the jitter characteristics, and this is considered to be because the Sn content is high.

Each of the disks was subjected to the above accelerated test, and then the portion recorded before the accelerated test was retrieved to measure the jitter of 3T spaces again. The results are shown in Table 2. On every disk, as the jitter of 3T spaces, a value of at most 40 ns could be obtained, and this characteristic is good enough for practical application. Particularly, on the disks of Examples 1, 2, 4 and 5, a value of at most 30 ns could be obtained, such being favorable. On these disks, the amorphous marks are adequately stable. On the disk of Example 3, deterioration of the jitter value by the accelerated test was slightly observed. In the waveform observation by an oscilloscope, it is considered that crystallization of the 3T mark was in progress. The amorphous marks are particularly stable when Ge is contained.

Then, an operation to erase the signals recorded before the accelerated test, was carried out after the accelerated test, and whether or not insufficiently erased marks are present, was confirmed by observation by oscilloscope. In a case where unerased marks are shown, there is a fear that the signal quality when overwriting is carried out after the recorded medium is stored for a long term, may not be adequately excellent. The erasure operation is to irradiate each disk with a DC light with an erasing power Pe as shown in Table 2 once. As a result, on the disks of Examples 4 and 5, unerased marks were observed, whereas on the disks of Examples 1, 2 and 3, favorable erasure condition was observed. It is considered that the excellent erasure is achieved since the Ge content is low.

TABLE 2

| | Composition | | | | | | Composition (reference) | | | | |
|---|---|---|---|---|---|---|---|---|---|---|---|
| | X | y | z | w | y-z | wy-z | Ge | In | Sb | Sn | Te |
| Ex. 1 | 0.047 | 0.313 | 0.139 | 0.323 | 0.174 | −0.0379 | 0.047 | 0.101099 | 0.501 | 0.211901 | 0.139 |
| Ex. 2 | 0.027 | 0.302 | 0.156 | 0.394 | 0.146 | −0.03701 | 0.027 | 0.118988 | 0.515 | 0.183012 | 0.156 |
| Ex. 3 | 0 | 0.252 | 0.113 | 0.635 | 0.139 | 0.04702 | 0 | 0.16002 | 0.635 | 0.09198 | 0.113 |
| Ex. 4 | 0.106 | 0.204 | 0.049 | 0.5 | 0.155 | 0.053 | 0.106 | 0.102 | 0.641 | 0.102 | 0.049 |
| Ex. 5 | 0.124 | 0.243 | 0.049 | 0 | 0.194 | −0.049 | 0.124 | 0 | 0.584 | 0.243 | 0.049 |
| Ex. 6 | 0.121 | 0.328 | 0.132 | 0 | 0.196 | −0.132 | 0.121 | 0 | 0.419 | 0.328 | 0.132 |
| Comp. Ex. 1 | 0.124 | 0.168 | 0.134 | 0 | 0.034 | −0.134 | 0.124 | 0 | 0.574 | 0.168 | 0.134 |
| Comp. Ex. 2 | 0.061 | 0.178 | 0.052 | 1 | 0.126 | 0.126 | 0.061 | 0.178 | 0.709 | 0 | 0.052 |
| Comp. Ex. 3 | 0.011 | 0.254 | 0.067 | 1 | 0.187 | 0.187 | 0.011 | 0.254 | 0.668 | 0 | 0.067 |
| Comp. Ex. 4 | 0.318 | 0.279 | 0.047 | 0 | 0.232 | −0.047 | 0.318 | 0 | 0.356 | 0.279 | 0.047 |
| Comp. Ex. 5 | 0.174 | 0.26 | 0 | 0 | 0.26 | 0 | 0.174 | 0 | 0.566 | 0.26 | 0 |
| Ref. Ex. 1 | 0.004 | 0.347 | 0.021 | 0.357 | 0.326 | 0.102879 | 0.004 | 0.123879 | 0.628 | 0.223121 | 0.021 |

| | Crystalline state reflectivity | | Rate of decrease in reflectivity after accelerated test | Power (mW) Pe/Pw | Jitter characteristics (ns) | | Mark erasure after accelerated test | Note |
|---|---|---|---|---|---|---|---|---|
| | Before accelerated test | After accelerated test | | | Before accelerated test | After accelerated test | | |
| Ex. 1 | 0.222 | 0.213 | 0.0405 | 9.2/34 mW | 25.4 | 24.8 | Excellent | |
| Ex. 2 | 0.198 | 0.189 | 0.0455 | 9.2/34 mW | 25 | 27.7 | Excellent | |
| Ex. 3 | 0.194 | 0.18 | 0.0722 | 9.8/36 mW | 28 | 33.6 | Excellent | Mark stability is slightly poor |
| Ex. 4 | 0.223 | 0.2 | 0.1031 | 9.2/34 mW | 24.6 | 24.3 | Unerased marks observed | |
| Ex. 5 | 0.22 | 0.216 | 0.0182 | 9.2/34 mW | 24.5 | 22.9 | Unerased marks observed | |
| Ex. 6 | 0.212 | 0.205 | 0.0330 | 9.5/30 mW | 36.8 | 35.8 | — | Jitter tends to deteriorate when Sn amount is large |
| Comp. Ex. 1 | 0.108 | — | — | — | — | — | — | Reflectivity is low |
| Comp. Ex. 2 | 0.19 | 0.16 | 0.1579 | — | — | — | — | Reflectivity decreases by accelerated test |
| Comp. Ex. 3 | 0.214 | 0.162 | 0.2430 | — | — | — | — | Reflectivity decreases by accelerated test |
| Comp. Ex. 4 | — | — | — | — | — | — | — | Uniform initialization impossible |

TABLE 2-continued

| | | | | | | |
|---|---|---|---|---|---|---|
| Comp. Ex. 5 | — | — | — | — | — | — | Repeated recording durability is poor |
| Ref. Ex. 1 | 0.278 | 0.234 | 0.1583 | — | — | — | Reflectivity tends to decrease by accelerated test |

| | Film thickness (nm) | | | | |
|---|---|---|---|---|---|
| | First layer | Second layer | Third layer | Fourth layer | Fifth layer |
| Ex. 1 | 80 nm | 16 nm | 20 nm | 2 nm | 200 nm |
| Ex. 2 | 80 nm | 16 nm | 20 nm | 2 nm | 200 nm |
| Ex. 3 | 80 nm | 16 nm | 20 nm | 2 nm | 200 nm |
| Ex. 4 | 85 nm | 18 nm | 23 nm | 2 nm | 200 nm |
| Ex. 5 | 80 nm | 16 nm | 23 nm | 2 nm | 200 nm |
| Ex. 6 | 80 nm | 16 nm | 20 nm | 2 nm | 200 nm |
| Comp. Ex. 1 | 80 nm | 16 nm | 20 nm | 2 nm | 200 nm |
| Comp. Ex. 2 | 80 nm | 18 nm | 27 nm | 3 nm | 200 nm |
| Comp. Ex. 3 | 90 nm | 16 nm | 27 nm | 3 nm | 200 nm |
| Comp. Ex. 4 | 80 nm | 16 nm | 20 nm | 2 nm | 200 nm |
| Comp. Ex. 5 | 80 nm | 15 nm | 17 nm | 3 nm | 200 nm |
| Ref. Ex. 1 | 80 nm | 16 nm | 20 nm | 2 nm | 200 nm |

The recorded portion of a disk substantially the same as that of Example 4 was observed by a transmission electron microscope (TEM), whereupon it was confirmed that amorphous state marks were recorded in the crystalline state. Accordingly, it is thought that amorphous state marks are recorded in the crystalline state on the disks of all Examples on which recording was carried out.

Comparative Example 5

A disk of Comparative Example 5 was prepared as follows.

On a disk-shape polycarbonate substrate having a diameter of 120 mm and a thickness of 1.2 mm and having guide grooves with a groove width of 0.5 μm, a groove depth of 40 nm and a groove pitch of 1.6 μm, first to fifth layers were formed in order by a sputtering method as follows. The first layer is a $(ZnS)_{80}(SiO_2)_{20}$ protective layer, the second layer is a recording layer, the third layer is a $(ZnS)_{80}(SiO_2)_{20}$ protective layer, the fourth layer is a GeN interfacial layer, and the fifth layer is a Ag reflective layer. A protective layer comprising an ultraviolet-curing resin was further formed on these layers to prepare a phase-change type optical disk. The film thicknesses of the respective layers and the values x, y, z and w when the recording layer composition is represented by $Ge_x(In_wSn_{1-w})_yTe_zSb_{1-x-y-z}$ are shown in Table 2. Then, initial crystallization under the same conditions as in Example 1 was carried out.

By means of a disk tester having a pickup with NA of 0.5 and a laser wavelength of 780 nm, of the disk of Example 1 and the disk of Comparative Example 5, the repeated overwriting durability was measured.

The conditions for evaluation of the repeated overwriting durability are as follows.

Namely, EFM random signals were recorded on each disk at a recording linear velocity of 28.8 m/s. The recording pulses employed for recording were the same as in Example 1, the writing power Pw was 33 mW, and the erasing power Pe was 9 mW.

Retrieving was carried out at a linear velocity of 1.2 m/s. The jitter of 3T spaces after overwriting ten times was 25.6 ns with respect to the disk of Example 1 and 27.1 ns with respect to the disk of Comparative Example 5. The jitter of 3T spaces after overwriting 2000 times was 32.1 ns with respect to the disk of Example 1 and 58.4 ns with respect to the disk of Comparative Example 5, and the disk of Comparative Example 5 was poor in the repeated recording durability.

The main cause of the jitter deterioration of the disk of Comparative Example 5 is considered to be a decrease in the crystallization speed due to the repeated overwriting, thus leading to incomplete erasure of the marks. On the other hand, of the disk of Example 1 containing Te, the decrease in the crystallization speed due to the repeated recording was suppressed.

Reference Example 1

A disk of Reference Example 1 was prepared as follows.

On a disk-shape polycarbonate substrate having a diameter of 120 mm and a thickness of 1.2 mm and having guide grooves with a groove width of 0.5 μm, a groove depth of 40 nm and a groove pitch of 1.6 μm, first to fifth layers were formed in order by a sputtering method as follows. The first layer is a $(ZnS)_{80}(SiO_2)_{20}$ protective layer, the second layer is a recording layer, the third layer is a $(ZnS)_{80}(SiO_2)_{20}$ protective layer, the fourth layer is a Ta interfacial layer, and the fifth layer is a Ag reflective layer. A protective layer comprising an ultraviolet-curing resin was further formed on these layers to prepare a phase-change type optical disk. The film thicknesses of the respective layers and the values x, y, z and w when the recording layer composition is represented by $Ge_x(In_wSn_{1-w})_yTe_zSb_{1-x-y-z}$ are shown in Table 2. Then, initial crystallization was carried out under the same conditions as in Example 1.

The disk of Reference Example 1 was subjected to an environment resistance test (accelerated test) of holding it in an environment of 105° C. for 3 hours, and the crystalline state reflectivity was measured before and after the test. The crystalline state reflectivities before and after the accelerated test were 27.8% and 23.4%, respectively. When the rate of decrease in the reflectivity by the accelerated test is defined as ((reflectivity before the accelerated test)−(reflectivity after the accelerated test))/(reflectivity before the accelerated test), the rate of decrease was 0.158.

Figure 7:
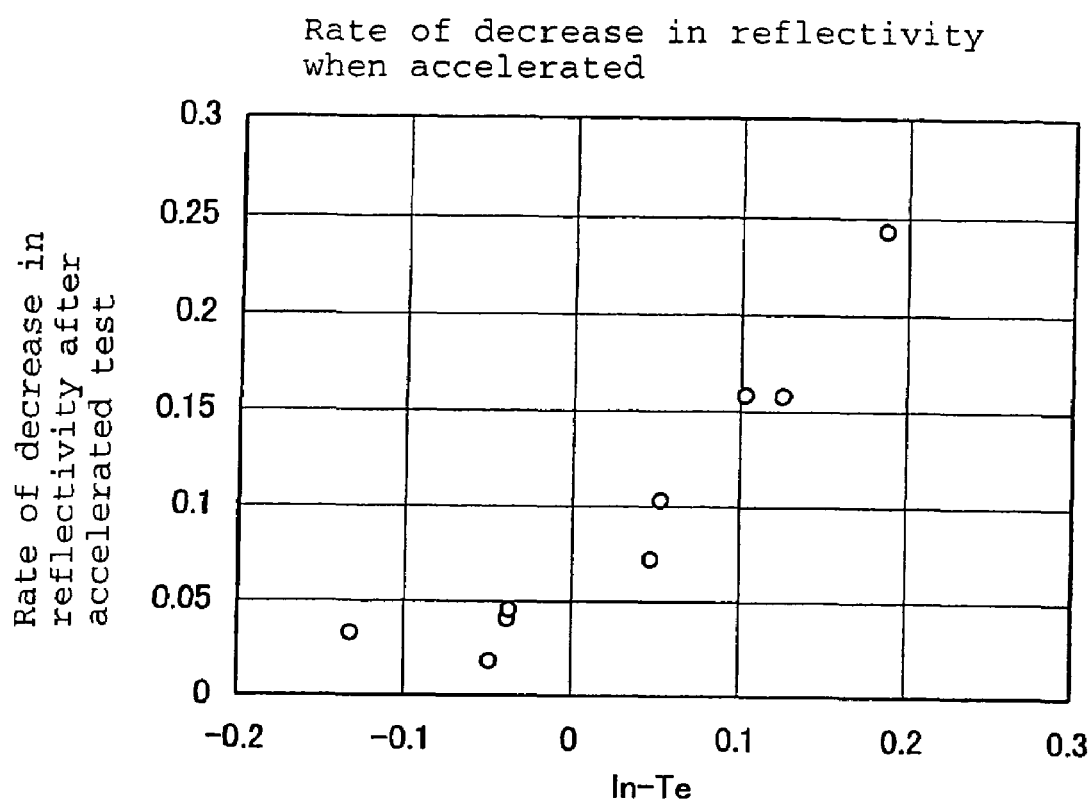
FIG. 7 is a graph illustrating the decrease in the reflectivity during acceleration relative to the amount of (In—Te).

A graph obtained by plotting the rate of decrease in the reflectivity after the accelerated test (a value defined by ((reflectivity before the accelerated test)−(reflectivity after the accelerated test))/(reflectivity before the accelerated test) and is a data shown in "rate of decrease in reflectivity after accelerated test" in Table 2) relative to the (In—Te) amount of the disks of Examples 1 to 6, Comparative Examples 2 and 3 and Reference Example 1, is shown in FIG. 7. It can be seen from FIG. 7 that the decrease in the reflectivity when accelerated is suppressed to be within 0.15 (15%) when In—Te$\leq$0.1 (10 atomic %).

Examples 7 to 12 and Comparative Example 6

A polycarbonate resin substrate having a thickness of 0.6 mm and a track pitch of 0.74 μm was formed by injection molding and employed for the following experimental examples. Of the grooves formed on the substrate, the groove width was about 0.31 μm and the groove depth was about 28 nm. The groove shape was obtained by an optical diffraction method of U-groove approximation by means of a He—Cd laser beam having a wavelength of 441.6 nm.

Then, on the substrate, a $(ZnS)_{80}(SiO_2)_{20}$ protective layer of 65 nm, a $Y_2O_2S$ layer of 2 nm, a $Ge_7In_6Sb_{56}Sn_{24}Te_7$ recording layer of 12 nm, a $Y_2O_2S$ layer of 2 nm, a $(ZnS)_{80}(SiO_2)_{20}$ protective layer of 12 nm, a Ta interfacial layer of 2 nm, a Ag reflective layer of 200 nm and an ultraviolet-curing resin layer of about 4 nm were formed in this order. The Ta layer is an interfacial layer to prevent diffusion of S into the Ag reflective layer.

Formation of the respective layers was carried out by sequential deposition by a sputtering method on the above substrate without breaking the vacuum. However, the ultraviolet-curing resin layer was coated by a spin coating method. Then, a similar substrate having a thickness of 0.6 mm on which no film was formed was bonded by means of an adhesive so that the above recording layer side faced the inside (Example 7).

Similarly, on the above substrate, a $(ZnS)_{80}(SiO_2)_{20}$ protective layer of 60 nm, a $Y_2O_2S$ layer of 2 nm, a $Ge_7In_6Sb_{56}Sn_{24}Te_7$ recording layer of 12 nm, a $Y_2O_2S$ layer of 14 nm, a Ta interfacial layer of 2 nm, a Ag reflective layer of 200 nm and an ultraviolet-curing resin layer of about 4 μm were formed in this order. The Ta layer is an interfacial layer to prevent diffusion of S into the Ag reflective layer.

Formation of the respective layers was carried out by sequential deposition by a sputtering method on the above substrate without breaking the vacuum. However, the ultraviolet-curing resin layer was coated by a spin coating method. Then, a similar substrate having a thickness of 0.6 mm on which no film was formed was bonded by means of an adhesive so that the above recording layer side faced inside (Example 8).

Similarly, on the above substrate, a $(ZnS)_{80}(SiO_2)_{20}$ protective layer of 70 nm, a $Ge_7In_6Sb_{56}Sn_{24}Te_7$ recording layer of 13 nm, a $(ZnS)_{80}(SiO_2)_{20}$ protective layer of 14 nm, a Ta interfacial layer of 2 nm, a Ag reflective layer of 200 nm and an ultraviolet-curing resin layer of about 4 μm were formed in this order. The Ta layer is an interfacial layer to prevent diffusion of S into the Ag reflective layer.

Formation of the respective layers was carried out by sequential deposition by a sputtering method on the above substrate without breaking the vacuum. However, the ultraviolet-curing resin layer was coated by a spin coating method. Then, a similar substrate having a thickness of 0.6 mm on which no film was formed was bonded by means of an adhesive so that the above recording layer side faced inside (Example 9).

Similarly, a disk employing a GeN layer instead of the $Y_2O_2S$ layer in Example 7 was prepared (Example 10).

Similarly, a disk employing a ZnO layer instead of the $Y_2O_2S$ layer in Example 7 was prepared (Example 11).

Similarly, a disk employing a $(ZnS)_{80}(CeO_2)_{20}$ layer instead of the $Y_2O_2S$ layer in Example 7 was prepared (Example 12).

Similarly, a disk employing a $Ge_5Sb_{72}Te_{23}$ layer instead of the $Ge_7In_6Sb_{56}Sn_{24}Te_7$ layer in Example 7 was prepared (Comparative Example 6).

With respect to the thickness of each layer, the deposition rate was estimated, and then the thickness was controlled by the sputtering time. The composition of the recording layer was determined by correcting the fluorescent intensities of the respective elements obtained by a fluorescent X-ray analysis by the absolute composition separately obtained by a chemical analysis (atomic absorption spectrometry).

Then, initial crystallization was carried out. As the laser beam for the initial crystallization, a laser beam having a wavelength of 810 nm and focused into an oval shape having a major axis of about 75 μm and a minor axis of about 1 μm was employed. While rotating the disk, the disk was irradiated with the above laser beam so that the major axis of the laser beam would be perpendicular to the guide grooves formed on the above substrate, and the above laser beam was continuously moved in a radius direction of the disk with a feed amount of 50 μm per rotation of the disk to carry out initial crystallization.

For the disks of Examples 7 and 9 to 12, the linear velocity was 30 m/s and the laser power was 1500 mW, for the disk of Example 8, the linear velocity was 30 m/s and the laser power was 1800 mW, and for the disk of Comparative Example 6, the linear velocity was 3 m/s and the laser power was 500 mW.

Recording/retrieving evaluation was carried out by means of DDU1000 tester manufactured by Pulstec. Industrial Co., Ltd. (wavelength: about 650 nm, NA=0.65, spot shape: a circular of about 0.86 μm with an intensity of $1/e^2$). On the basis of the reference linear velocity of 3.49 m/s of DVD being 1-time velocity, recording characteristics at 10-times velocity were evaluated.

The reference clock period of data at each linear velocity was one inversely proportionated at each linear velocity against the reference clock period of 38.2 nsec of data at 1-time velocity.

Unless otherwise specified, retrieving was carried out at 1-time velocity. The output signal from DDU1000 was passed through a high frequency-passing filter having a cutoff lies between 5 and 20 kHz, whereupon the jitter was measured by a time interval analyzer (manufactured by Yokogawa Electric Corporation). The retrieving power Pr was 0.6 mW.

Formation of a logic level to control the recording pulse division method was carried out by means of an optional signal generator (AWG710, manufactured by Sony Tektronix Co.). From the above signal generator, logic signals at ECL level were input as gate signals against a laser driver of the above tester.

EFM+ random data were overwritten 2000 times at a linear velocity of 10-times velocity on each of the disks of Examples 7 to 12, and the data to clock jitter (hereinafter one normalized by the reference clock period T and represented by a % value will be simply referred to as jitter) of the recorded data was measured.

The pulse rows for the respective mark length recording were set as follows. The laser irradiation time for recording a nT mark was divided in the order of $\alpha_1 T$, $\beta_1 T$, $\alpha_2 T$, $\beta_2 T$, ..., $\alpha_i T$, $\beta_i T$, ..., $\alpha_m T$, $\beta_m T$ (m is the pulse division number and T is the reference clock period), and in the time at $\beta_i T$ ($1 \leq i \leq m$), irradiation with a recording laser beam with a writing power Pw was carried out, and in the time at $\beta_i T$ ($1 \leq i \leq m$), irradiation with a recording laser beam with a bias power Pb was carried out. These values were selected so that favorable jitter value would be obtained on each disk, and they were as shown in Table 3 on the disks of Examples 7 and 9 to 12, and they were as shown in Table 4 on the disk of Example 8. for marks of some lengths, the timing of irradiation with the pulse row was delayed for a certain time from the original starting time of said mark length in the EFM+ signal, and this time was shown in the section "delay time". A case where the irradiation timing was delayed was represented by + and a case where it was advanced was represented by –. The value was normalized by the clock period T. The mark formed by providing the delay time is close to the ideal EFM+ random signal, and the jitter is excellent. At the space between marks (the portion other than the portion as disclosed in Table), irradiation with an erasing power Pe was carried out. For the disks of Examples 7 and 10 to 12, Pw was 23 mW, Pb was 0.5 mW and Pe was 6.6 mW. For the disk of Example 8, Pw was 28 mW, Pb was 0.5 mW and Pe was 8 mW. For the disk of Example 9, Pw was 23 mW, Pb was 0.5 mW and Pe was 6.2 mW. As the laser power, values which were considered to be optimum for the respective disks were selected.

Figure 8:
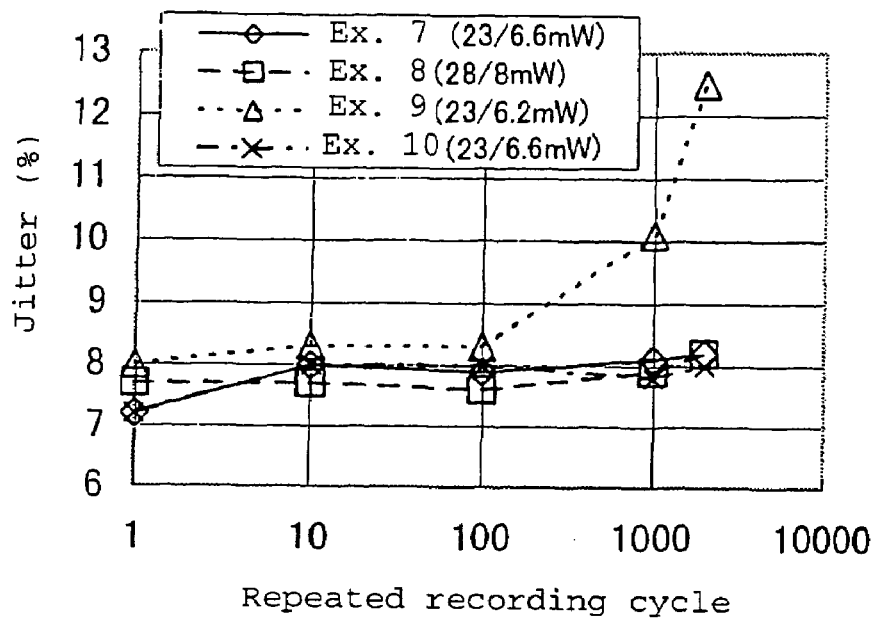
FIG. 8 illustrates the repeated overwriting characteristics of an optical information recording medium.

The results of the repeated durability test of the disks of Examples 7 to 10 are shown in FIG. 8. In FIG. 8, the horizontal axis illustrates the number of overwriting cycle. Actually, the first recording is recording on a disk in a non-recorded initial crystalline state, and the second and the subsequent recordings are overwriting (hereinafter the same applies in FIGS. 9, 10 and 12). In each Example, deterioration of the jitter is at most about 2% up to 1000 times, such being excellent. Of the disk of Example 9, the jitter value increased to 12.5% by overwriting 2000 times, however, of the disks of Examples 7 and 8, the jitter value was at most 10%, and deterioration by repeated recording was slight. Namely, when $Y_2O_2S$ is provided in contact with the Ge—In—Sb—Sn—Te type recording layer, the repeated recording durability tends to be significantly improved. Of the disk of Example 10 also, the jitter value after overwriting 2000 times was at most 10%, and the repeated recording durability was improved. On the other hand, the disks of Examples 11 and 12, which are not shown in FIG. 8, were inferior in the repeated recording durability to the disk of Example 9, however, they are stable during overwriting at least about several hundred times and are adequately practical. Further, it is possible to stabilize the jitter at least 1000 times by further optimizing the protective layer or the layer structure on these disks.

Then, the signal amplitude after overwriting 10 times of each of the disks of Examples 7 and 10 was measured. In either case, Pw was 23 mW, Pb was 0.5 mW and Pe was 6.6 mW. When the signal amplitude was defined as ((reflectivity at the space between marks)–(reflectivity at the 14T mark portion)), the values of the signal amplitude were 0.151 and 0.144 in Examples 7 and 10, respectively, and there was a difference. Namely, it is found that the signal amplitude is high and is excellent when $Y_2O_2S$ is employed than when GeN is employed, for the Ge—In—Sb—Sn—Te type recording layer. These values are obtained as a result of

TABLE 3

| Mark length | m | Delay time | α1 | β1 | α2 | β2 | α3 | β3 | α4 | β4 | α5 | β5 |
|---|---|---|---|---|---|---|---|---|---|---|---|---|
| 3T | 1 | −0.13 | 1.33 | 0.73 | | | | | | | | |
| 4T | 1 | 0.00 | 1.67 | 1.53 | | | | | | | | |
| 5T | 2 | −0.20 | 1.33 | 1.13 | 1.07 | 0.73 | | | | | | |
| 6T | 2 | −0.07 | 1.33 | 1.67 | 1.27 | 0.73 | | | | | | |
| 7T | 2 | 0.00 | 1.33 | 2.00 | 1.80 | 0.73 | | | | | | |
| 8T | 3 | 0.00 | 1.33 | 1.67 | 1.33 | 1.00 | 1.00 | 0.73 | | | | |
| 9T | 3 | 0.00 | 1.33 | 1.67 | 1.33 | 1.67 | 1.20 | 0.73 | | | | |
| 10T | 3 | 0.00 | 1.33 | 1.67 | 1.33 | 2.00 | 1.80 | 0.73 | | | | |
| 11T | 4 | 0.00 | 1.33 | 1.67 | 1.33 | 1.67 | 1.33 | 1.00 | 1.00 | 0.73 | | |
| 14T | 5 | 0.00 | 1.33 | 1.67 | 1.33 | 1.67 | 1.33 | 1.67 | 1.33 | 1.00 | 1.00 | 0.73 |

TABLE 4

| Mark length | m | Delay time | α1 | β1 | α2 | β2 | α3 | β3 | α4 | β4 | α5 | β5 |
|---|---|---|---|---|---|---|---|---|---|---|---|---|
| 3T | 1 | −0.27 | 1.33 | 0.00 | | | | | | | | |
| 4T | 1 | −0.07 | 1.67 | 1.00 | | | | | | | | |
| 5T | 2 | −0.13 | 1.33 | 1.00 | 1.00 | 0.13 | | | | | | |
| 6T | 2 | 0.00 | 1.33 | 1.60 | 1.20 | 0.13 | | | | | | |
| 7T | 2 | 0.00 | 1.33 | 1.93 | 1.73 | 0.13 | | | | | | |
| 8T | 3 | 0.00 | 1.33 | 1.67 | 1.33 | 0.80 | 1.00 | 0.13 | | | | |
| 9T | 3 | 0.00 | 1.33 | 1.67 | 1.33 | 1.60 | 1.20 | 0.13 | | | | |
| 10T | 3 | 0.00 | 1.33 | 1.67 | 1.33 | 1.93 | 1.80 | 0.13 | | | | |
| 11T | 4 | 0.00 | 1.33 | 1.67 | 1.33 | 1.67 | 1.33 | 0.80 | 1.00 | 0.13 | | |
| 14T | 5 | 0.00 | 1.33 | 1.67 | 1.33 | 1.67 | 1.33 | 1.67 | 1.33 | 0.80 | 1.00 | 0.13 | recording/retrieving with an optimum angle between the laser head and the disk. It is considered that the difference in the signal amplitude has a significant influence over the signal quality e.g. at the time of recording under severer conditions.

Figure 9:
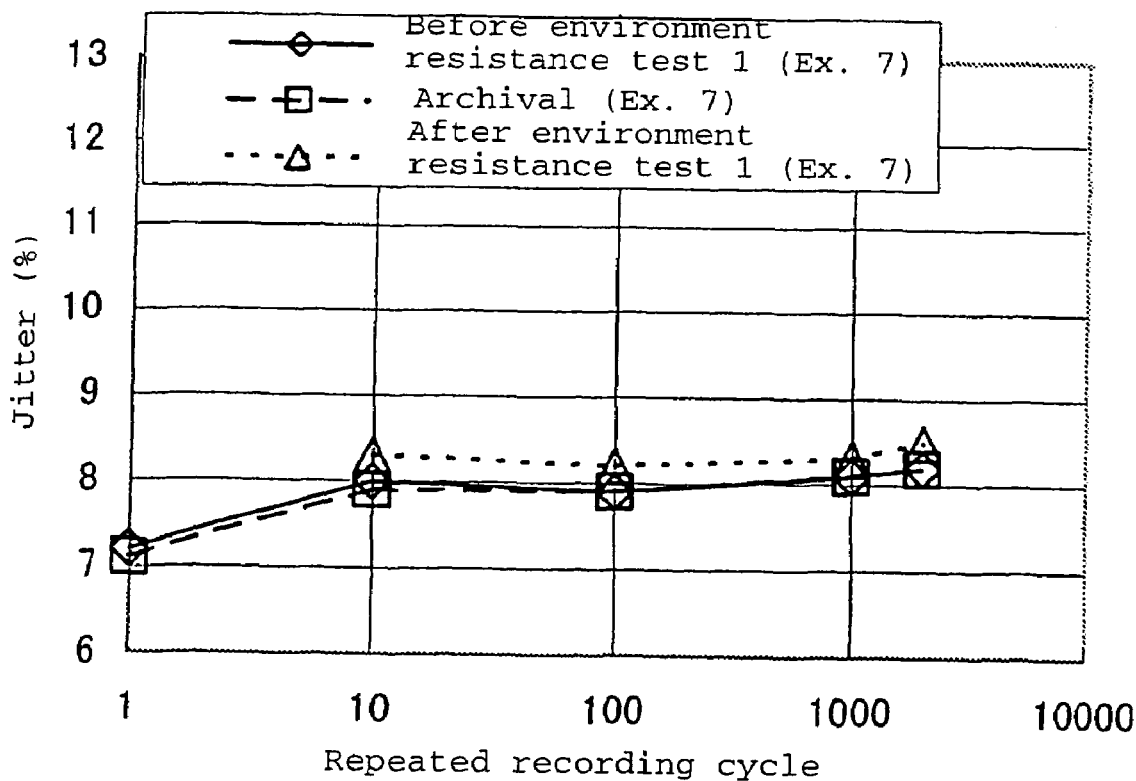
FIG. 9 illustrates the repeated overwriting characteristics of an optical information recording medium.
Figure 10:
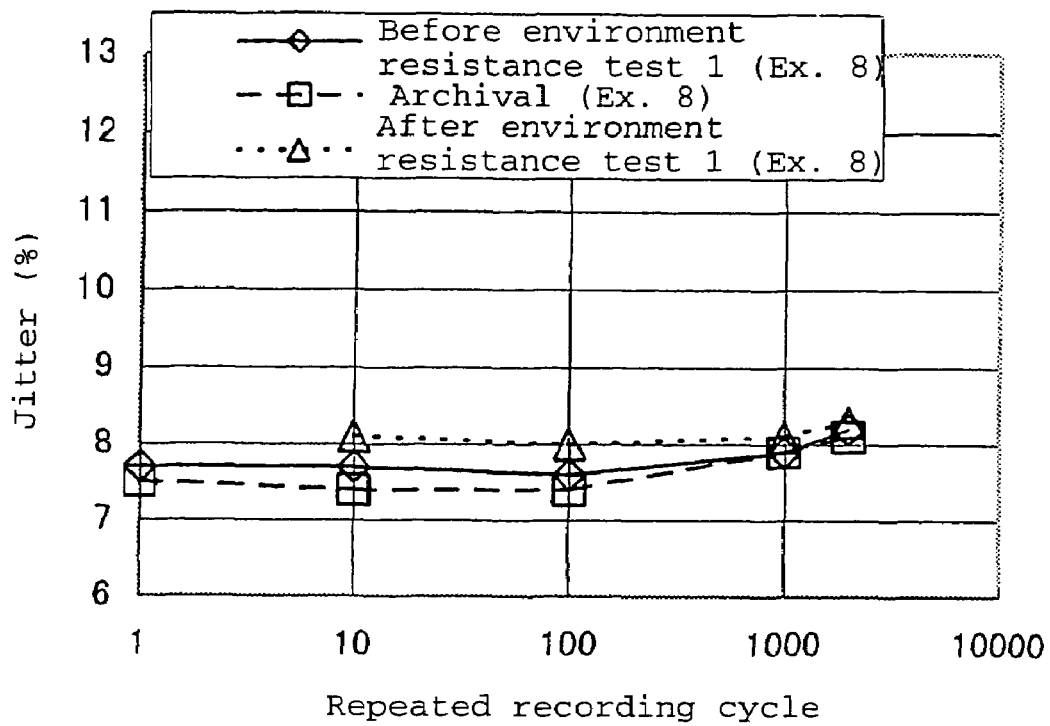
FIG. 10 illustrates the repeated overwriting characteristics of an optical information recording medium.

Then, each of the disks of Examples 7 and 8 was subjected to an environment resistance test of holding it in an environment of 100° C. for 1 hour (hereinafter referred to as environment resistance test 1). The results of measurement of the repeated recording durability before and after the environment resistance test 1 are shown in FIGS. 9 and 10. "Archival" in FIGS. 9 and 10 represents the result when signals repeatedly recorded predetermined times in a repeated recording durability test before the environment resistance test 1, were only retrieved after the environment resistance test 1. It can be seen in the disks of Examples 7 and 8, that there was no problem in the stability of the amorphous mark and the archival change of the repeated recording durability.

The disks of Examples 7 and 8 and Comparative Example 6 were subjected to an environment resistance test of holding them in an environment at a temperature of 80° C. at a humidity of 85% RH for 90 hours (hereinafter referred to as environment resistance test 2). No film peeling occurred on the disks of Examples 7 and 8, however, film peeling was observed on the disk of Comparative Example 6. With respect to the disk of Comparative Example 6, particularly when the portion irradiated with the laser beam was observed by an oscilloscope after the environment resistance test 2, there observed a large number of portions where the reflectivity decreased, the cause of which was considered to be due to film peeling. Specifically, when irradiation with a DC laser beam of 8 mW was carried out at a linear velocity of 4-times velocity, a large number of portions at which the reflectivity decreased appeared. Such did not occur on the disks of Examples 7 and 8 at all. Namely, in a case where $Y_2O_2S$ was provided in contact with a conventional SbTe eutectic type composition material, there is a problem in the adhesion properties between layers in some cases, however, in a case where $Y_2O_2S$ is provided in contact with the Ge—In—Sb—Sn—Te type material, there is no problem in the adhesion properties between the layers. The disk of Example 8 was subjected to an environment resistance test at the same temperature and humidity as the environment resistance test 2 up to 250 hours, and no problem such as film peeling occurred. Then, the same measurement as in the above environment resistance test 1 was carried out with respect to the disk of Example 8, whereupon there was substantially no difference as compared with the case of the environment resistance test 1.

Examples 13 and 14

A polycarbonate resin substrate having a thickness of 0.6 mm and a track pitch of 0.74 μm was formed by injection molding and employed for the following experimental examples. Of the groove formed on the substrate, the groove width was about 0.31 μm, and the groove depth was about 28 nm. The groove shape was obtained by an optical diffraction method by U-groove approximation by means of a He—Cd laser beam having a wavelength of 441.6 nm.

Then, on the substrate, a $(ZnS)_{80}(SiO_2)_{20}$ protective layer of 40 nm, a $(Y_2O_2S)_{90}(ZnO)_{10}$ layer of 2 nm, a $Ge_7In_6Sb_6Sn_{24}Te_7$ recording layer of 10 nm, a $(Y_2O_2S)_{90}(ZnO)_{10}$ layer of 14 nm, a Ta interfacial layer of 2 nm, a Ag reflective layer of 200 nm and an ultraviolet-curing resin layer of about 4 μm were formed in this order. The Ta layer is an interfacial layer to prevent diffusion of S into the Ag reflective layer.

Formation of the respective layers was carried out by sequential deposition by a sputtering method on the substrate without breaking the vacuum. However, the ultraviolet-curing resin layer was coated by a spin coating method. Then, a similar substrate having a thickness of 0.6 mm on which no film was formed was bonded by means of an adhesive so that the above recording layer side faced inside (Example 13).

Similarly, on the above substrate, a $(ZnS)_{80}(SiO_2)_{20}$ protective layer of 60 nm, a $(Y_2O_2S)_{90}(ZnO)_{10}$ layer of 2 nm, a $Ge_7In_6Sb_{56}Sn_{24}Te_7$ recording layer of 12 nm, a $(Y_2O_2S)_{90}(ZnO)_{10}$ layer of 14 nm, a Ta interfacial layer of 2 nm, a Ag reflective layer of 200 nm and an ultraviolet-curing resin layer of about 4 μm were formed in this order. Then, a similar substrate having a thickness of 0.6 mm on which no film was formed was bonded by means of an adhesive so that the recording layer side faced inside (Example 14).

With respect to the film thickness of each layer, the deposition rate was measured, and then the thickness was controlled by the sputtering time. The composition of the recording layer was determined by correcting the fluorescent intensities of the respective elements obtained by a fluorescent X-ray analysis by the absolute composition separately obtained by a chemical analysis (atomic absorption spectrometry).

Then, initial crystallization was carried out. As the laser beam for the initial crystallization, a laser beam having a wavelength of 810 nm and a power of 1800 mW and focused into an oval shape having a major axis of about 75 μm and a minor axis of about 1 μm was employed. While rotating the disk at 30 m/s, the disk was irradiated with the above laser beam so that the major axis of the laser beam would be perpendicular to the guide grooves formed on the above substrate, and the above laser beam was continuously moved in a radius direction of the disk with a feed amount of 50 μm per rotation of the disk to carry out initial crystallization.

Recording/retrieving evaluation was carried out by means of DDU1000 tester manufactured by Pulstec. Industrial Co., Ltd. (wavelength: about 650 nm, NA=0.65, spot shape: circular of 0.86 μm with an intensity of $1/e^2$). On the basis of the reference linear velocity of 3.49 m/s of DVD being 1-time velocity, recording characteristics at 10-times velocity were evaluated.

The reference clock period of data at each linear velocity was one inversely proportionated at each linear velocity to the reference clock period of 38.2 nsec of data at 1-time velocity.

Unless otherwise specified, retrieving was carried out at 1-time velocity. The output signal from DDU1000 was passed through a high frequency-passing filter having a cutoff lies between 5 and 20 kHz, whereupon the jitter was measured by a time interval analyzer (manufactured by Yokogawa Electric Corporation). The retrieving power Pr was 0.6 mW.

Formation of a logic level to control the recording pulse division method was carried out by means of an optional signal generator (AWG710, manufactured by Sony Tektronix Co.). From the above signal generator, logic signals at ECL level were input as gate signals against a laser driver of the above tester.

Each of the disks of Examples 13 and 14 was subjected to an environment resistance test 1 of holding it in an environment of 100° C. for 1 hour to measure the recording characteristics before and after the environment resistance test 1. EFM+ random data were recorded at a linear velocity of 10-times velocity, and the jitter etc. of the recorded data was measured.

The pulse rows for the respective mark length recording were set as follows. The light irradiation time to record the nT mark was divided in order of $\alpha_1 T, \beta_1 T, \alpha_2 T, \beta_2 T, \ldots, \alpha_i T, \beta_i T, \ldots, \alpha_m T, \beta_m T$ (m is the pulse division number and T is the reference clock period), irradiation with a recording laser beam with a writing power Pw was carried out at the time of $\alpha_i T$ ($1 \leq i \leq m$), and irradiation with a recording laser beam with a bias power Pb was carried out at the time of $\beta_i T$ ($1 \leq i \leq m$). These values were set as shown in Table 5. For marks of some lengths, the timing of irradiation with the pulse row was delayed for a certain time from the original starting time of said mark length in the EFM+ signal, and this time is shown in the section "delay time". A case where the irradiation timing was delayed was represented by +, and a case where it was advanced was represented by −. The value was normalized by the clock period T. The mark formed by providing the delay time is close to the ideal EFM+ random signal, and the jitter is excellent. At the space between marks (the portion other than the portion shown in Table), irradiation with an erasing power Pe was carried out.

tivity between marks)−(reflectivity at mark portion)) were 0.161 in Example 13 and 0.161 in Example 14, and were the same. The signal intensity becomes low only by making the recording layer thin, however, by making the recording layer thin at the same time by making the incident side protective layer thin, the recording characteristics after the environment resistance test 1 could be improved without reducing the signal intensity.

Figure 12:
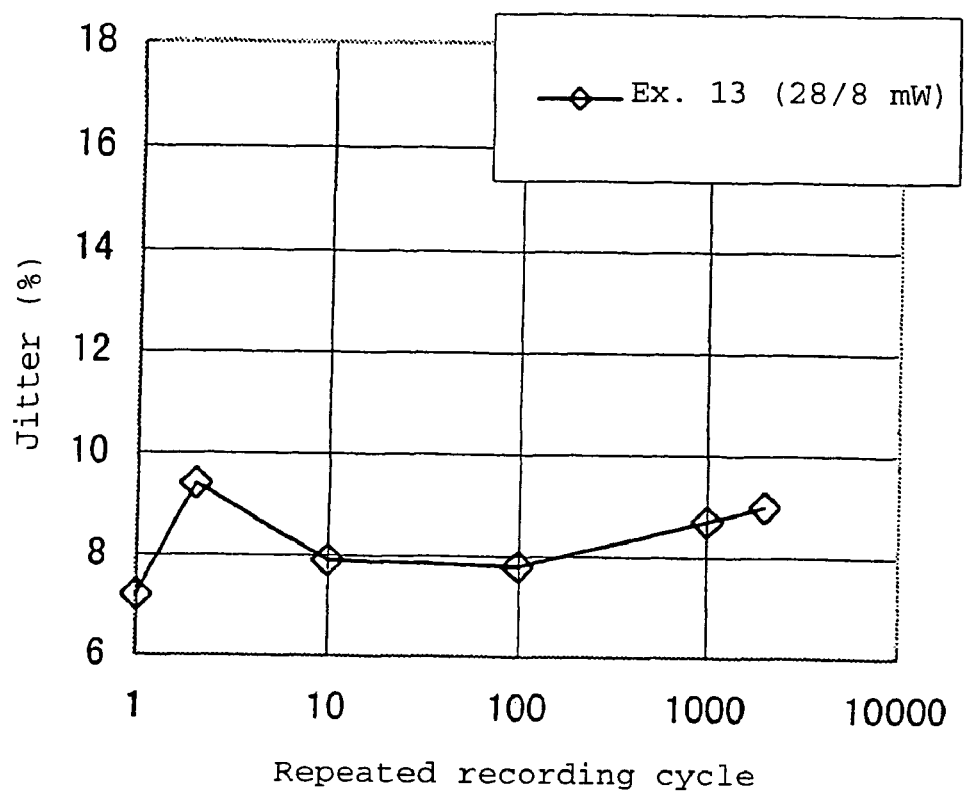
FIG. 12 illustrates the repeated overwriting characteristics of an optical information recording medium.

Further, the repeated recording durability up to 2000 times of the disk of Example 13 at Pw of 28 mW, Pe of 8 mW and Pb of 0.5 mW is shown in FIG. 12. The jitter is at most 10% at every overwriting cycle, and it is found that high reliability in the repeated overwriting in a long term use can be obtained. Further, the portion once recorded before the environment resistance test 1 was retrieved after the environment resistance test 1, whereupon the jitter was 7% and was not deteriorated at all. Namely, the storage stability of the amorphous mark is also sufficient.

Then, the reflectivity at a portion on which overwriting was carried out ten times before the above environment resistance test 1 was measured before and after the environment resistance test 1. As a result, with respect to the disk of Example 13, the reflectivities were 0.234 and 0.229, respec-

TABLE 5

| Mark length | m | Delay time | α1 | β1 | α2 | β2 | α3 | β3 | α4 | β4 | α5 | β5 |
|---|---|---|---|---|---|---|---|---|---|---|---|---|
| 3T | 1 | −0.27 | 1.33 | 0.00 | | | | | | | | |
| 4T | 1 | −0.07 | 1.67 | 1.00 | | | | | | | | |
| 5T | 2 | −0.13 | 1.33 | 1.00 | 1.00 | 0.13 | | | | | | |
| 6T | 2 | 0.00 | 1.33 | 1.60 | 1.20 | 0.13 | | | | | | |
| 7T | 2 | 0.00 | 1.33 | 1.93 | 1.73 | 0.13 | | | | | | |
| 8T | 3 | 0.00 | 1.33 | 1.67 | 1.33 | 0.80 | 1.00 | 0.13 | | | | |
| 9T | 3 | 0.00 | 1.33 | 1.67 | 1.33 | 1.60 | 1.20 | 0.13 | | | | |
| 10T | 3 | 0.00 | 1.33 | 1.67 | 1.33 | 1.93 | 1.80 | 0.13 | | | | |
| 11T | 4 | 0.00 | 1.33 | 1.67 | 1.33 | 1.67 | 1.33 | 0.80 | 1.00 | 0.13 | | |
| 14T | 5 | 0.00 | 1.33 | 1.67 | 1.33 | 1.67 | 1.33 | 1.67 | 1.33 | 0.80 | 1.00 | 0.13 |

Figure 11:
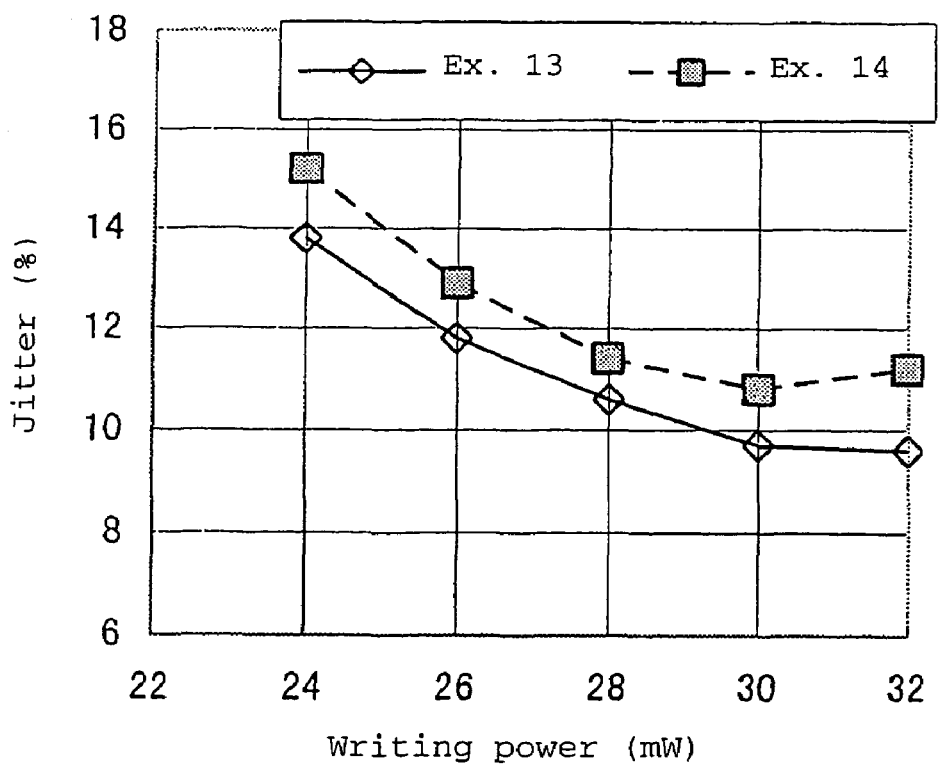
FIG. 11 illustrates the repeated jitter characteristics of an optical information recording medium.

The jitter characteristics when overwriting was carried out twice after the above environment resistant test 1, were measured by changing the writing power Pw. Pb was set to 0.5 mW, and Pe was set to 8 mW. The results are shown in FIG. 11. On the disk of Example 13, there is a power with which the jitter was at most 10%, however, on the disk of Example 14, the jitter would not be at most 10%. By overwriting up to about 1000 times before and after the environment resistance test 1, the jitter most deteriorates at the second recording (shelf second recording) in the repeated overwriting test after the environment resistance test 1, and the jitter once decreases when the overwriting is carried out repeatedly (FIG. 12 as disclosed hereinafter), and accordingly it is preferred that the jitter after the second recording is suppressed low. Accordingly, it can be said that the disk of Example 13 has a further higher performance than the disk of Example 14.

Further, with respect to the disk of Example 13, when overwriting was carried out after the environment resistance test 1 on the signals recorded before the environment resistance test 1, the deterioration of the jitter at the first overwriting (archival second recording) was similarly suppressed low. It can be said that such a disk has a high reliability particularly for long term use.

Further, the signal intensities of the disks of Examples 13 and 14 after overwriting ten times before the environment resistance test 1 were compared. At Pw of 28 mW, Pe of 8 mW and Pb of 0.5 mW, the signal amplitudes i.e. ((reflectively. On the other hand, with respect to the disk of Example 14, the reflectivities were 0.246 and 0.234, respectively. When the rate of decrease in the reflectivity by the environment resistance test 1 is defined as ((reflectivity before the environment resistance test 1)−(reflectivity after the environment resistance test 1))/(reflectivity before the environment resistance test 1), the rate of decrease in the reflectivity was about 0.021 in Example 13 or about 0.049 in Example 14, and the rate of decrease in the reflectivity was lower in Example 13. Namely, it is found that the rate of decrease in the reflectivity by the environment resistance test 1 becomes low by making the recording layer thin.

Example 15

The following experiment was carried out to show possibility of recording by a change in the electric resistance on the phase-change recording material used in the present invention.

Namely, on a polycarbonate substrate having a diameter of 120 mm, an amorphous film of Ge—In—Sn—Te—Sb $Ge_x(In_w Sn_{1-w})_y Te_z Sb_{1-x-y-z}$ wherein w=0.189, x=0.056, y=0.301 and z=0.073) having a film thickness of 50 nm was prepared by sputtering.

The resistivity of the above amorphous film was measured, and the amorphous film was crystallized to measure the resistivity of the film after the crystallization.

For initial crystallization, a laser beam having a wavelength of 810 nm and a power of 1040 mW and having a shape with a width of about 1 μm and a length of about 75 μm was employed. While rotating the Ge—In—Sn—Te—Sb amorphous film formed on the above substrate at a linear velocity of 12 m/s, the above amorphous film was irradiated with the above laser beam so that the major axis of the above laser beam would be perpendicular to the guide grooves formed on the above substrate. Further, the above laser beam was continuously moved in a radius direction with a feed amount of 50 μm per one rotation to carry out initial crystallization.

For measurement of the resistivity, a resistivity measurement device Loresta MP (MCP-T350) manufactured by Dia Instruments Co., Ltd. was used.

The resistivity before the crystallization was $1.36 \times 10^{-1}$ Ωcm. The resistivity after the crystallization was $0.95 \times 10^{-4}$ Ωcm. From this result, it was found that there is a change in the resistivity by almost three orders of magnitude between the amorphous state and the crystalline state. Accordingly, it was found that the phase-change recording material used in the present invention provides a large difference in the resistivity by phase change between the amorphous state and the crystalline state, and is applicable to a rewritable type information recording medium on which recording is carried out by the change in the electric resistance.

Example 16

A polycarbonate resin substrate having a thickness of 0.6 mm and a track pitch of 0.74 μm was formed by injection molding and employed for the following experiment example. Of the grooves formed on the substrate, the groove width was about 0.31 μm and the groove depth was about 28 nm. The groove shape was obtained by an optical diffraction method by U-groove approximation by means of a He—Cd laser beam having a wavelength of 441.6 nm.

Then, on the substrate, a $(ZnS)_{80}(SiO_2)_{20}$ protective layer of 65 nm, a $Y_2O_2S$ layer of 2 nm, a $Ge_5In_{8.5}Sb_{52}Sn_{24}Te_{10.5}$ recording layer of 15 nm, a $Y_2O_2S$ layer of 17 nm, a Mo interfacial layer of 2 nm, a Ag reflective layer of 200 nm and an ultraviolet-curing resin layer of about 4 μm were formed in this order. The Mo layer is an interfacial layer to prevent diffusion of S into the Ag reflective layer.

Formation of the respective layers was carried out by sequential deposition by a sputtering method without breaking the vacuum. However, the ultraviolet-curing resin layer was coated by a spin coating method. Then, a similar substrate having a thickness of 0.6 mm on which no film was deposited was bonded by means of an adhesive so that the above recording layer side faced inside.

With respect to the thickness of each layer, the deposition rate was measured, and then the thickness was controlled by the sputtering time. The recording layer composition was the composition of the sputtering target.

Then, initial crystallization was carried out. As the laser beam for the initial crystallization, a laser beam having a wavelength of 810 nm and a power of 1200 mW and focused into an oval shape having a major axis of about 75 μm and a minor axis of about 1 μm was employed. While rotating the disk at 16 m/s, the disk was irradiated with the above laser beam so that the major axis of the laser beam would be perpendicular to the guide grooves formed on the above substrate, and the above laser beam was continuously moved in a radius direction of the disk with a feed amount of 50 μm per one rotation of the disk to carry out the initial crystallization.

Recording/retrieving evaluation was carried out by means of ODU-1000 tester manufactured by Pulstec. Industrial Co., Ltd. (wavelength: about 650 nm, NA=0.65, spot shape: a circular of 0.86 μm with an intensity of $1/e^2$). On the basis of the reference linear velocity of 3.49 m/s of DVD being 1-time velocity, recording characteristics at 8-times velocity were evaluated.

The reference clock period of data at each linear velocity was one inversely proportionated at each linear velocity to the reference clock period of 38.2 nsec of data at 1-time velocity.

Unless otherwise specified, retrieving was carried out at 1-time velocity. The output signal from ODU-1000 was passed through a high frequency-passing filter having a cutoff lies between 5 to 20 kHz, whereupon the jitter was measured by a time interval analyzer (manufactured by Yokogawa Electric Corporation). The retrieving power Pr was 0.6 mW.

Formation of a logic level to control the recording pulse division method was carried out by means of an optional signal generator (AWG710, manufactured by Sony Tektronix Co.). From the above signal generator, logic signals at ECL level were input as gate signals against a laser driver of the above tester.

On the disk of Example 16, EFM+ random data was overwritten 10 times at a linear velocity of 8-times velocity, and the jitter of said recording data was measured.

The pulse rows for the respective mark length recording were set as follows. The light irradiation time to record the nT mark was divided in order of $\alpha_1 T, \beta_1 T, \alpha_2 T, \beta_2 T, \ldots, \alpha_i T, \beta_i T, \ldots, \alpha_m T, \beta_m T$ (m is the pulse division number and T is the reference clock period), irradiation with a recording laser beam with a writing power Pw was carried out at the time of $\alpha_i T$ ($1 \leq i \leq m$), and irradiation with a recording laser beam with a bias power Pb was carried out at the time of $\beta_i T$ ($1 \leq i \leq m$). These values were set as shown in Table 6. For marks of some lengths, the timing of irradiation with the pulse row was delayed for a certain time from the original starting time of said mark length in the EFM+ signal, and this time is shown in the section "delay time". A case where the irradiation timing was delayed was represented by +, and a case where it was advanced was represented by −. The value was normalized by the clock period T. The mark formed by providing the delay time is close to the ideal EFM+ random signal, and the jitter is excellent. At the space between marks (portion other than the portion disclosed in Table), irradiation with an erasing power Pe was carried out. Pe was 7.6 mW, and Pb was 0 mW.

TABLE 6

| Mark length | m | Delay time | α1 | β1 | α2 | β2 | α3 | β3 | α4 | β4 | α5 | β5 | α6 | β6 | α7 | β7 |
|---|---|---|---|---|---|---|---|---|---|---|---|---|---|---|---|---|
| 3T | 1 | −0.27 | 1.27 | 0.00 | | | | | | | | | | | | |
| 4T | 2 | 0.00 | 0.80 | 1.33 | 0.40 | 0.13 | | | | | | | | | | |

TABLE 6-continued

| Mark length | m | Delay time | α1 | β1 | α2 | β2 | α3 | β3 | α4 | β4 | α5 | β5 | α6 | β6 | α7 | β7 |
|---|---|---|---|---|---|---|---|---|---|---|---|---|---|---|---|---|
| 5T | 2 | −0.07 | 0.80 | 1.33 | 1.00 | 0.13 | | | | | | | | | | |
| 6T | 3 | 0.00 | 0.80 | 1.33 | 0.67 | 0.60 | 0.80 | 0.00 | | | | | | | | |
| 7T | 3 | 0.00 | 0.80 | 1.33 | 0.67 | 1.27 | 1.00 | 0.13 | | | | | | | | |
| 8T | 4 | 0.00 | 0.80 | 1.33 | 0.67 | 1.33 | 0.67 | 0.60 | 0.80 | 0.00 | | | | | | |
| 9T | 4 | 0.00 | 0.80 | 1.33 | 0.67 | 1.33 | 0.67 | 1.27 | 1.00 | 0.13 | | | | | | |
| 10T | 5 | 0.00 | 0.80 | 1.33 | 0.67 | 1.33 | 0.67 | 1.33 | 0.67 | 0.60 | 0.80 | 0.00 | | | | |
| 11T | 5 | 0.00 | 0.80 | 1.33 | 0.67 | 1.33 | 0.67 | 1.33 | 0.67 | 1.27 | 1.00 | 0.13 | | | | |
| 14T | 7 | 0.00 | 0.80 | 1.33 | 0.67 | 1.33 | 0.67 | 1.33 | 0.67 | 1.33 | 0.67 | 1.33 | 0.67 | 0.60 | 0.80 | 0.00 |

Figure 13:
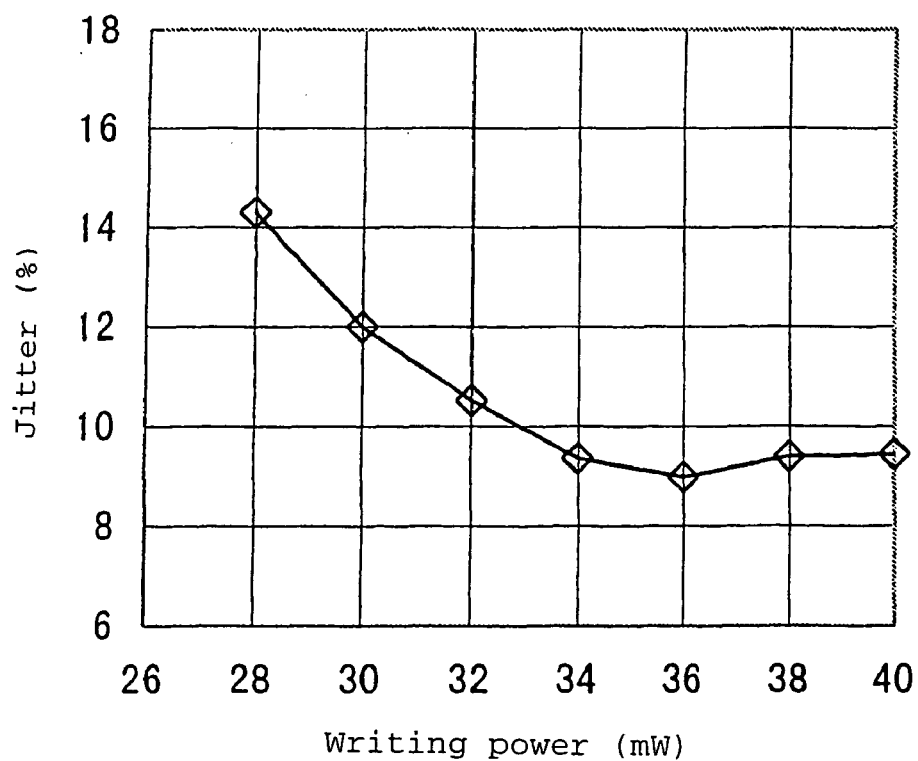
FIG. 13 illustrates the repeated jitter characteristics of an optical information recording medium.

The results are shown in FIG. 13. A power range in which the jitter is at most 10% is present, and with such characteristics, the disk can be practically applied.

INDUSTRIAL APPLICABILITY

According to the present invention, a phase-change recording material on which high velocity recording/erasing is possible, which provides excellent recording signal characteristics such as jitter characteristics, which provides a high storage stability of the recording signals, and with which the archival change of the recording signal quality (such as decrease in the reflectivity) due to the long term storage is small, and an information recording medium employing the above material, can be obtained. Further, excellent recording signal characteristics can be obtained even if overwriting is carried out after the recorded medium is stored for a long time.

The present invention has been described in detail with reference to specific embodiments, but it should be apparent to those skilled in the art that various changes and modifications can be made without departing from the intension and the scope of the present invention.

Further, this application is based on a Japanese Patent Application No 2003-125803 (filed on Apr. 30, 2003), and its entirety is hereby included by reference.

What is claimed is:

1. A phase-change recording material characterized by containing a composition represented by the following formula (1) as the main component:

$$Ge_x(In_wSn_{1-w})_yTe_zSb_{1-x-y-z} \quad (1)$$

(wherein the Sb content is higher than any one of the Ge content, the In content, the Sn content and the Te content, and x, y, z and w representing atomic ratios, satisfy the following (i) to (vi):

(i) $0 \leq x \leq 0.3$ (ii) $0.07 \leq y\text{-}z$ (iii) $wxy\text{-}z \leq 0.1$ (iv) $0 < z$ (v) $(1\text{-}w)xy \leq 0.35$ (vi) $0.35 \leq 1\text{-}x\text{-}y\text{-}z$).

2. The phase-change recording material according to claim 1, wherein in the formula (1), x further satisfies 0<x.

3. The phase-change recording material according to claim 1, wherein in the formula (1), x further satisfies x≦0.1.

4. The phase-change recording material according to claim 1, wherein in the formula (1), w further satisfies 0<w<1.

5. The phase-change recording material according to claim 1, wherein in the formula (1), z further satisfies 0.1<z.

6. The phase-change recording material according to claim 1, wherein of the above information recording material, the crystalline state corresponds to a non-recorded state, and the amorphous state corresponds to a recorded state.

7. An information recording medium having a recording layer, characterized in that the above recording layer contains a composition represented by the following formula (1) as the main component:

$$Ge_x(In_wSn_{1-w})_yTe_zSb_{1-x-y-z} \quad (1)$$

(wherein the Sb content is higher than any one of the Ge content, the In content, the Sn content and the Te content, and x, y, z and w representing atomic ratios, satisfy the following (i) to (vi):

(i) $0 \leq x \leq 0.3$ (ii) $0.07 \leq y\text{-}z$ (iii) $wxy\text{-}z \leq 0.1$ (iv) $0 < z$ (v) $(1\text{-}w)xy \leq 0.35$ (vi) $0.35 \leq 1\text{-}x\text{-}y\text{-}z$).

8. The information recording medium according to claim 7, wherein in the formula (1), x further satisfies 0<x.

9. The information recording medium according to claim 7, wherein in the formula (1), x further satisfies x≦0.1.

10. The information recording medium according to claim 7, wherein in the formula (1), w further satisfies 0<w<1.

11. The information recording medium according to claim 7, wherein in the formula (1), z further satisfies 0.1<z.

12. The information recording medium according to claim 7, wherein of the above information recording medium, the crystalline state corresponds to a non-recorded state, and the amorphous state corresponds to a recorded state.

13. The information recording medium according to claim 7, wherein the information recording medium is an optical information recording medium, on which recording is carried out by a laser beam.

14. The information recording medium according to claim 13, wherein the optical information recording medium has a protective layer A in contact with the recording layer, and the protective layer A contains a metal oxysulfide and/or a metal nitride.

15. The information recording medium according to claim 14, wherein the metal oxysulfide is an oxysulfide of yttrium, and the metal nitride is a nitride of an alloy containing germanium as the main component.

16. The information recording medium according to claim 14, wherein the protective layer A is formed in contact with each side of the recording layer.

17. The information recording medium according to claim 14, wherein the above protective layer A is formed in contact with the side of the recording layer from which a laser beam enters, and the above protective layer A has a thickness of at most 50 nm.

18. The information recording medium according to claim 14, wherein the protective layer A is formed in contact with the side of the recording layer from which a laser beam enters, and further, a protective layer B is formed on the side opposite to the above recording layer in contact with the protective layer A, and the total thickness of the thickness of the protective layer A and the thickness of the protective layer B is at most 50 nm.

19. The information recording medium according to claim 14, wherein the recording layer has a thickness of at least 5 nm and at most 15 nm.

20. The information recording medium according to claim 13, wherein the optical information recording medium further has a reflective layer, and the reflective layer contains Ag as the main component.

* * * * *